US010559581B2

(12) United States Patent
Yamashita et al.

(10) Patent No.: US 10,559,581 B2
(45) Date of Patent: Feb. 11, 2020

(54) SEMICONDUCTOR DEVICE

(71) Applicant: Renesas Electronics Corporation, Koutou-ku, Tokyo (JP)

(72) Inventors: Tomohiro Yamashita, Tokyo (JP); Tamotsu Ogata, Tokyo (JP); Masamichi Fujito, Tokyo (JP); Tomoya Saito, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/269,797

(22) Filed: Feb. 7, 2019

(65) Prior Publication Data

US 2019/0172837 A1 Jun. 6, 2019

Related U.S. Application Data

(63) Continuation of application No. 15/904,349, filed on Feb. 24, 2018, now Pat. No. 10,249,638.

(30) Foreign Application Priority Data

Apr. 28, 2017 (JP) ................. 2017-090251

(51) Int. Cl.
*H01L 21/28* (2006.01)
*H01L 27/11573* (2017.01)
(Continued)

(52) U.S. Cl.
CPC .......... *H01L 27/11573* (2013.01); *H01L 21/823821* (2013.01); *H01L 27/0629* (2013.01);
(Continued)

(58) Field of Classification Search
CPC ......... H01L 27/11573; H01L 27/11568; H01L 28/90; H01L 21/28273; H01L 21/823821
See application file for complete search history.

(56) References Cited

U.S. PATENT DOCUMENTS

| 8,846,471 | B2 | 9/2014 | Mihara |
| 9,543,315 | B1 | 1/2017 | Chakihara et al. |
| 10,249,638 | B2 * | 4/2019 | Yamashita ........ H01L 27/11573 |

FOREIGN PATENT DOCUMENTS

| EP | 2 590 221 A1 | 5/2013 |
| EP | 3 144 960 A2 | 3/2017 |
| JP | 2014-049735 A | 3/2014 |

OTHER PUBLICATIONS

Extended European Search Report dated Sep. 17, 2018, in European Patent Application No. 18159547.1.

* cited by examiner

*Primary Examiner* — Mark V Prenty
(74) *Attorney, Agent, or Firm* — Shapiro, Gabor and Rosenberger, PLLC

(57) ABSTRACT

To downsize a semiconductor device that includes a non-volatile memory and a capacitive element on a semiconductor substrate. In a capacitive element region of a main surface of a semiconductor substrate, fins protruding from the main surface are arranged along the Y direction while extending in the X direction. In the capacitive element region of the main surface of the semiconductor substrate, capacitor electrodes of the capacitive elements are alternately arranged along the X direction while intersecting the fins. The fins are formed in a formation step of other fins which are arranged in a memory cell array of the non-volatile memory of the semiconductor substrate. One capacitor electrode is formed in a formation step of a control gate electrode of the non-volatile memory. Another capacitor electrode is formed in a formation step of a memory gate electrode of the non-volatile memory.

9 Claims, 42 Drawing Sheets

(51) Int. Cl.
*H01L 49/02* (2006.01)
*H01L 27/11568* (2017.01)
*H01L 21/8238* (2006.01)
*H01L 29/423* (2006.01)
*H01L 29/66* (2006.01)
*H01L 27/06* (2006.01)
*H01L 29/78* (2006.01)
*H01L 29/792* (2006.01)
*H01L 29/94* (2006.01)
*H01L 27/1157* (2017.01)
*H01L 29/417* (2006.01)

(52) U.S. Cl.
CPC .... *H01L 27/1157* (2013.01); *H01L 27/11568* (2013.01); *H01L 28/87* (2013.01); *H01L 28/90* (2013.01); *H01L 28/91* (2013.01); *H01L 29/40114* (2019.08); *H01L 29/42344* (2013.01); *H01L 29/66181* (2013.01); *H01L 29/66833* (2013.01); *H01L 29/7855* (2013.01); *H01L 29/792* (2013.01); *H01L 29/94* (2013.01); *H01L 29/41791* (2013.01); *H01L 29/66795* (2013.01); *H01L 29/7853* (2013.01)

SEMICONDUCTOR DEVICE

CROSS-REFERENCE TO RELATED APPLICATIONS

The disclosure of Japanese Patent Application No. 2017-090251 filed on Apr. 28, 2017 including the specification, drawings and abstract is incorporated herein by reference in its entirety.

BACKGROUND

The present invention relates to semiconductor device techniques, and more particularly, to a technique effectively applied to a semiconductor device that includes a non-volatile memory and a capacitive element on a semiconductor substrate.

A semiconductor device including a non-volatile memory on a semiconductor substrate is described in, for example, Japanese Unexamined Patent Application Publication No. 2014-49735 (Patent Document 1), which discloses the following structure. That is, a pair of capacitor electrodes of the capacitive element is formed by a polysilicon film for a control gate and a polysilicon film for a memory gate in a Metal Oxide Nitride Oxide Semiconductor (MONOS) memory. The paired capacitor electrodes are arranged adjacent to each other along a main surface of the semiconductor substrate via a $SiO_2/SiN/SiO_2$ (ONO) film of the MONOS memory.

SUMMARY

Such a semiconductor device including a non-volatile memory and a capacitive element on a semiconductor substrate is required to be downsized.

Other problems and new features of the present invention will be clarified from the description of the present specification and the accompanied drawings.

In a semiconductor device according to one embodiment, memory cells in a memory region include a plurality of first protrusions configured to protrude from a main surface of the semiconductor substrate, and a plurality of first gate electrodes and second gate electrodes configured to intersect the protrusions. A capacitive element in a capacitive element region includes a plurality of second protrusions that protrudes from the main surface of the semiconductor substrate, and a plurality of first capacitor electrodes and second capacitor electrodes that intersects the protrusions. The first gate electrodes and the first capacitor electrodes are formed of a first conductive film, while the second gate electrodes and the second capacitor electrodes are formed of a second conductive film, and a distance between the adjacent second protrusions is smaller than a distance between the adjacent first protrusions.

In a semiconductor device according to another embodiment, memory cells in a memory region include a plurality of first protrusions configured to protrude from a main surface of the semiconductor substrate, and a plurality of first gate electrodes and second gate electrodes configured to intersect the protrusions. A capacitive element in a capacitive element region includes a plurality of second protrusions configured to protrude from the main surface of the semiconductor substrate, and a plurality of first capacitor electrodes and second capacitor electrodes configured to intersect the protrusions. The first gate electrodes and the first capacitor electrodes are formed of a first conductive film, while the second gate electrodes and the second capacitor electrodes are formed of a second conductive film, and a distance between the adjacent first capacitor electrodes is smaller than a distance between the adjacent first gate electrodes.

In a semiconductor device according to another embodiment, memory cells in a memory region include a plurality of first protrusions configured to protrude from a main surface of the semiconductor substrate in a first direction, and a plurality of first gate electrodes and second gate electrodes configured to intersect the protrusions. A capacitive element in a capacitive element region includes a plurality of second protrusions configured to protrude from the main surface of the semiconductor substrate in the first direction, and a plurality of first capacitor electrodes and second capacitor electrodes configured to intersect the protrusions. The first gate electrodes and the first capacitor electrodes are formed of a first conductive film, while the second gate electrodes and the second capacitor electrodes are formed of a second conductive film, and a length in the first direction of the second capacitor electrode arranged between the adjacent second protrusions is longer than a length in the first direction of the second gate electrode arranged between the adjacent first protrusions.

According to the embodiments, the semiconductor device that includes the non-volatile memory and the capacitive element on the semiconductor substrate can be downsized.

DETAILED DESCRIPTION

Figure 1:
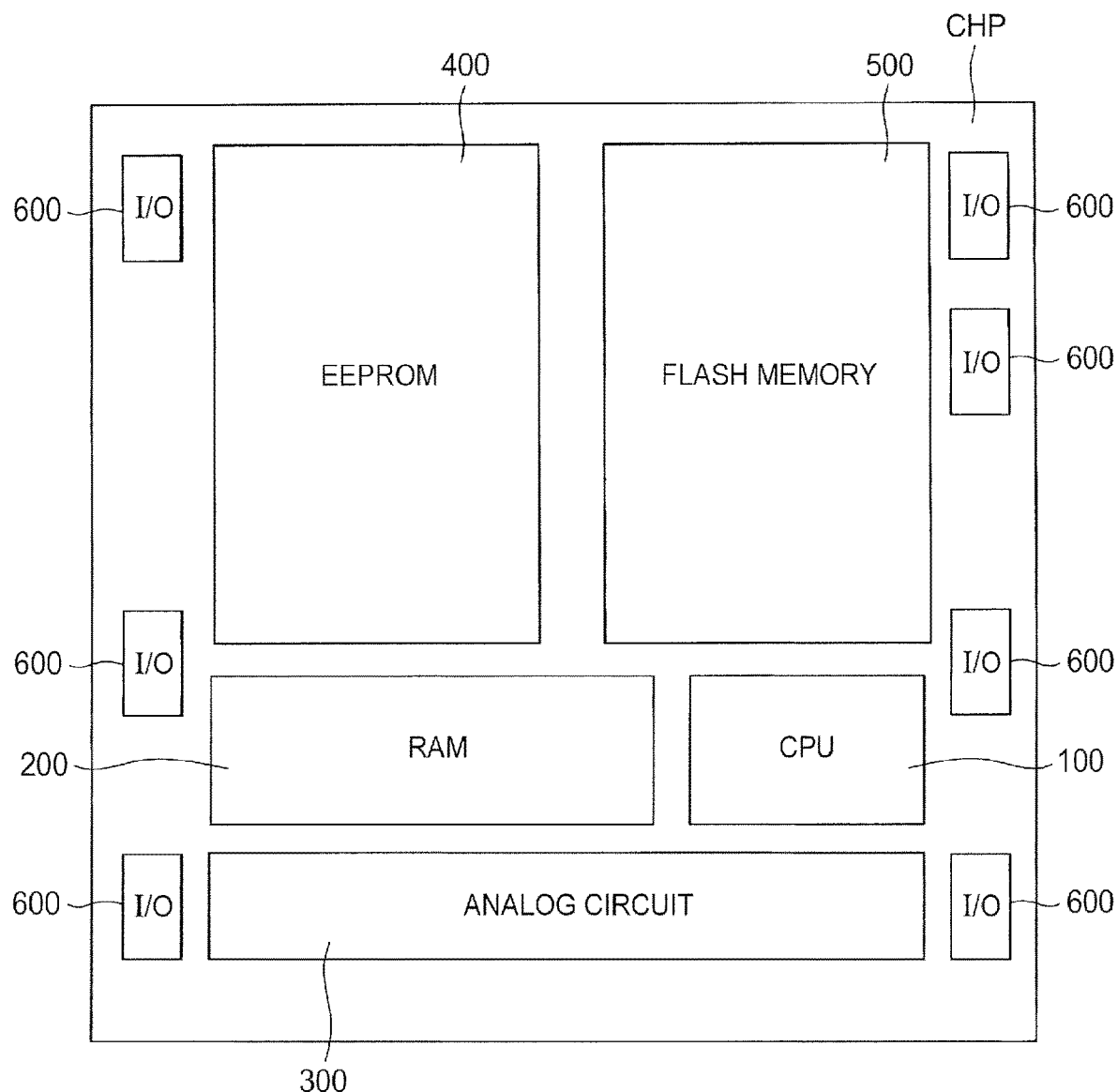
FIG. 1 is a diagram illustrating an example of a layout configuration of a semiconductor chip according to an embodiment.

The following preferred embodiments will be described below by being divided into a plurality of sections or embodiments for convenience, if necessary, which are not independent from each other unless otherwise specified. One of the sections or embodiments may be a modified example, a detailed description, a supplementary explanation, and the like of a part or all of the other.

When referring to a specific number about an element and the like (including the number of elements, a numerical value, an amount, a range, and the like) in the following embodiments, the present invention is not limited to the specific number, and may take the number greater than, or less than the specific numeral number, unless otherwise specified, and except when limited to the specific number in principle.

It should be noted that the components (including steps) in the embodiments below are not necessarily essential unless otherwise specified, and except when clearly considered to be essential in principle.

Likewise, when referring to the shape of one component, or the positional relationship between the components in the following embodiments, any shape or positional relationship substantially similar or approximate to that described herein may be included in the invention unless otherwise specified and except when clearly considered not to be so in principle. The same goes for the above numerical value and the range.

In all drawings for explaining the embodiments, the same parts are denoted by the same reference character in principle, and the repeated description thereof will be omitted. Even some plan views may be designated by hatching for easy understanding.

First Embodiment

<Example of Layout Structure of Semiconductor Chip>

FIG. 1 is a diagram illustrating an example of a layout structure of a semiconductor chip (semiconductor device) CHP according to a first embodiment. The semiconductor chip (hereinafter simply referred to as a chip) CHP in the first embodiment has a central processing unit (CPU) 100, a random access memory (RAM) 200, an analogue circuit 300, an electrically erasable programmable read only memory (EEPROM) 400, a flash memory 500 and input/output (I/O) circuits 600. The CPU 100, also called a central processing unit, reads and decodes instructions from a storage device and performs various arithmetic operations and control operations based on them. The RAM 200 allows stored information to be read out or written newly at random, i.e., at any time. For example, a static ram (SRAM) using a static circuit is used as the RAM. The analog circuit 300 is a circuit that handles an analog signal (signals of a voltage and a current which continuously change over time). The analog circuit 300 includes, for example, an amplification circuit, a conversion circuit, a modulation circuit, an oscillation circuit, a power supply circuit, and the like.

Each of the EEPROM 400 and the flash memory 500 is a kind of non-volatile memory where data can be electrically rewritten in both a writing operation and an erasing operation, and is also called an electrically erasable programmable read-only memory.

The EEPROM 400 and the flash memory 500 have memory cells, each including, for example, a metal oxide nitride oxide semiconductor (MONOS) transistor for storage or a metal nitride oxide semiconductor (MNOS) transistor for storage. Regarding the EEPROM 400 and the flash memory 500, the EEPROM 400 is a non-volatile memory that is erasable, for example, in units of bytes, while the flash memory 500 is a non-volatile memory that is erasable, for example, in units of word lines. In general, the flash memory 500 stores therein programs and the like for executing various types of processing in the CPU 100. Meanwhile, the EEPROM 400 stores therein various types of data that are frequently rewritten. The EEPROM 400 or the flash memory 500 includes a memory cell array in which a plurality of non-volatile memory cells are arranged in rows and columns, an address buffer, a row decoder, a column decoder, a verify sense amplifier circuit, a sense amplifier circuit, and a writing circuit, and the like.

Each I/O (Input/Output) circuit 600 is an input/output circuit, and is a circuit for outputting data from the inside of the chip CHP to devices coupled to the outside of the chip CHP or for inputting data from devices coupled to the outside of the chip CHP to the inside of the chip CHP.

The semiconductor device in the first embodiment includes the memory cell array and a logic circuit region. In the memory cell array, the non-volatile memory cells are arranged in rows and columns. Meanwhile, in the logic circuit region, the CPU 100, the RAM 200, the analogue circuit 300, the I/O circuits 600, and the address buffer, the row decoder, the column decoder, the verify sense amplifier circuit, the sense amplifier circuit, and the writing circuit, and the like of the memories (EEPROM 400 or flash memory 500) are formed.

<Semiconductor Device Structure>

Figure 2:
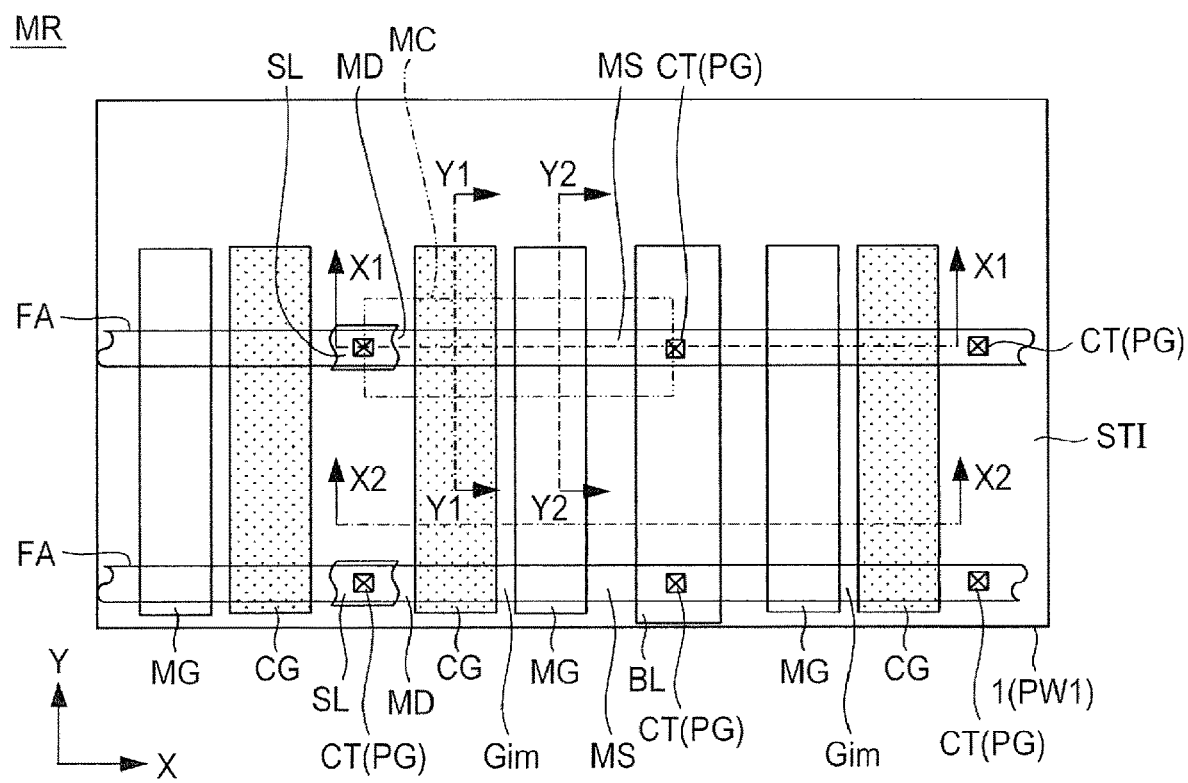
FIG. 2 is a plan view of a main part of a memory cell array in the semiconductor chip shown in FIG. 1.
Figure 3:
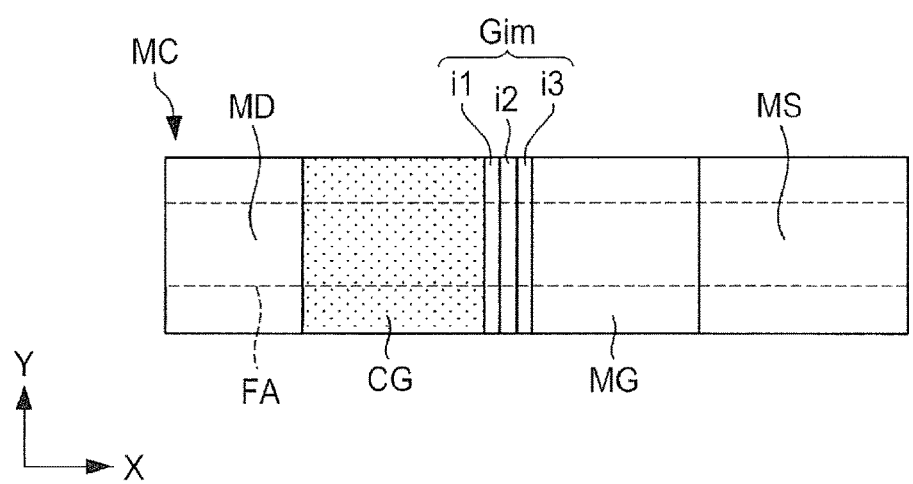
FIG. 3 is an enlarged plan view of a memory cell of the memory cell array shown in FIG. 2.
Figure 4:
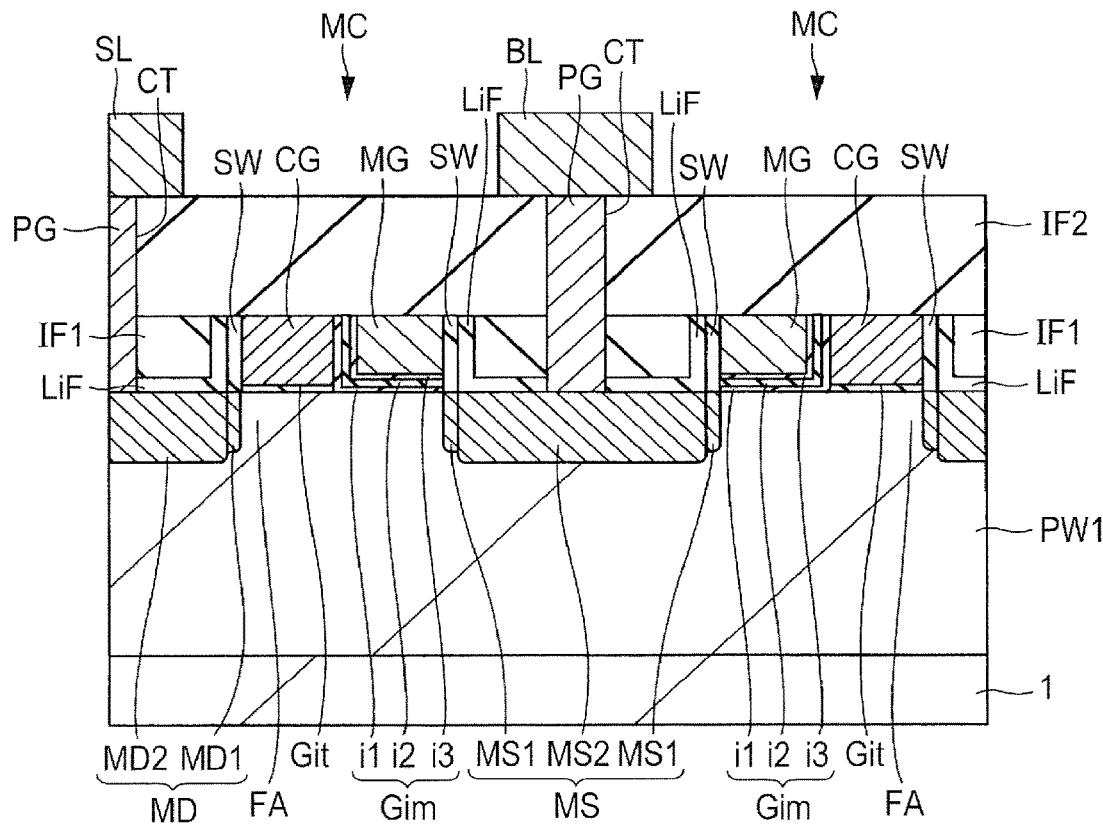
FIG. 4 is a cross-sectional view taken along line X1-X1 of FIG. 2.
Figure 5:
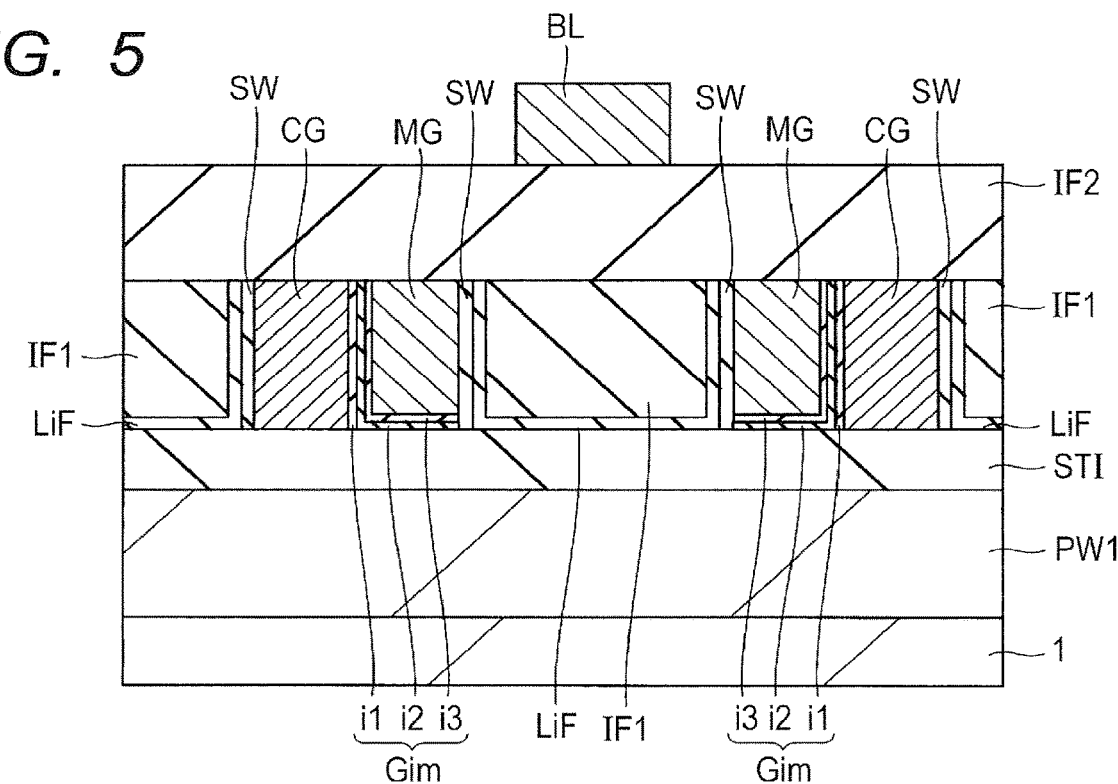
FIG. 5 is a cross-sectional view taken along line X2-X2 of FIG. 2.
Figure 6:
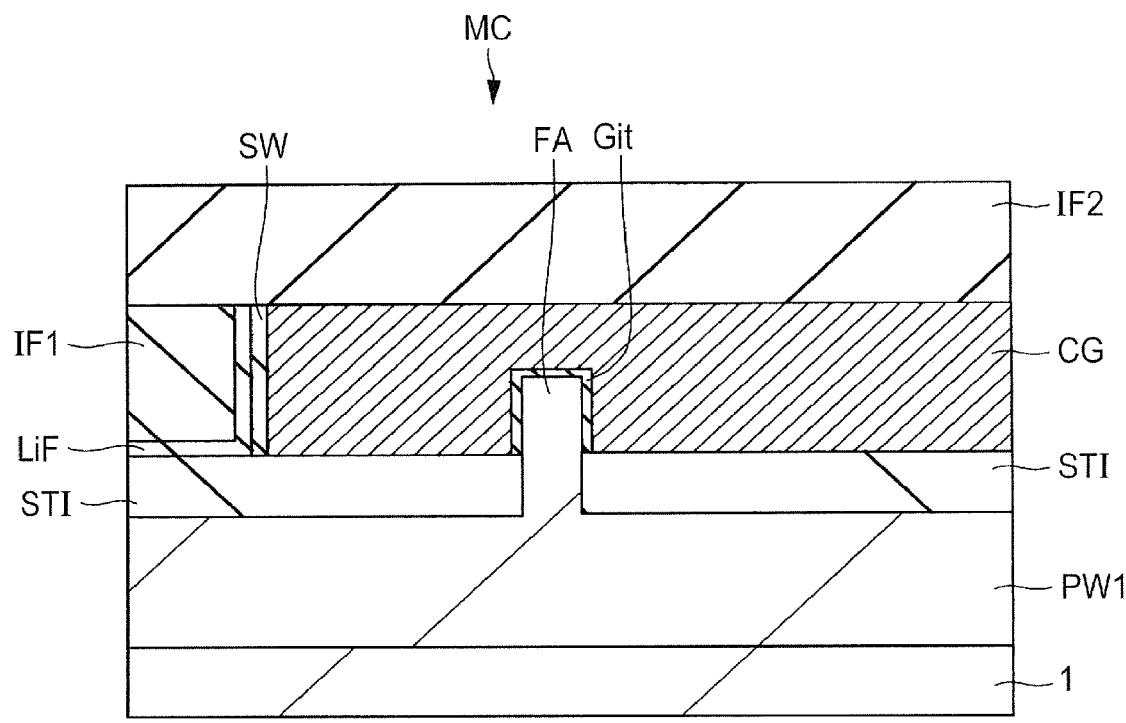
FIG. 6 is a cross-sectional view taken along line Y1-Y1 of FIG. 2.
Figure 7:
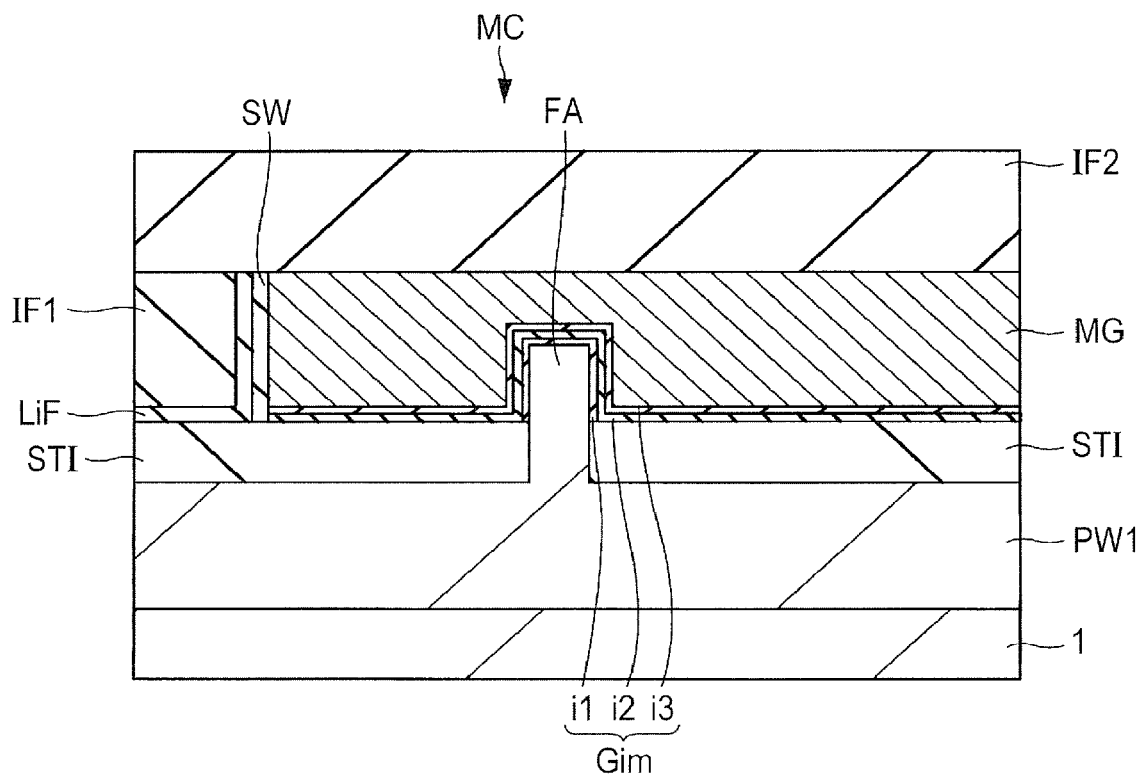
FIG. 7 is a cross-sectional view taken along line Y2-Y2 of FIG. 2.

FIG. 2 is a plan view of a main part of a memory cell array MR in the chip CHP shown in FIG. 1; FIG. 3 is an enlarged plan view of a memory cell MC of the memory cell array MR shown in FIG. 2; FIG. 4 is a cross-sectional view taken along line X1-X1 of FIG. 2; FIG. 5 is a cross-sectional view taken along line X2-X2 of FIG. 2; FIG. 6 is a cross-sectional view taken along line Y1-Y1 of FIG. 2; and FIG. 7 is a cross-sectional view taken along line Y2-Y2 of FIG. 2. It is noted that X and Y indicate two directions that intersect each other (preferably at a right angle) in the planar view. The term "planar view" as used herein means a case of viewing from the direction perpendicular to the main surface of the semiconductor substrate 1. Although FIGS. 2 and 3 are planar views, hatching is given on the control electrodes CG for easy understanding.

As shown in FIG. 2, in the memory cell array (memory region) MR, a plurality of fins (first protrusions) FA extending in an X direction (third direction) is arranged at equal intervals along a Y direction (second direction) on a main surface of a semiconductor substrate (hereinafter, simply referred to as a substrate) 1, made of a p-type silicon single crystal. Each fin FA is formed in a strip-shaped pattern in the planar view that has a predetermined width in the Y direction. The fins FA are formed by parts of the substrate 1. That is, as shown in FIGS. 6 and 7, each fin FA is configured of a rectangular parallelepiped-shaped protrusion (convex portion) that protrudes from the main surface of the substrate 1 in the direction (first direction) perpendicular to the main surface of the substrate 1. Each fin FA is formed within a p-type well PW1 located in an upper part of the substrate 1. The p-type well PW1 is formed, for example, by introducing impurities, such as phosphor (P) or arsenic (As), into the upper part of the substrate 1.

As shown in FIGS. 5 to 7, the periphery of a leg portion (lower portion) side of each fin FA is surrounded by an isolation portion STI. The respective fins FA are separated from each other by the isolation portion STI. The isolation portion STI is formed, for example, by a thin isolation portion, and specifically, by embedding an insulating film, such as a silicon oxide film, in a groove formed in the main surface of the substrate 1. In other words, the fins FA exposed from the isolation portion STI are parts that form active regions of the substrate 1. That is, the fins FA are the active regions for formation of the memory cell MC. In each fin FA, a plurality of memory cells MC are arranged adjacent to each other along the X direction.

As shown in FIG. 2, in the memory cell array MR, a plurality of control gate electrodes (first gate electrodes) CG and a plurality of memory gate electrodes (second gate electrodes) MG, which extends in the Y direction, are arranged on the substrate 1 while intersecting the fins FA. Each of the control gate electrodes CG and the memory gate electrodes MG is formed in a strip-shaped pattern in the planar view that has a predetermined width in the X direction. The control gate electrodes CG and the memory gate electrodes MG are arranged adjacent to each other in the X direction via a gate insulating film Gim.

As shown in FIGS. 2 to 4, each memory cell MC is configured of, for example, a split gate type memory cell, and includes a control gate electrode CG, a memory gate electrode MG, gate insulating films Git and Gim, a drain region (first semiconductor region) MD, and a source region (second semiconductor region) MS.

The control gate electrode CG in the memory cell MC is formed of, for example, a conductive film, such as a polycrystalline silicon film, into which predetermined impurities are introduced. As shown in FIGS. 4 and 6, the gate insulating film (first gate insulating film) Git is formed between the control gate electrode CG and the surfaces (the main surface thereof and the side surfaces intersecting the main surface) of each fin FA. The control gate electrode CG and the substrate 1 are insulated from each other via the gate insulating film Git. The gate insulating film Git is formed of, for example, a silicon oxide film, and has a thickness of, for example, 2 nm. The gate insulating film Git is formed by, for example, thermally oxidizing the surfaces (main surface and side surfaces) of the fin FA.

Meanwhile, the memory gate electrode MG in the memory cell MC is formed of, for example, a conductive film, such as a polycrystalline silicon film, into which predetermined impurities are introduced. As shown in FIGS. 3 to 5 and 7, the gate insulating film (second gate insulating film) Gim is formed between the memory gate electrode MG and the surface of the fin FA and between the memory gate electrode MG and the control gate electrode CG. The memory gate electrode MG, the control gate electrode CG, and the substrate 1 are insulated from one another by the gate insulating film Gim.

The gate insulating film Gim is formed of, for example, a laminated structure of three insulating films i1 to i3. The gate insulating film Gim is formed to be thicker than the above-mentioned gate insulating film Git. The insulating film i1 is formed of, for example, a silicon oxide film and has a thickness of, for example, 4 to 5 nm. The insulating film i1 is formed, for example, by thermally oxidizing the surface of the fin FA. The insulating film i2 on the insulting film i1 is formed, for example, of a silicon nitride film and has a thickness of, for example, 7 to 10 nm. The insulating film i2 is a charge storage portion (charge storage layer). The insulating film i3 on the insulating film i2 is formed, for example, of a silicon nitride film and has a thickness of, for example, 5 nm. The insulating film i3 can also be formed of, for example, a silicon oxynitride film with a thickness of approximately 9 nm, instead of a silicon oxide film. The insulating films i2 and i3 are formed by, for example, a chemical vapor deposition (CVD) method.

As shown in FIGS. 2 and 3, the drain region MD and the source region MS in the memory cell MC are formed to sandwich the control gate electrode CG and the memory gate electrode MG therebetween in the FA. Note that a channel length of the memory cell MC corresponds to a distance between the drain region MD and the source region MS which are adjacent to each other in the X direction. A channel width of the memory cell MC corresponds to a sum of a length in the Y direction of a main surface of the fin FA and heights of two side surfaces of the fin FA, facing the control gate electrode CG and the memory gate electrode MG.

The drain region MD is formed between the two control gate electrodes CG that are adjacent to each other in the X direction. The drain region MD is shared between the two memory cells MC that are adjacent to each other in the X direction. The two memory cells MC sharing the drain region MD are arranged in a mirror-symmetric manner to each other in the X direction about the drain region MD as the center.

The source region MS is formed between the two memory gate electrodes MG that are adjacent to each other in the X direction. The source region MS is shared between the two memory cells MC that are adjacent to each other in the X direction. The two memory cells MC sharing the source region MS are arranged in a mirror-symmetric manner to each other in the X direction about the source region MS as the center.

As shown in FIG. 4, the drain region MD has an n⁻-type semiconductor region MD1 and an n⁺-type semiconductor region MD2, and is formed across an entire region on one side in the X direction of the fin FA, exposed from the isolation portion STI, the control gate electrode CG, the memory gate electrode MG, and the gate insulating film Gim.

The source region MS has an n⁻-type semiconductor region MS1 and an n⁺-type semiconductor region MS2 and is formed across an entire region on the other side in the X direction of the fin FA, exposed from the isolation portion STI, the control gate electrode CG, the memory gate electrode MG, and the gate insulating film Gim.

As shown in FIGS. 4 to 7, a sidewall spacer SW made of, for example, a silicon oxide film, is formed on one side surface of each of the control gate electrode CG and the memory gate electrode MG. Further, an insulating film LiF and interlayer insulating films IF1 and IF2 are deposited in this order from the lower layer over the substrate 1.

The insulating film LiF is made of, for example, a silicon nitride film (material that can have a high etching selectivity to the interlayer insulating films IF1 and IF2). The insulating film LiF is deposited to cover the surfaces (main surface and side surfaces) of the fin FA, the upper surface of the isolation portion STI, and the side surfaces of the sidewall spacers SW. The insulating film LiF is formed more thinly than each of the interlayer insulating films IF1 and IF2.

The interlayer insulating films IF1 and IF2 are formed of, for example, a silicon oxide film. The interlayer insulating film IF1 as the lower layer has the function of eliminating stepped parts (i.e., planarizing) at the main surface of the substrate 1S due to the fin FA, the control gate electrode CG, and the memory gate electrode MG, and the like. The upper surface of the interlayer insulating film IF1 is substantially flush with the upper surfaces of the control gate electrode CG and the memory gate electrode MG.

Wirings, such as source lines SL and bit lines BL shown in FIGS. 2 and 4, are formed on the interlayer insulating film IF2. The source line SL is formed of, for example, metal, and is electrically coupled to the drain region MD through a plug electrode PG which is formed in a contact hole CT, perforated in the interlayer insulating films IF2 and IF1 and the insulating film LiF. Meanwhile, the bit line BL is formed of, for example, metal, and is electrically coupled to the source region MS through a plug electrode PG which is formed in a contact hole CT, perforated in the interlayer insulating films IF2 and IF1 and the insulating film LiF. The source line SL is preferably formed of a wiring of a wiring layer which is different from the bit line BL.

Figure 8:
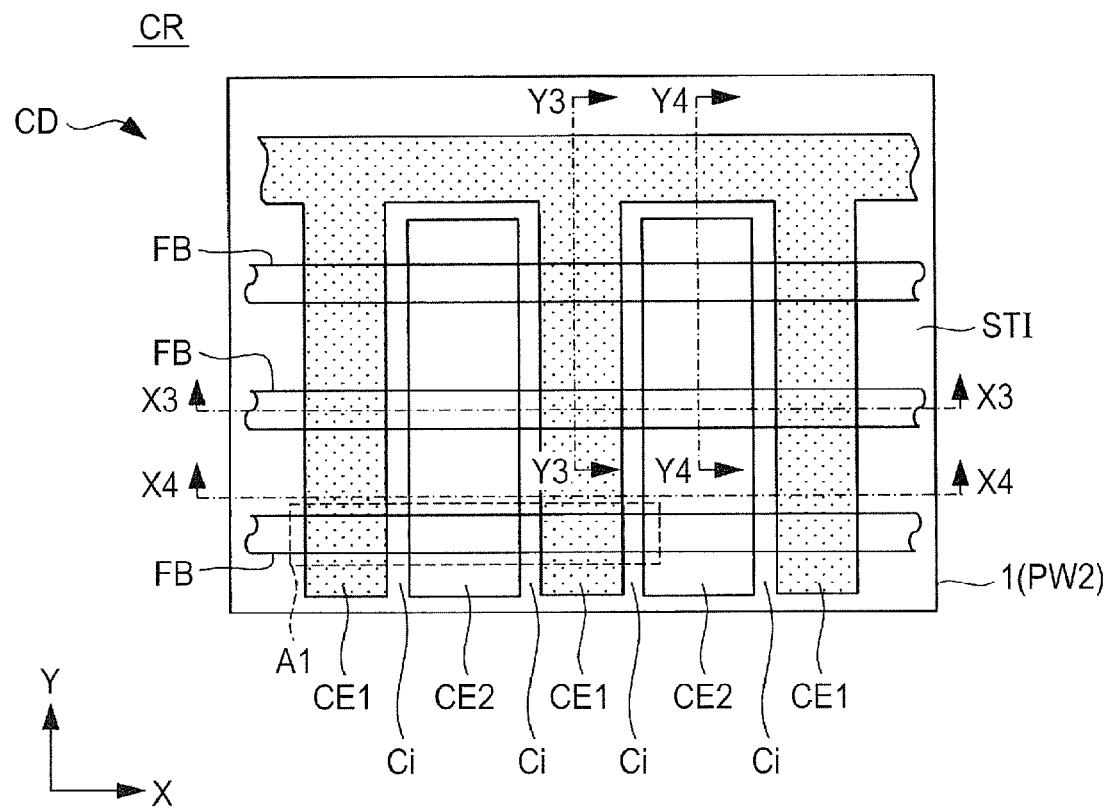
FIG. 8 is a plan view of a main part of a capacitive element region in the semiconductor chip shown in FIG. 1.
Figure 9:
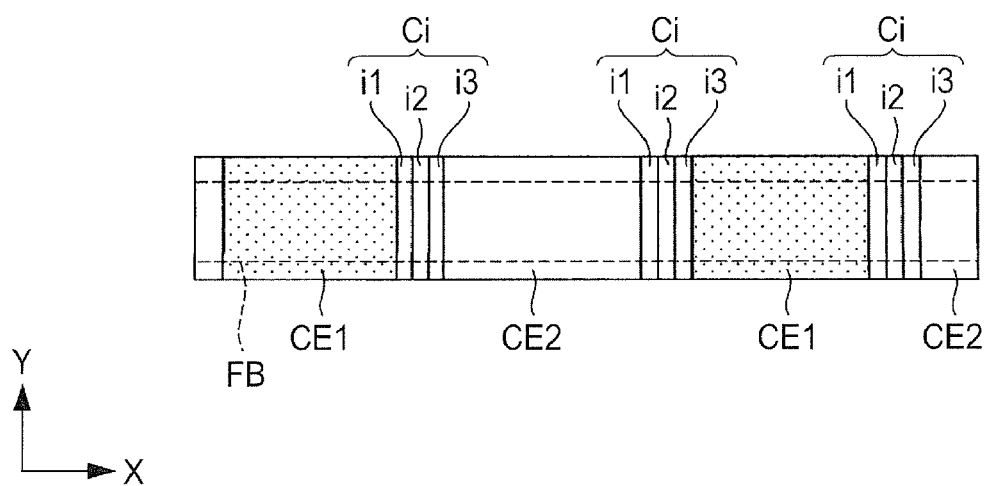
FIG. 9 is an enlarged plan view of a region A1 shown in FIG. 8.
Figure 10:
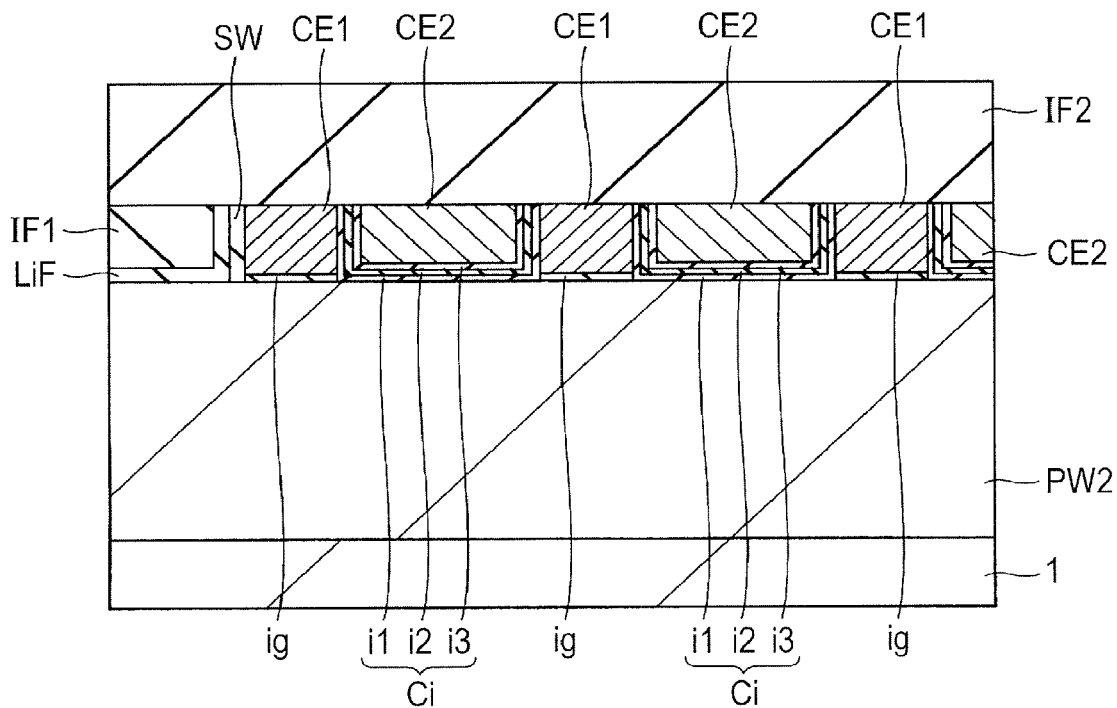
FIG. 10 is a cross-sectional view taken along the line X3-X3 of FIG. 8.
Figure 11:
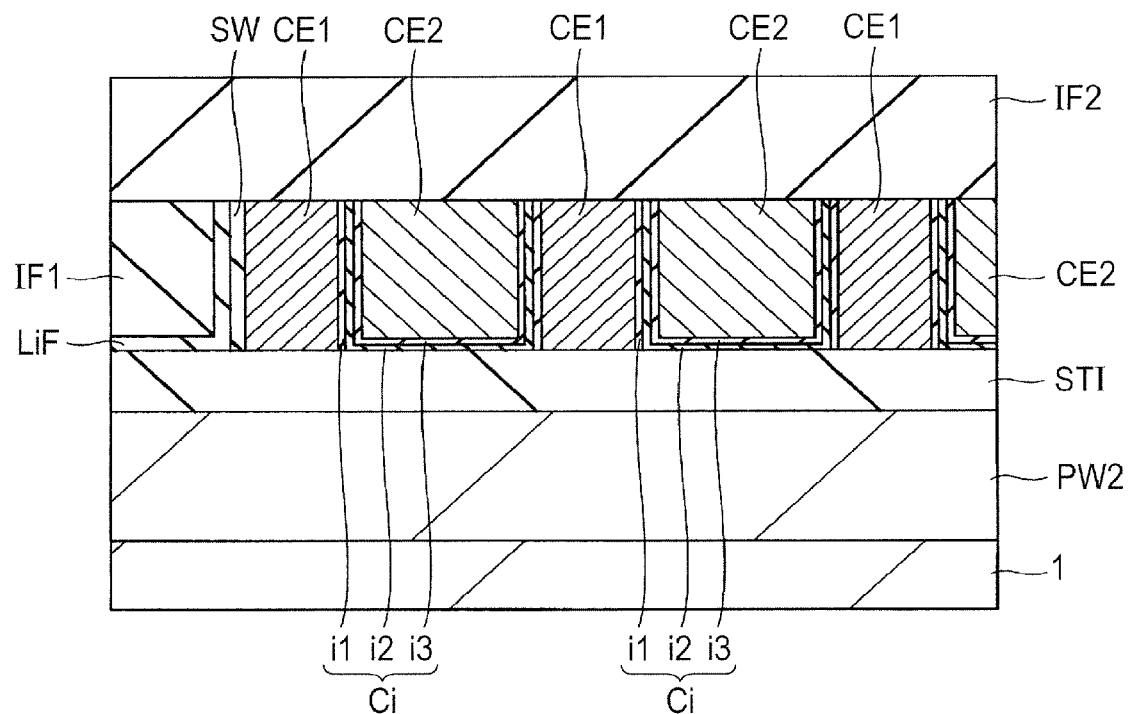
FIG. 11 is a cross-sectional view taken along the line X4-X4 of FIG. 8.
Figure 12:
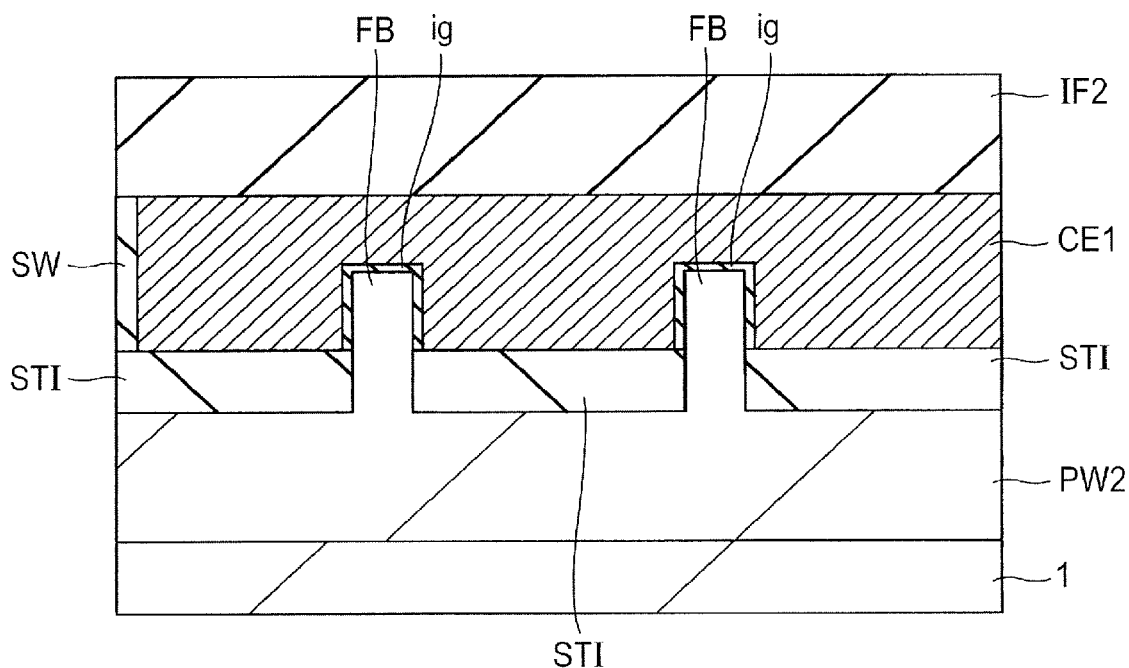
FIG. 12 is a cross-sectional view taken along the line Y3-Y3 of FIG. 8.
Figure 13:
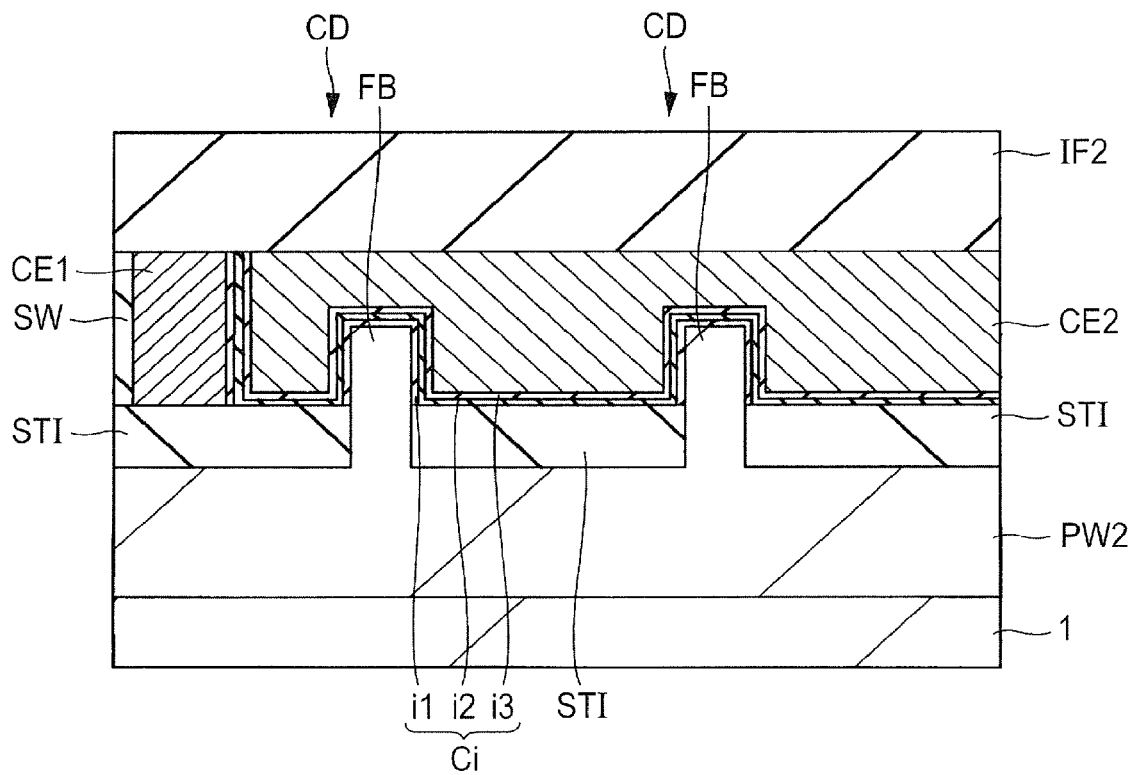
FIG. 13 is a cross-sectional view taken along the line Y4-Y4 of FIG. 8.

Next, FIG. 8 is a plan view of a main part of a capacitive element region CR in the chip CHP shown in FIG. 1; FIG. 9 is an enlarged plan view of a region A1 shown in FIG. 8; FIG. 10 is a cross-sectional view taken along the line X3-X3 of FIG. 8; FIG. 11 is a cross-sectional view taken along the line X4-X4 of FIG. 8; FIG. 12 is a cross-sectional view taken along the line Y3-Y3 of FIG. 8; and FIG. 13 is a cross-sectional view taken along the line Y4-Y4 of FIG. 8. Although FIGS. 8 and 9 are plan views, for better understanding, capacitor electrodes CE1 of the capacitive element CD that are formed of the same conductive film in the same formation step as the control gate electrode CG are indicated by the same hatching as the control gate electrode CG.

As shown in FIG. 8, in the capacitive element region CR, a plurality of fins (second protrusions) FB extending in the X direction is arranged at equal intervals along the Y direction on the main surface of the substrate 1. Each fin FB is formed in a strip-shaped pattern in the planar view that has a predetermined width in the Y direction. Each fin FB is formed at the same time as the fin FA described above. The fins FB are formed by parts of the substrate 1 in the same manner as the fins FA. That is, as shown in FIGS. 12 and 13, each fin FB is configured of a rectangular parallelepiped-shaped protrusion (convex portion) that protrudes from the main surface of the substrate 1 in the direction (first direction) perpendicular to the main surface of the substrate 1. Each fin FB is formed within a p-type well PW2 located in an upper part of the substrate 1. The p-type well PW2 is formed, for example, by introducing impurities, such as phosphor (P) or arsenic (As), into the upper part of the substrate 1.

As shown in FIGS. 11 to 13, like the above-mentioned fin FA, the periphery of a leg portion (lower portion) side of each fin FB is surrounded by the isolation portion STI. The respective fins FB are separated from each other by the isolation portion STI. In other words, the fin FB exposed from the isolation portion STI is a part that forms the active region of the substrate 1. That is, the fins FB serve as the active regions for forming the capacitive element.

As shown in FIG. 8, capacitor electrodes CE1 and CE2, each extending in the Y direction, are arranged on the substrate 1 in the capacitive element region CR while intersecting the fins FB. The capacitor electrodes CE1 and CE2 are a pair of electrodes that form one capacitive element CD. The capacitor electrodes CE1 and CE2 are alternately arranged adjacent to each other along the X direction. A capacitive insulating film Ci is arranged between the adjacent capacitor electrodes CE1 and CE2. In this example, ends of the capacitor electrodes CE1 are coupled to a common capacitor electrode CE1 that intersects these capacitor electrodes CE1. Alternatively, the plurality of capacitor electrodes CE1 may be coupled together by a wiring of an upper layer without being coupled together at their ends.

Each capacitor electrode (first capacitor electrode) CE1 of the capacitive element CD is formed of the same conductive film in the same formation step as the control gate electrode CG described above. That is, the capacitor electrode CE1 is formed of, for example, a conductive film, such as a polycrystalline silicon film, into which predetermined impurities are introduced. The width (short-direction dimension) of the capacitor electrode CE1 is, for example, the same as the width (short-direction dimension) of the control gate electrode CG.

As shown in FIGS. 10 and 12, an insulating film ig is formed between the capacitor electrode CE1 and the surfaces (main surface and side surfaces intersecting the main surface) of the fin FB. The insulating film ig is formed of the same insulating film in the same formation step as the gate insulating film Git located under the control gate electrode CG mentioned above. That is, the insulating film ig is made of, for example, a silicon oxide film which is formed by thermally oxidizing the surfaces (main surfaces and side surfaces) of the fin FB. The insulating film ig has a thickness of, for example, 2 nm. Note that the capacitor electrode CE1 of the capacitive element CD is not directly coupled to the substrate 1 by the insulating film ig, but is electrically coupled to a p-type well PW2 of the substrate 1 through a wiring (not shown) of the upper layer of the substrate 1.

Meanwhile, the capacitor electrode (second capacitor electrode) CE2 of the capacitive element CD is formed of the same conductive film in the same formation step as the memory gate electrode MG mentioned above. That is, the capacitor electrode CE2 is formed of, for example, a conductive film, such as a polycrystalline silicon film, into which predetermined impurities are introduced. The width of the capacitor electrode CE2 (X-direction dimension, short-direction dimension) is, for example, substantially the same as the width of the memory gate electrode MG (X-direction dimension, short-direction dimension).

As shown in FIGS. 9 to 11 and 13, a capacitive insulating film Ci is formed between the capacitor electrode CE2 and the surface of the fin FB and between the capacitor electrode CE2 and the capacitor electrode CE1. The capacitor electrode CE2 and the capacitor electrode CE1 and substrate 1 are insulated from each other by the capacitive insulating film Ci. The capacitive insulating film Ci is formed of the same insulating film in the same formation step as the gate insulating film Gim mentioned above. That is, the capacitive insulating film Ci is formed of, for example, a laminated structure of three insulating films i1 to i3. Specifically, the insulating film i1 is formed, for example, of a silicon oxide film and has a thickness of, for example, 4 to 5 nm. The insulating film it is formed, for example, by thermally oxidizing the surfaces of the fin FB and the like. The insulating film i2 on the insulating film i1 is formed of, for example, a silicon nitride film and has a thickness of, for example, 7 to 10 nm. The insulating film i3 on the insulating film i2 is, for example, a silicon oxide film and has a thickness of, for example, 5 nm. The insulating film i3 can also be formed of, for example, a silicon oxynitride film (SiON film) with a thickness of approximately 9 nm, instead of a silicon oxide film. For example, the insulating film i2 may be formed of HfSiO, and the insulating film i3 may be formed of AlO. The capacitive insulating film Ci is formed by the gate insulating film Gim, whereby a silicon nitride film or the like having a dielectric constant higher than that of the silicon oxide film can be included in the capacitive insulating film Ci, thereby increasing the capacitance of the capacitive element CD per unit area.

In this way, in the first embodiment, the capacitor electrodes CE1 and CE2, the insulating film ig, and the capacitive insulating film Ci are formed in the same formation step as the control gate electrode CG, the memory gate electrode MG, the gate insulating film Git, and the gate insulating film Gim, thus making it possible to simplify the manufacturing process of the semiconductor device.

In the same manner as mentioned above, in the capacitive element region CR, the insulating film LiF and the interlayer insulating films IF1 and IF2 are deposited on the main surface of the substrate 1 in this order from the lower layer. Here, the insulating film LiF is formed to cover the surfaces (main surface and side surfaces) of the fin FB, the upper surface of the isolation portion STI, and the side surfaces of the sidewall spacers SW. The interlayer insulating film IF1 has the function of eliminating stepped parts (i.e., planarizing) at the main surface of the substrate 1S due to the fins FB, the capacitor electrodes CE1 and CE2, and the like. The upper surface of the interlayer insulating film IF1 is substantially flush with the upper surfaces of the capacitor electrodes CE1 and CE2.

Figure 14:
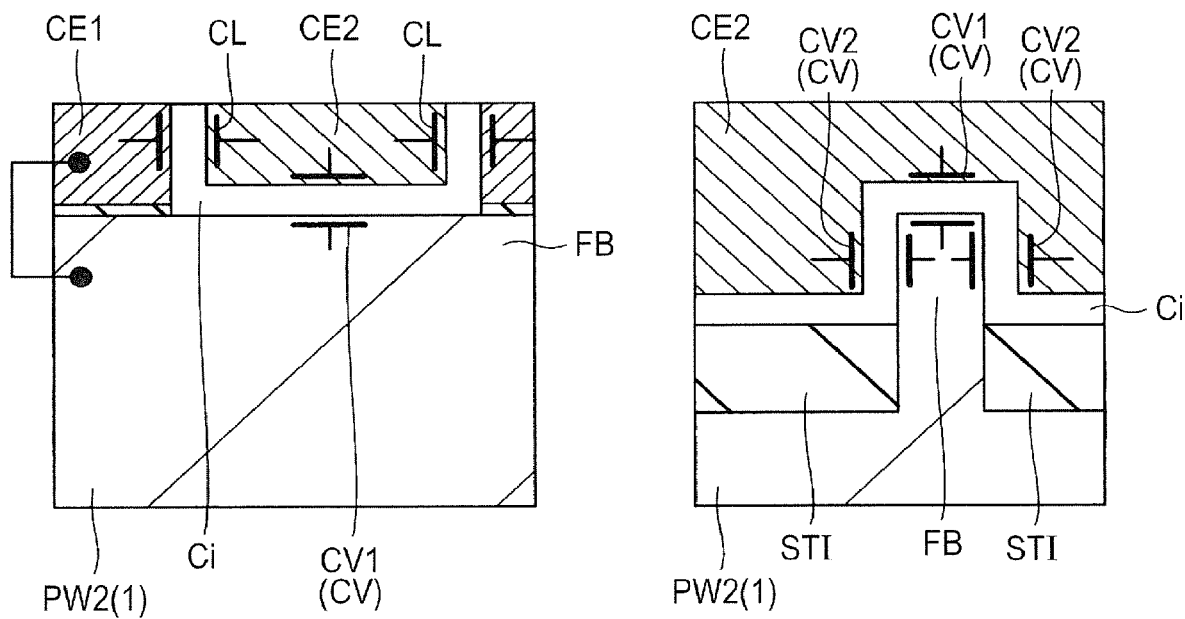
FIG. 14 illustrates, on the left, an explanatory diagram of the capacitance of the capacitive element, which is an enlarged cross-sectional view of the main part shown in FIG. 10, and on the right, an explanatory diagram of the capacitance of the capacitive element, which is an enlarged cross-sectional view of the main part shown in FIG. 13.
Figure 15:
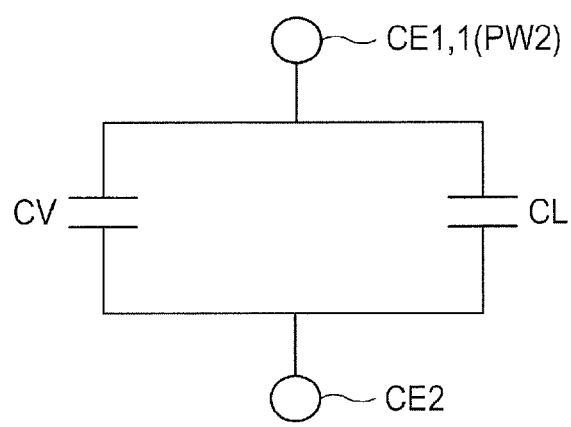
FIG. 15 is a unit circuit diagram of the capacitive element.

FIG. 14 illustrates, on the left, an explanatory diagram of the capacitance of the capacitive element CD, which is an enlarged cross-sectional view of the main part shown in FIG. 10, and on the right, an explanatory diagram of the capacitance of the capacitive element CD, which is an enlarged cross-sectional view of the main part shown in FIG. 13; and FIG. 15 is a unit circuit diagram of the capacitive element CD. For better understanding of the figures, FIG. 14 omits hatching of the capacitive insulating film Ci.

As shown in FIG. 14, in the first embodiment, the capacitance of the capacitive element CD has a capacitance CL between the capacitor electrode CE2 and the capacitor electrode CE1, as well as a capacitance CV (CV1, CV2) between the capacitor electrode CE2 and the substrate 1. Specifically, regarding the capacitance CV, the capacitance CV1 is formed between the capacitor electrode CE2 and the main surface of the fin FB, and additionally the capacitance CV2 is formed between the capacitor electrode CE2 and the side surfaces of the fin FB as shown on the right of FIG. 14. As shown in FIG. 15, the capacitances CV and CL of the capacitive element CD are coupled in parallel between the capacitor electrode CE1 and p-type well PW2 (substrate 1) and the capacitor electrode CE2. With this configuration, the capacitance of the capacitive element CD per unit area can be increased, compared to a case in which a fin FB is not arranged in the capacitive element region CR. Thus, the plane area of each capacitive element CD can be reduced, thereby making it possible to reduce the plane area (chip size) of the chip CHP. Therefore, the cost of the semiconductor device can be reduced.

Figure 16:
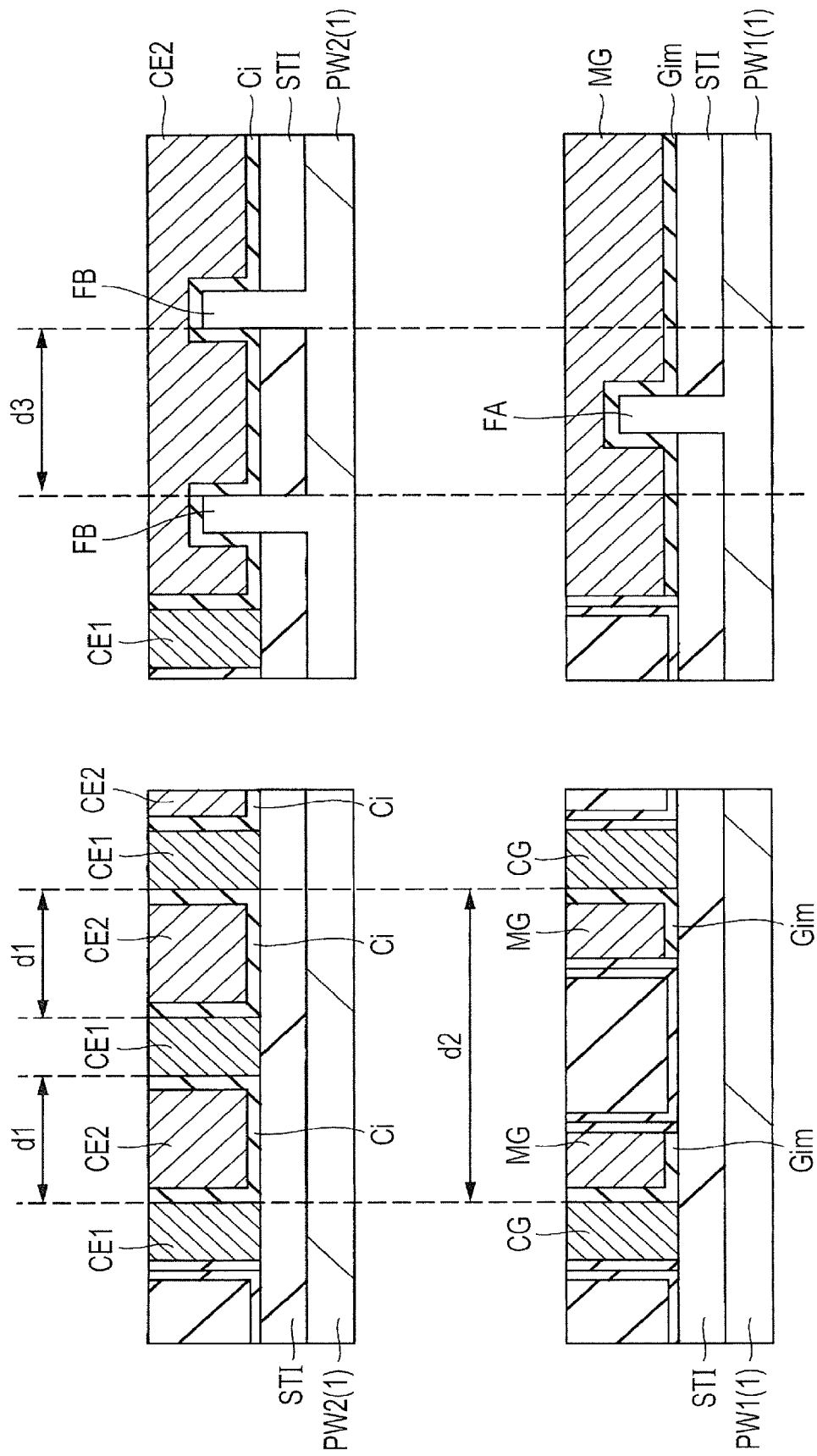
FIG. 16 illustrates, on the left, cross-sectional views of main parts of the semiconductor substrate by comparing a distance between adjacent capacitor electrodes of the capacitive element with a distance between adjacent control gate electrodes of memory cells, and also illustrates, on the right, cross-sectional views of main parts of the semiconductor substrate by comparing a distance between adjacent fins arranged in a capacitive element region with a distance between adjacent fins arranged in the memory cell array.

FIG. 16 illustrates, on the left, cross-sectional views showing main parts of the substrate 1 by comparing a distance between adjacent capacitor electrodes CE1 of the capacitive element CD with a distance between adjacent control gate electrodes CG of the memory cells MC.

In the first embodiment, since patterns for the capacitor electrode CE1 and the control gate electrode CG are transferred using the same exposure mask, an interval, i.e., a distance between the adjacent capacitor electrodes CE1 is normally proposed to be set equal to an interval, i.e., a distance between the adjacent control gate electrodes CG from the standpoint of avoiding dimensional variations at the time of pattern transfer. From this point of view, the distance between adjacent capacitor electrodes CE1 configuring the capacitive element CD may be equal to the distance between adjacent control gate electrodes CG configuring the memory cells MC. In the first embodiment, in consideration with this point, the distance d1 between the adjacent capacitor electrodes CE1 of the capacitive element CD is set smaller than the distance d2 between the adjacent control gate electrodes CG of the memory cells MC on purpose. Consequently, the number of capacitor electrodes CE1 and CE2 that are able to be arranged in the capacitive element region CR can be increased, so that the capacitance of the capacitive element CD per unit area can be increased. If the distance d1 between the adjacent capacitor electrodes CE1 is too small, the capacitor electrode CE2 and the capacitive insulating film Ci cannot be embedded between the adjacent capacitor electrodes CE1. Thus, in the first embodiment, the distance d1 between the adjacent capacitor electrodes CE1 is set three times or more the thickness of the capacitive insulating film Ci. With this configuration, the capacitor electrode CE2 and the capacitive insulating film Ci can be embedded between the adjacent capacitor electrodes CE1.

FIG. 16 illustrates, on the right, cross-sectional views showing main parts of the substrate 1 by comparing a distance between adjacent fins FB arranged in the capacitive element region CR with a distance between adjacent fins FA arranged in the memory cell array MR.

In the same manner as mentioned above, in the first embodiment, since patterns for the fins FA in the memory cell array MR and the fins FB in the capacitive element region CR are transferred using the same exposure mask, a distance between the adjacent fins FA is normally proposed to be set equal to a distance between the adjacent fins FB from the standpoint of avoiding dimensional variations at the time of pattern transfer. From this point of view, the distance between the adjacent fins FB in the capacitive element region CR may be equal to the distance between the adjacent fins FA in the memory cell array MR. In the first embodiment, in consideration with this point, the distance d3 between the adjacent fins FB in the capacitive element region CR is set smaller than the distance between the adjacent fins FA in the memory cell array MR on purpose. Consequently, the number of fins FB that are able to be arranged in the capacitive element region CR can be increased, so that the capacitance of the capacitive element CD per unit area can be increased. If the distance d3 between the adjacent fins FB is too small, the capacitor electrodes CE1 and CE2 and the capacitive insulating film Ci cannot be embedded between the adjacent fins FB. Thus, in the first embodiment, the distance d3 between the fins FB is set three times or more the thickness of the capacitive insulating film Ci. With this configuration, the capacitor electrodes CE1 and CE2 and the capacitive insulating film Ci can be embedded between the adjacent fins FB.

In the above description, the width (dimension in the X direction) of the control gate electrode CG is equal to the width (dimension in the X direction) of the capacitor electrode CE1. Likewise, this is based on the reason from the viewpoint of avoiding dimensional variations at the time of pattern transfer because the patterns of the control gate electrode CG and the capacitor electrode CE1 are transferred using the same exposure mask. Also in this case, from the viewpoint of this, the width of the capacitor electrode CE1 may be set smaller than the width of the control gate electrode CG. Consequently, the number of capacitor electrodes CE1 and CE2 that are able to be arranged in the capacitive element region CR is increased, so that the capacitance of the capacitive element CD per unit area can be increased.

Each of the length (thickness, height) from the main surface of the fin FB to the upper surface of each of the capacitor electrodes CE1 and CE2, and the length (thickness) from the side surface of the fin FB to the side surface of each of the capacitor electrodes CE1 and CE2 may be set longer (thicker, or higher) than the width in the X dimension (short-direction dimension) of the capacitor electrode. Consequently, a facing area between the capacitor electrodes CE1 and CE2 can be increased without increasing the area occupied by the capacitive element CD. Therefore, the capacitance per unit area of the capacitive element CD can be increased.

Figure 17:
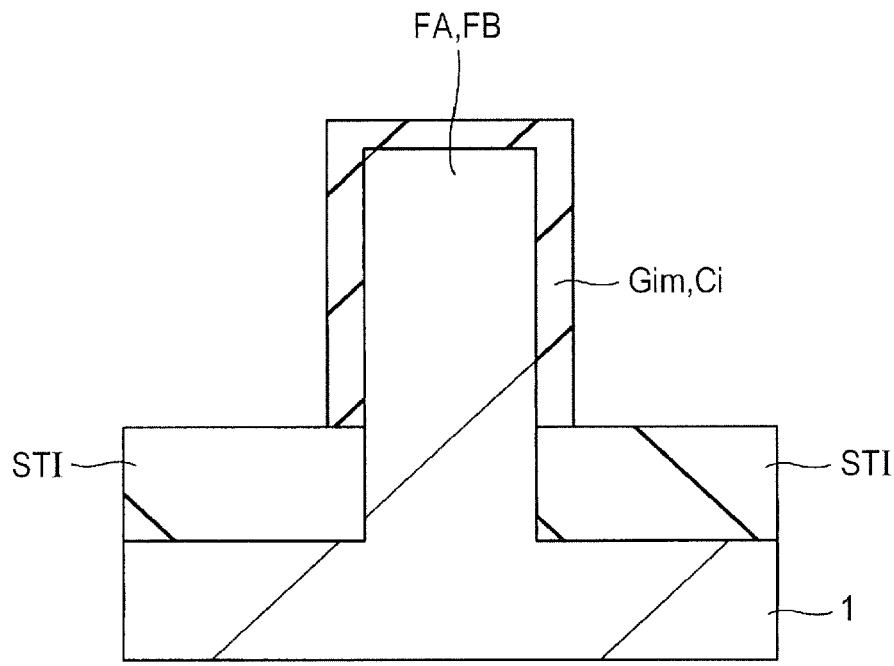
FIG. 17 is an enlarged cross-sectional view of the fin.
Figure 18:
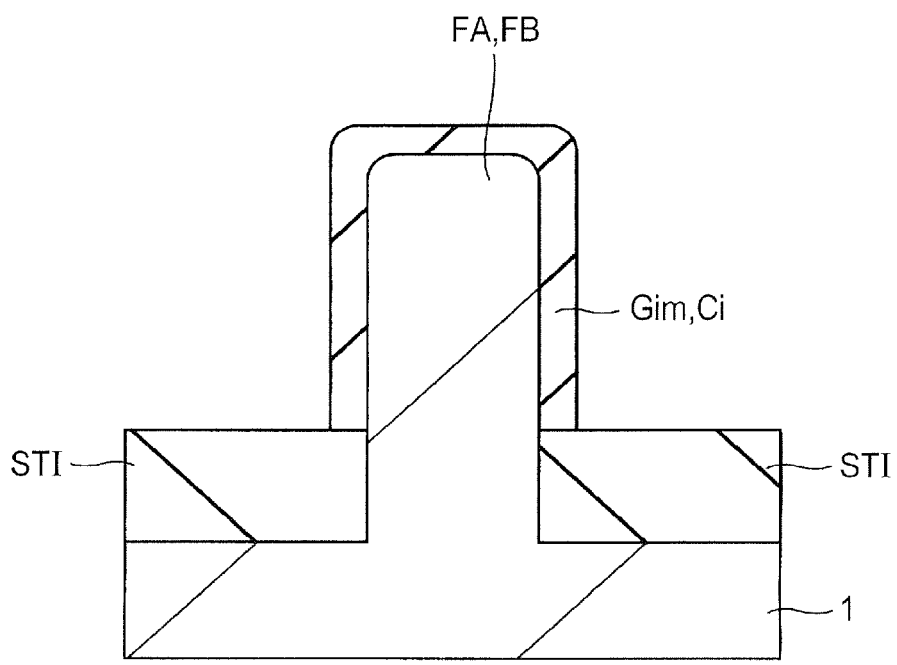
FIG. 18 is an enlarged cross-sectional view of a fin in a modified example.

FIGS. 17 to 20 are enlarged cross-sectional views of the fins FA and FB. In the first embodiment, as shown in FIG. 17, the fins FA and FB each have a rectangular parallelepiped shape, but are not limited thereto and can be variously modified. For example, as shown in FIG. 18, corners of protruding ends of the fins FA and FB may be rounded (tapered). This shape can suppress the enhancement of the electric field at the corners of the protruding ends of the fins FA and FB. Thus, the reliability of the memory cell MC and the capacitive element CD can be improved, and thereby the lifetime of the memory cell MC and the capacitive element CD can also be improved.

Figure 19:
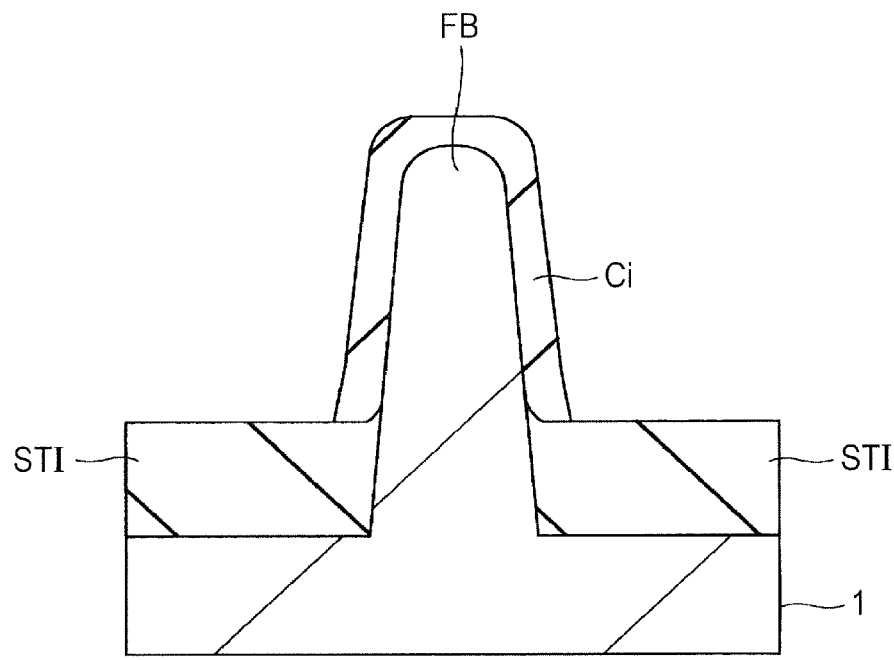
FIG. 19 is an enlarged cross-sectional view of a fin in another modified example.

Further, for example, as shown in FIG. 19, the corners of the protruding ends of the fin FB are rounded, and both side surfaces (side surfaces in the longitudinal direction) of the fin FB may be inclined relative to the main surface of the substrate 1 such that the width (short-direction dimension) of the fin FB gradually decreases from the leg portion of the fin FB toward the protruding end thereof. In this case, the structure shown in FIG. 18 can suppress the enhancement of the electric field at the corners of the protruding ends of the fins FA and FB. Thus, the reliability of the capacitive element CD can be improved, and thereby the lifetime of the capacitive element CD can be further improved. A facing area between the capacitor electrode CE2 and the fin FB can be increased more than that in the structure shown in FIG. 17, so that the capacitance of the capacitive element CD can be increased.

Figure 20:
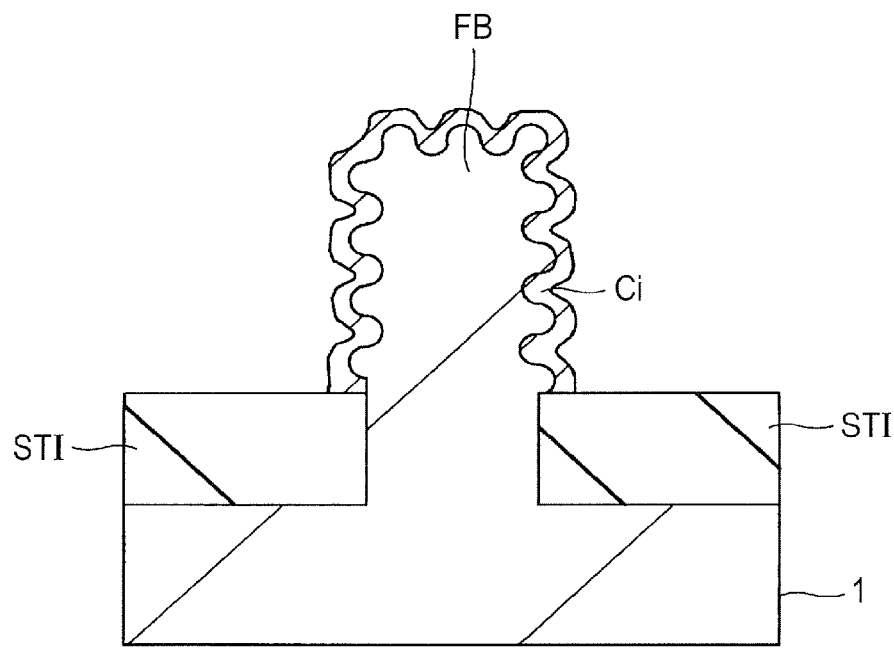
FIG. 20 is an enlarged cross-sectional view of a fin in another modified example.

Further, for example, as shown in FIG. 20, a plurality of minute protrusions (irregularities) may be formed on the surface of the fin FB. With this shape, the facing area between the capacitor electrode CE2 and the fin FB can be increased, compared to the structure shown in FIGS. 17 to 19, so that the capacitance of the capacitive element CD can be increased. The minute protrusions on the FB are made of, for example, silicon (Si), and can be formed by the CVD method or the like.

Figure 21:
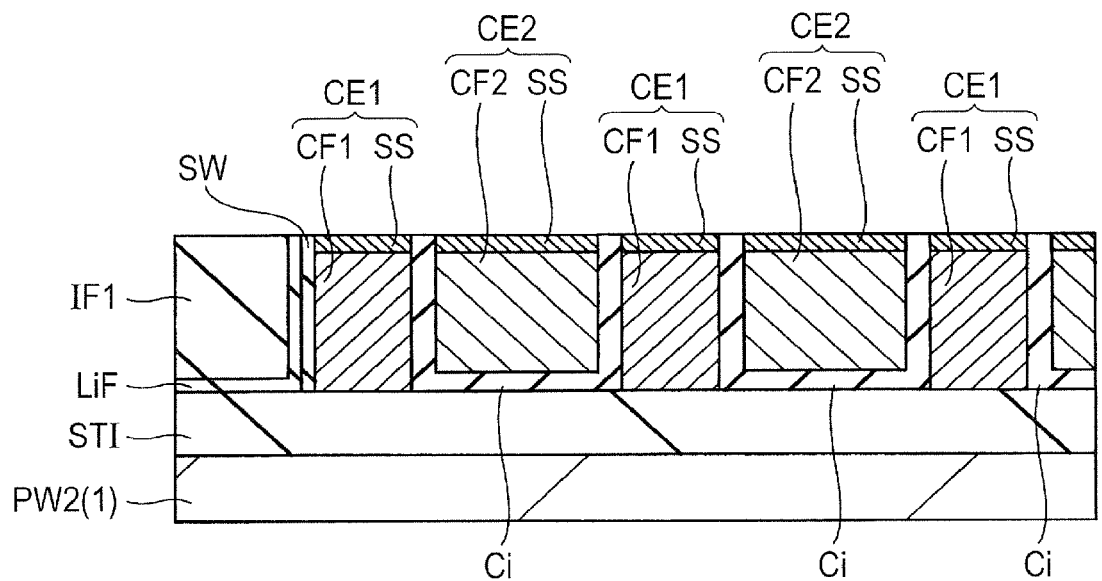
FIG. 21 is a cross-sectional view of a main part of capacitor electrodes of a capacitive element in a modified example.

FIGS. 21 to 24 are cross-sectional views of main parts of modified examples of the capacitor electrodes CE1 and CE2 of the capacitive element CD. In the first embodiment, the capacitor electrodes CE1 and CE2 are formed of a single film, for example, a low-resistance polycrystalline silicon film, but are not limited thereto and can be variously modified. For example, as shown in FIG. 21, the capacitor electrodes CE1 and CE2 may be configured of a laminated structure that includes conductive films CF1 and CF2, such as a low-resistance polycrystalline silicon film, and silicide layers SS formed on the respective conductive films. Thus, the contact resistance between the capacitor electrodes CE1 and CE2 and the wiring can be reduced. Furthermore, the resistance of the capacitor electrodes CE1 and CE2 can be reduced. The silicide layer SS is formed of, for example, a compound of silicon (Si) and titanium (Ti), nickel (Ni), cobalt (Co), or platinum (Pt). This silicide layers SS of the capacitor electrodes CE1 and CE2 can be formed at the same time as, for example, when the silicide layer SS is formed over the control gate electrode CG and the memory gate electrode MG of the memory array MR (or the control gate electrode CG, the memory gate electrode MG, the source region MS, and the drain region MD).

Figure 22:
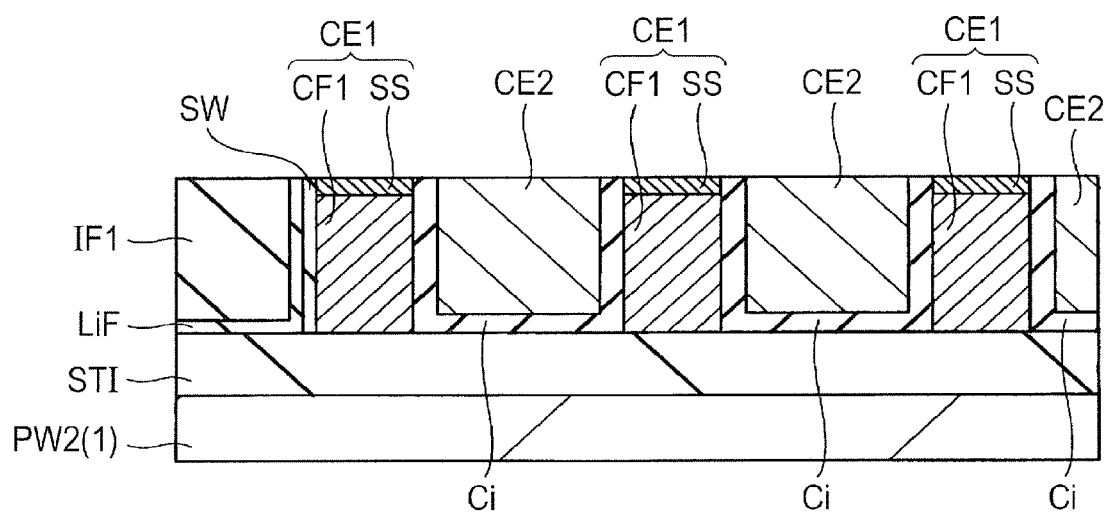
FIG. 22 is a cross-sectional view of a main part of capacitor electrodes of a capacitive element in another modified example.

As shown in FIG. 22, the capacitor electrode CE1 may be formed by a laminated structure that includes the conductor film CF1 and the silicide layer SS on the conductor film CF1, whereas the capacitor electrode CE2 may be formed of a metal film made of, for example, tungsten, aluminum, etc. This structure can exhibit the effect obtained in the case of FIG. 21 and can also reduce the contact resistance between the capacitor electrode CE2 and the wiring. Furthermore, the resistance of the capacitor electrode CE2 can be reduced. As the depletion of the capacitor electrode CE2 can be suppressed, the capacitance between the capacitor electrodes CE1 and CE2 can be increased. The capacitor electrode CE2 can be formed, for example, at the same time as when the memory gate electrode MG of the memory array MR is formed.

Figure 23:
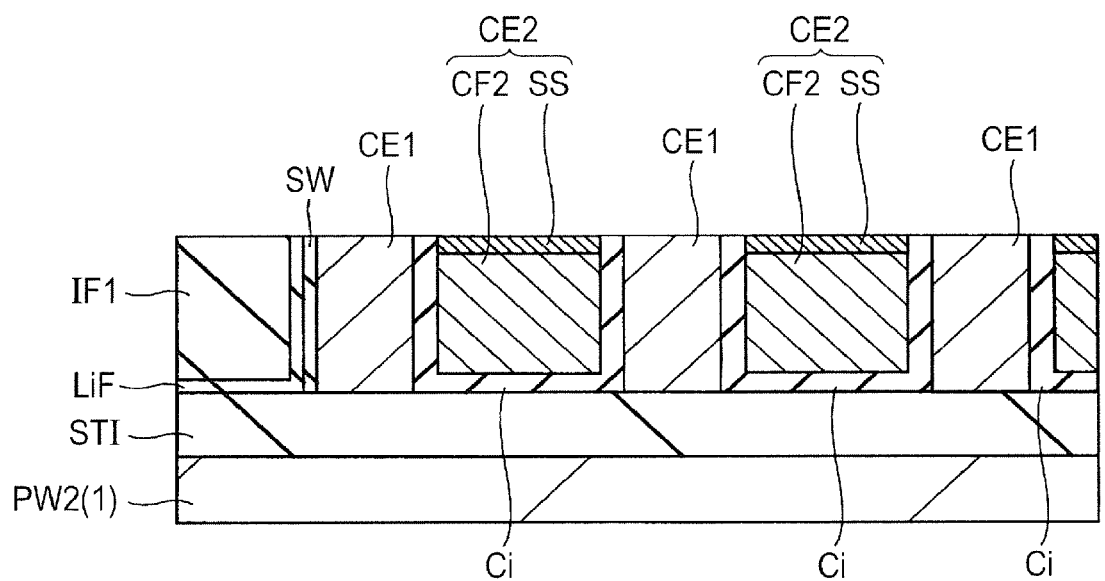
FIG. 23 is a cross-sectional view of a main part of capacitor electrodes of a capacitive element in another modified example.

As shown in FIG. 23, contrary to the case of FIG. 22, the capacitor electrode CE2 may be configured of a laminated structure that includes the conductor film CF2 and the silicide layer SS thereover. In addition, the capacitor electrode CE1 may be formed of a metal film made of, for example, tungsten, aluminum, etc. This structure can exhibit the effect obtained in the case of FIG. 21 and can further reduce the contact resistance between the capacitor electrode CE1 and the wiring. Further, the resistance of the capacitor electrode CE1 can be reduced. As the depletion of the capacitor electrode CE1 can be suppressed, the capacitance between the capacitor electrodes CE1 and CE2 can be increased. The capacitor electrode CE1 can be formed, for example, at the same time as when the control gate electrode CG of the memory array MR is formed.

Figure 24:
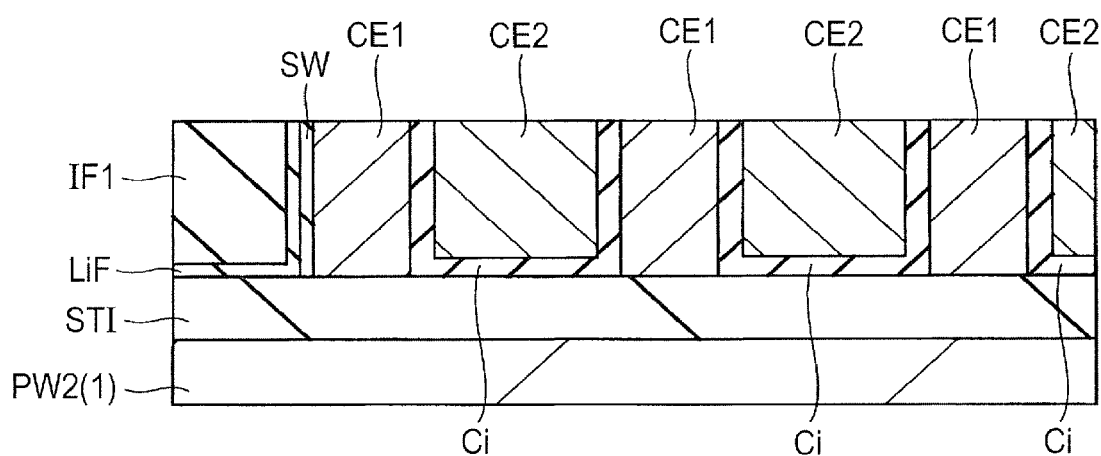
FIG. 24 is a cross-sectional view of a main part of capacitor electrodes of a capacitive element in another modified example.

Further, as shown in FIG. 24, the capacitor electrodes CE1 and CE2 can be formed of a metal film made of, for example, tungsten, aluminum, etc. This structure can exhibit the effect obtained in the case of FIG. 21 and can further reduce the contact resistance between the capacitor electrodes CE1 and CE2 and the wiring. Further, the resistances of the capacitor electrodes CE1 and CE2 can be reduced. As the depletion of the capacitor electrodes CE1 and CE2 can be suppressed, the capacitance between the capacitor electrodes CE1 and CE2 can be further increased. The capacitor electrodes CE1 and CE2 can be formed, for example, at the same time as when the control gate electrode CG and the memory gate electrode MG of the memory array MR are formed.

Figure 25:
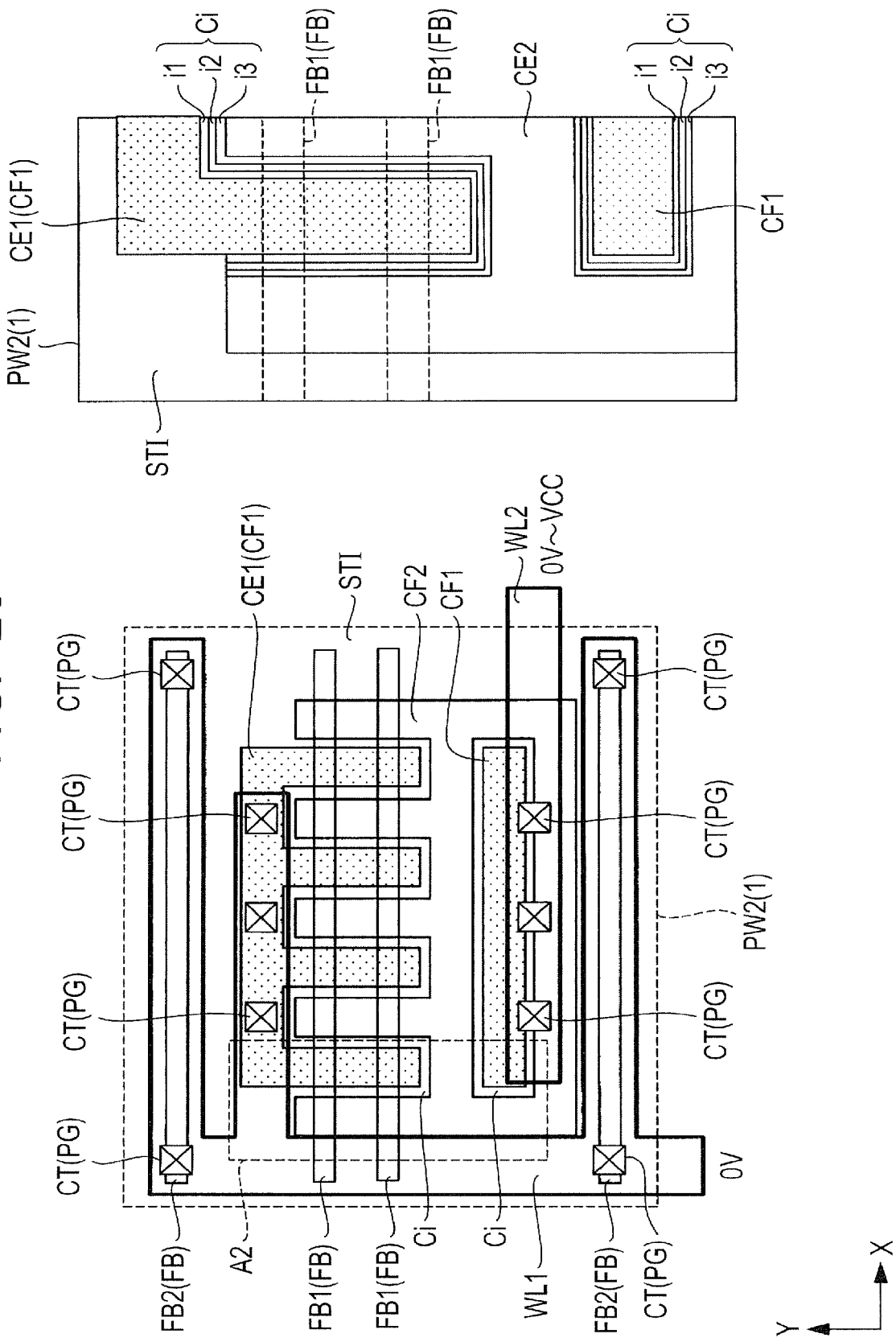
FIG. 25 illustrates, on the left, a plan view of a specific arrangement example of the capacitive element, and on the right, an enlarged plan view of a region A2 shown on the left of FIG. 25.

FIG. 25 illustrates, on the left, a plan view of a specific arrangement example of the capacitive element, and on the right, an enlarged plan view of a region A2 shown on the left of FIG. 25.

The capacitor electrodes CE1 and CE2G are formed, for example, into a comb-teeth shape in the planar view, and are arranged while their comb-teeth are engaged with each other. Thus, the arrangement density of the capacitor electrodes CE1 and CE2 is increased, so that the capacitance of the capacitive element CD per unit area can be increased.

The capacitor electrodes CE1 are electrically coupled to the wiring WL1 as the upper layer through the plug electrodes PG in a plurality of contact holes Ct. The wiring WL1 is formed of, for example, metal. For example, a voltage of 0 V is supplied to the wiring WL1.

Meanwhile, the capacitor electrodes CE2 are electrically coupled to the wiring WL2 as the upper layer through the plug electrodes PG in the plurality of contact holes CT. As with the above-mentioned wiring WL1, the wiring WL2 is formed of metal and insulated from the wiring WL1. For example, a voltage of 0 to VCC is supplied to the wiring WL2.

A hollow region is formed in a part of the capacitor electrode CE2, and within the hollow region, a conductor film CF1 for forming the capacitor electrode CE1 is arranged in an isolated state. The conductor film CF1 is not electrically coupled to the capacitor electrode CE1. The conductor film CF1 is provided to improve the coupling property of the plug electrode PG in the contact hole CT to couple the capacitor electrode CE2 with the wiring WL2. The plug electrode PG in the contact hole CT that electrically couples the wiring WL2 with the capacitor electrode CE2 may or may not be electrically coupled with the conductive film CF1.

In the region where the comb-teeth of the capacitor electrodes CE1 and CE2 are engaged with each other, the fins FB1 (FB) are arranged while intersecting the comb-teeth. In this way, the capacitance of the capacitive element CD per unit area can be increased as mentioned above. Although FIG. 25 illustrates the arrangement of the two fins FB1 for better understanding of the figure, the fins FB1 are not limited thereto and two or more fins FB1 can also be arranged.

The fins FB2 (FB) extending in the X direction are arranged to sandwich the capacitor electrodes CE1 and CE2 therebetween on both sides in the Y direction of the capacitor electrodes CE1 and CE2. These fins FB2 are electrically coupled to the above-mentioned wiring WL1 through the plug electrodes PG in the contact holes CT. Thus, the capacitor electrodes CE1 and the p-type well PW2 in the substrate 1 are electrically coupled together, and the potential of the p-type well PW2 in the substrate 1 can be fixed.

Figure 26:
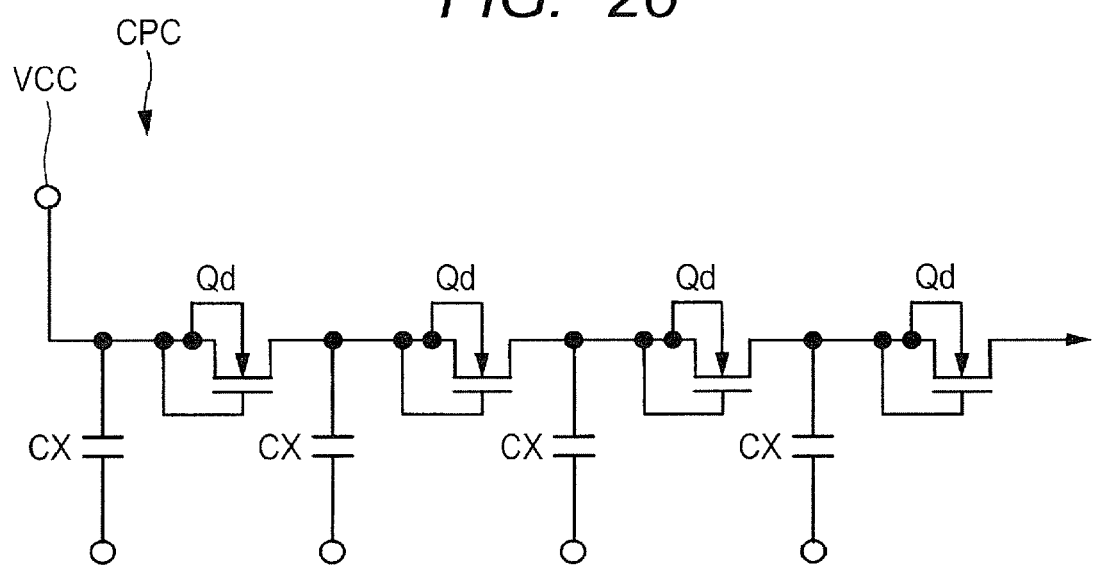
FIG. 26 is a circuit diagram of a charge pump circuit which is an application example of the capacitive element.

FIG. 26 is a circuit diagram of a charge pump circuit, which is an application example of the capacitive element. For a flash memory, when data is written, erased and read, a voltage higher than a power supply voltage VCC is required. Thus, a booster circuit for boosting the power supply voltage VCC to generate a high voltage becomes necessary. The booster circuit uses a circuit, referred to as a charge pump circuit CPC, exemplified in FIG. 26. The charge pump circuit CPC is configured by coupling unit circuits in multiple stages in series, each unit circuit including the capacitive element CX and a plurality of field effect transistors Qd diode-connected. The drain of each field effect transistor Qd is electrically coupled to one capacitor electrode of the capacitive element CX. A clock signal is input to the other capacitor electrode of the capacitive element CX. When the potential is boosted, the charge stored in the capacitive element CX is transferred to the next stage for each clock signal, which raises the potential of a capacitive load of an output.

However, in the charge pump circuit CPC, when a high boosted voltage is required, the number of stages of the above-mentioned unit circuit (configured of the capacitive element CX and the field effect transistor Qd diode-connected) must be increased, resulting in an increased area occupied by the charge pump circuit CPC.

In the first embodiment, the capacitive element CX of the charge pump circuit CPC is configured by the above-mentioned capacitive element CD of the first embodiment, thereby making it possible to decrease the number of stages of the unit circuits, even when a large boosted voltage is obtained. Thus, the area occupied by the charge pump circuit CPC can be decreased, reducing the size of the chip. Note that the charge pump circuit is not limited to the structure exemplified in FIG. 26, but can be variously modified. An application site of the capacitive element CD of the first embodiment is not limited to the capacitive element of the charge pump circuit. The capacitive element CD can be applied to various sites. For example, the capacitive element CD can also be applied to a bypass condenser or the like that is electrically coupled between a wiring for supplying the power source voltage VCC and a wiring for supplying a reference voltage (GND, e.g., 0 V).

<Example of Manufacturing Method for Semiconductor Device>

FIGS. 27 to 62 are cross-sectional views of main parts of the substrate 1 in the manufacturing steps for the semiconductor device in the present embodiment. In the following cross-sectional views, the notations X1-X1, X2-X2, Y1-Y1, Y2-Y2, X3-X3, X4-X4, Y3-Y3, and Y4-Y4 indicate the cross-sectional views taken along lines X1-X1, X2-X2, Y1-Y1, and Y2-Y2 in FIG. 2, as well as the cross-sectional views taken along the lines X3-X3, X4-X4, Y3-Y3 and Y4-Y4 in FIG. 8 in the manufacturing steps.

Figure 27:
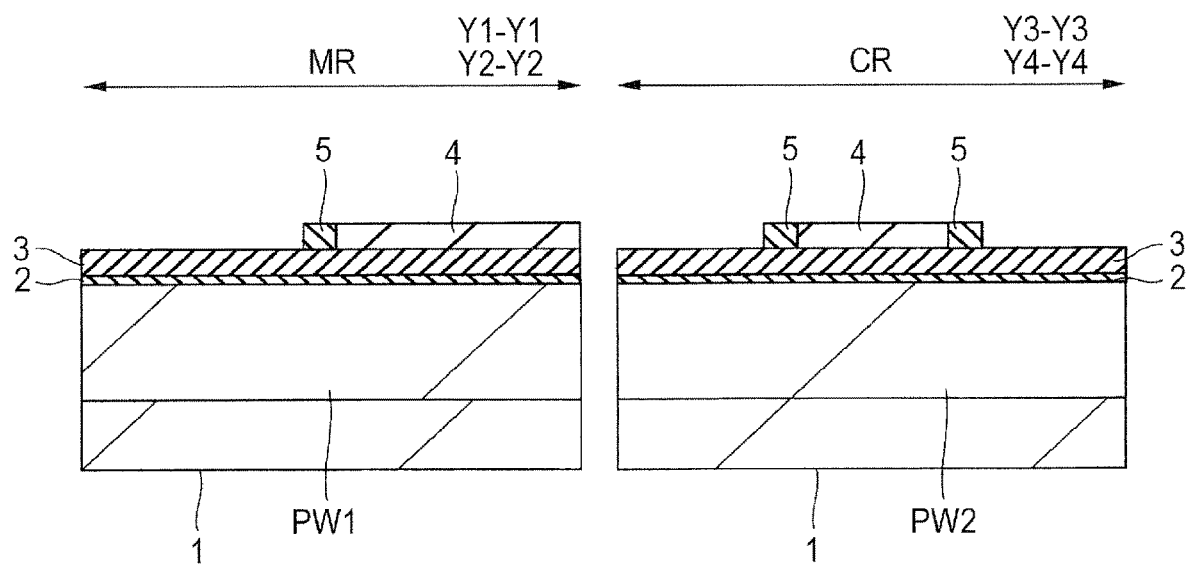
FIG. 27 is a cross-sectional view of a main part of a semiconductor substrate in a manufacturing step of the semiconductor device according to the embodiment.

As shown in FIG. 27, for example, impurities, such as boron, are introduced into the substrate 1 made of p-type single crystal silicon or the like and having a specific resistance of approximately 1 to 10 Ωcm by an ion implantation method or the like to thereby form p-type wells PW1 and PW2 in the upper part of the substrate 1.

Subsequently, for example, an insulating film 2 made of a silicon oxide film or the like with a thickness of approximately 2 to 10 nm is formed on the main surface of the substrate 1 by applying a thermal oxidation treatment or the like to the substrate 1. Thereafter, an insulating film 3 made of, for example, a silicon nitride film with a thickness of approximately 20 to 100 nm is deposited on the insulating film 2 by the CVD method or the like.

Subsequently, an amorphous silicon film is deposited on the insulating film 3 by the CVD method or the like, and then patterned into a desired shape, whereby a mask film 4 made of the amorphous silicon film is formed on the insulating film 3. The thickness of the mask film 4 is, for example, in a range of 20 to 200 nm. Since the fins FA and FB are formed at both ends of the mask film 4, the width of the mask film 4 can determine the distance between the adjacent fins FA and the distance between the adjacent fins FB. Here, the distance between the adjacent fins FB is set smaller than the distance between the adjacent fins FA.

Subsequently, for example, a silicon oxide film with a thickness of approximately 10 to 40 nm is deposited over the substrate 1 by the CVD method or the like to cover the upper surface and the side surfaces of the mask film 4. The silicon oxide film is subjected to anisotropic dry etching to form a hard mask film 5 on each sidewall of the mask film 4. The width (short-direction dimension) of each hard mask film 5 is, for example, in a range of 10 to 40 nm. The width of the hard mask film 5 corresponds to the width of each of the fins FA and FB. Because of this, the width of the fin FA or FB can also be modified by changing the width of the hard mask film 5 by performing wet etching on some of the hard mask films 5 exposed from a mask while covering the other hard mask films 5 with the mask.

Figure 28:
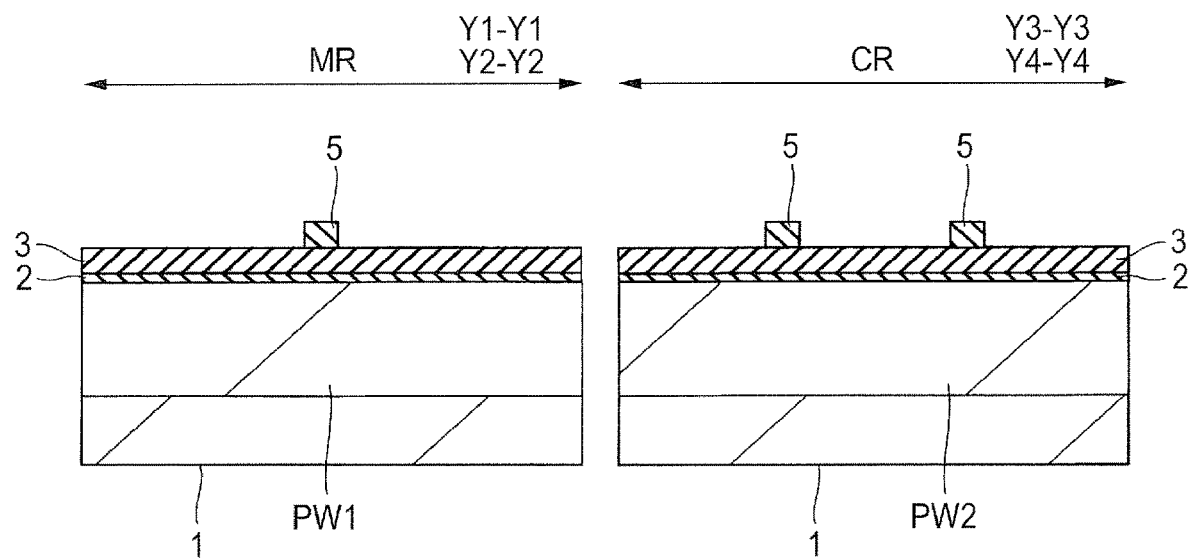
FIG. 28 is a cross-sectional view of a main part of a semiconductor substrate in a manufacturing step following the step of FIG. 27.
Figure 29:
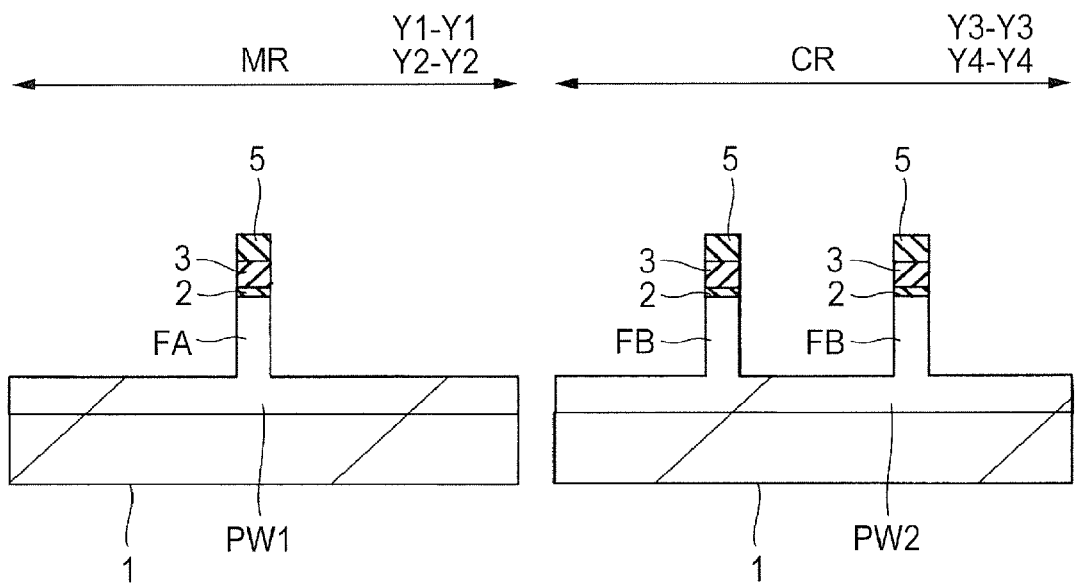
FIG. 29 is a cross-sectional view of a main part of a semiconductor substrate in a manufacturing step following the step of FIG. 28.

Then, after removing the mask film 4, as shown in FIG. 28, the insulating films 2 and 3 and the substrate 1 are subjected to anisotropic dry etching using the remaining hard mask films 5 as an etching mask. In this way, as shown in FIG. 29, the insulating films 2 and 3 and the fins FA and FB, which have the same shape as the hard mask film 5 in the planar view, are formed. Note that the fins FA and FB can be formed to have their height of, for example, 100 to 250 nm from the main surface of the substrate 1 by digging down a region of the substrate 1 exposed from the hard mask films 5, for example, by 100 to 250 nm. Here, the width of each fin FA in the memory cell array MR and the width of each fin FB in the capacitive element region CR are equal to each other, but may be different. Here, the width of the fins FA and FB is the length thereof in the direction that intersects the control gate electrode CG or capacitor electrode CE1 mentioned above. After forming the fins FA and FB, the hard mask film 5 is removed.

Figure 30:
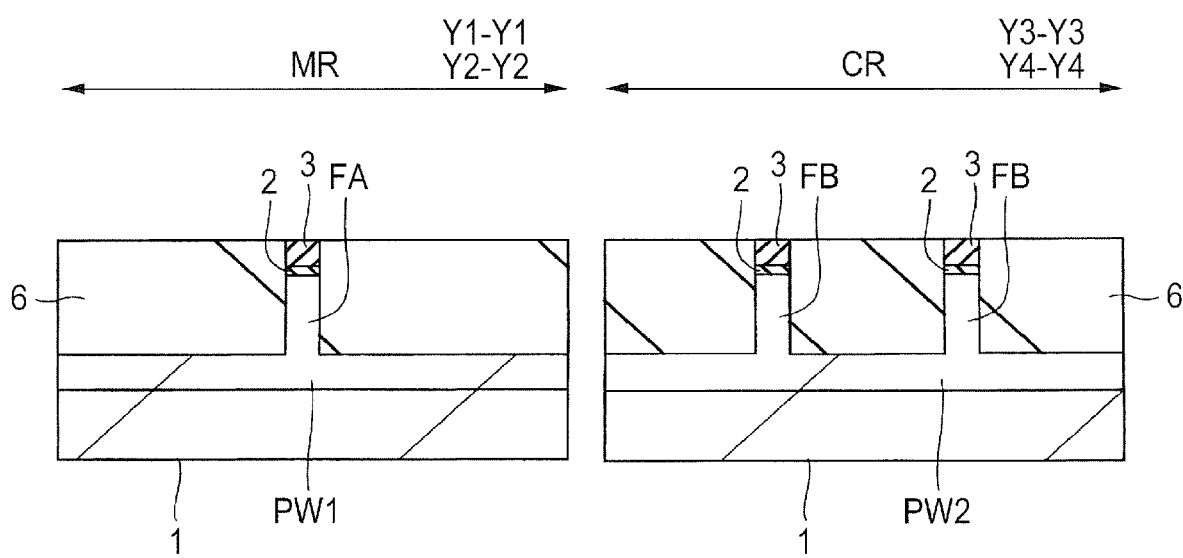
FIG. 30 is a cross-sectional view of a main part of a semiconductor substrate in a manufacturing step following the step of FIG. 29.
Figure 31:
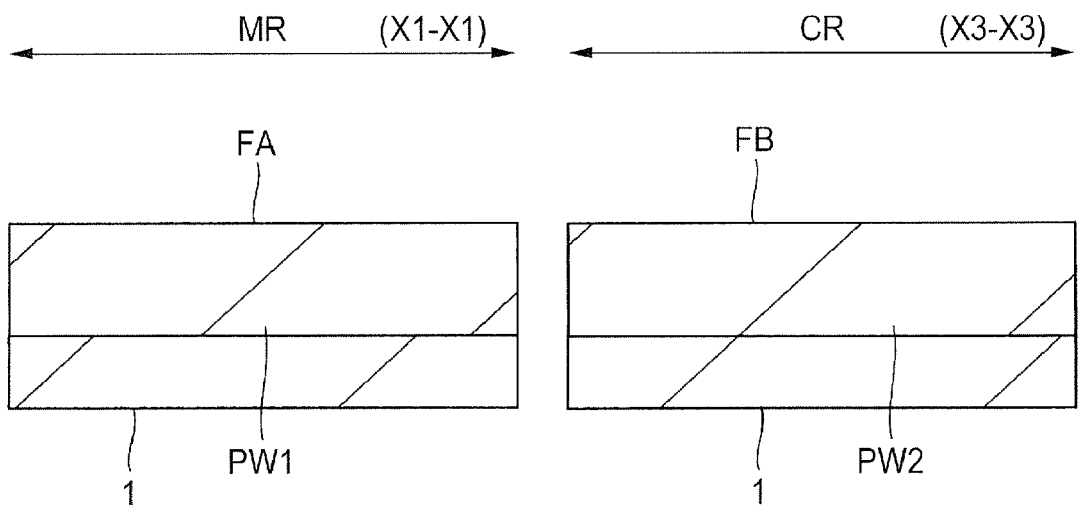
FIG. 31 is a cross-sectional view of a main part of a semiconductor substrate in a manufacturing step following the step of FIG. 30.
Figure 32:
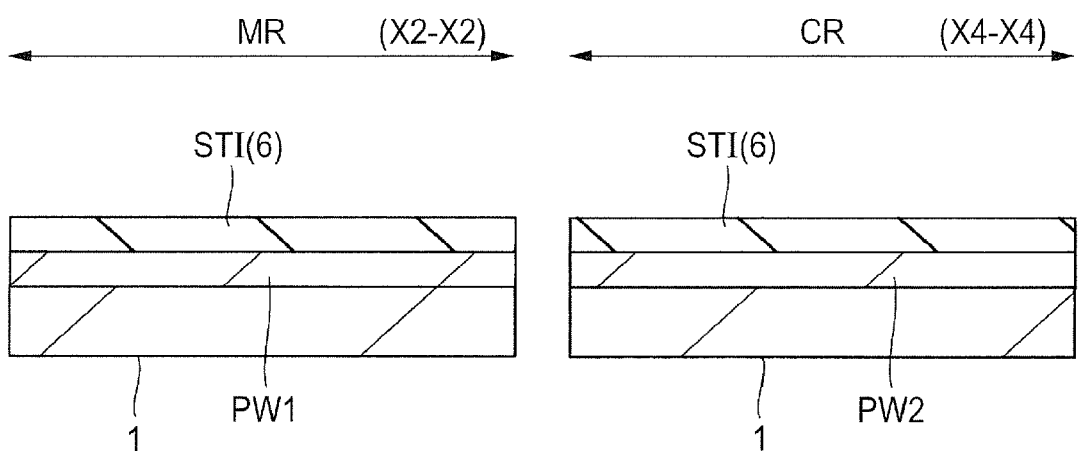
FIG. 32 is a cross-sectional view of a main part of the semiconductor substrate in the same manufacturing step as that shown in FIG. 31.
Figure 33:
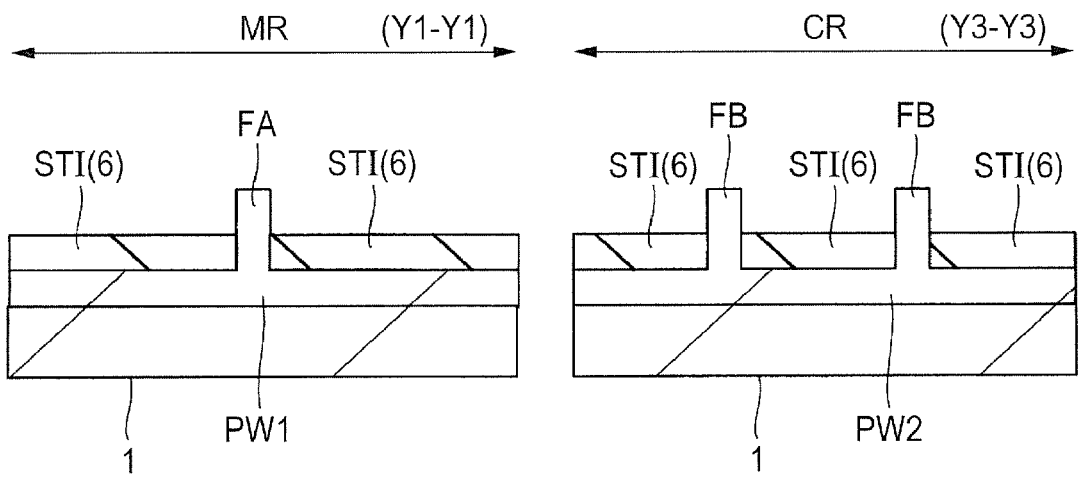
FIG. 33 is a cross-sectional view of a main part of the semiconductor substrate in the same manufacturing step as that shown in FIG. 31.
Figure 34:
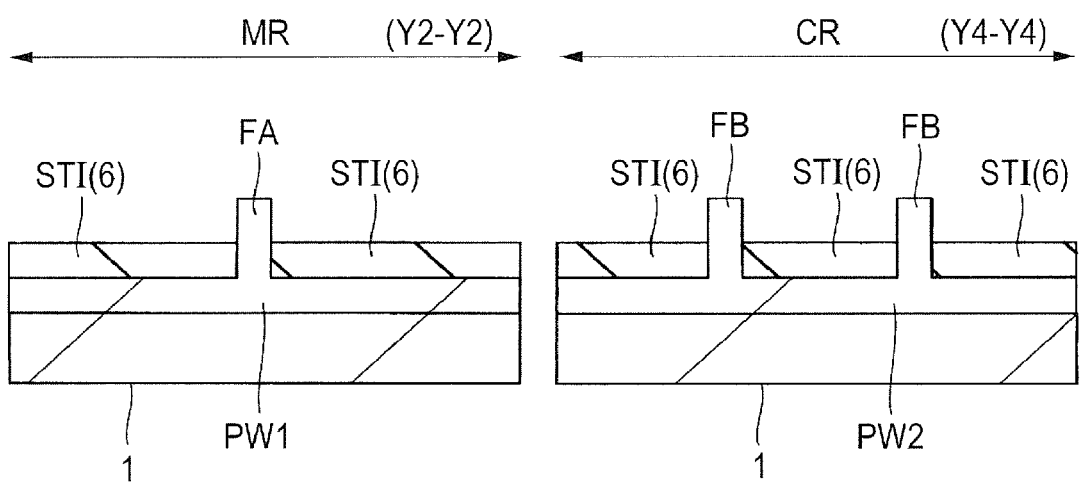
FIG. 34 is a cross-sectional view of a main part of the semiconductor substrate in the same manufacturing step as that shown in FIG. 31.
Figure 35:
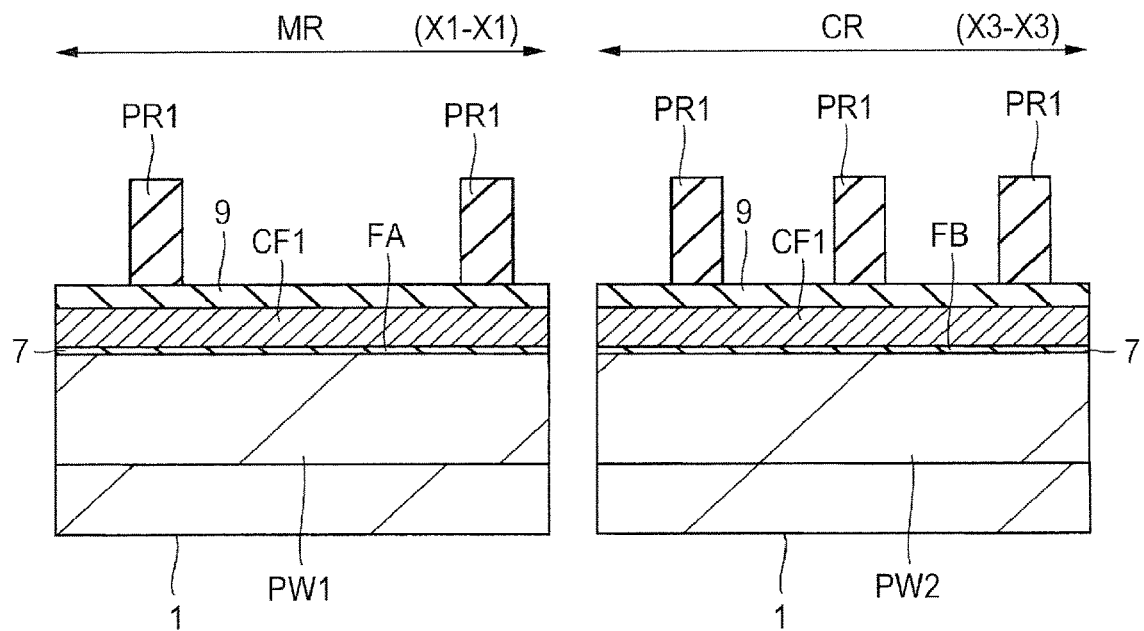
FIG. 35 is a cross-sectional view of a main part of a semiconductor substrate in a manufacturing step following the step of FIG. 31.
Figure 36:
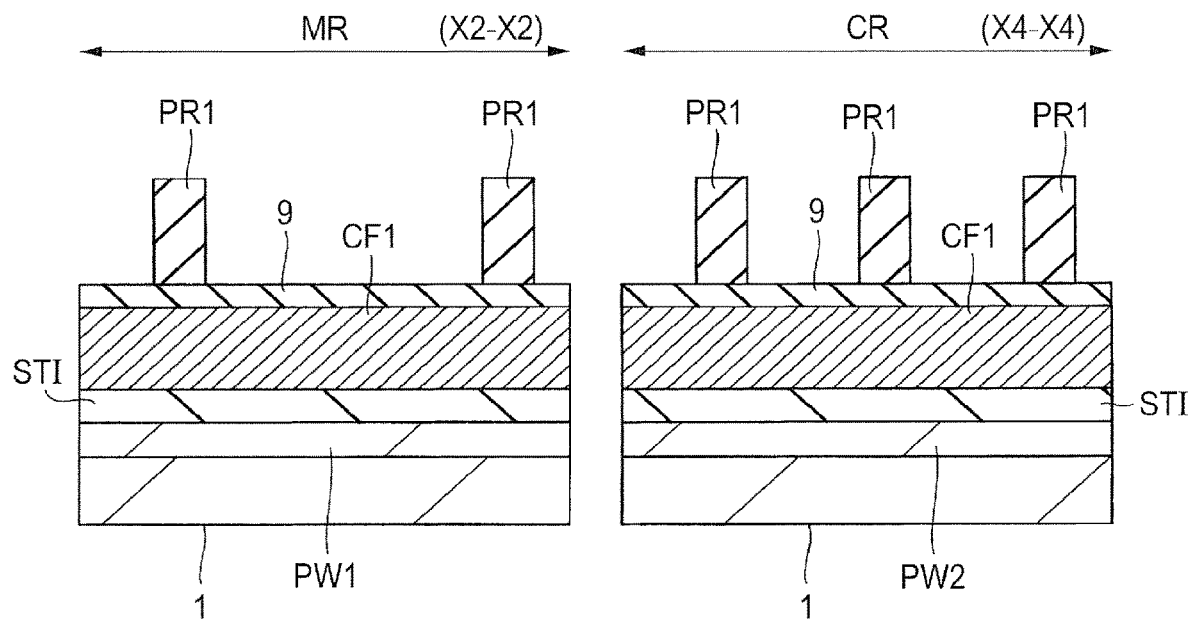
FIG. 36 is a cross-sectional view of a main part of the semiconductor substrate in the same manufacturing step as that shown in FIG. 35.
Figure 37:
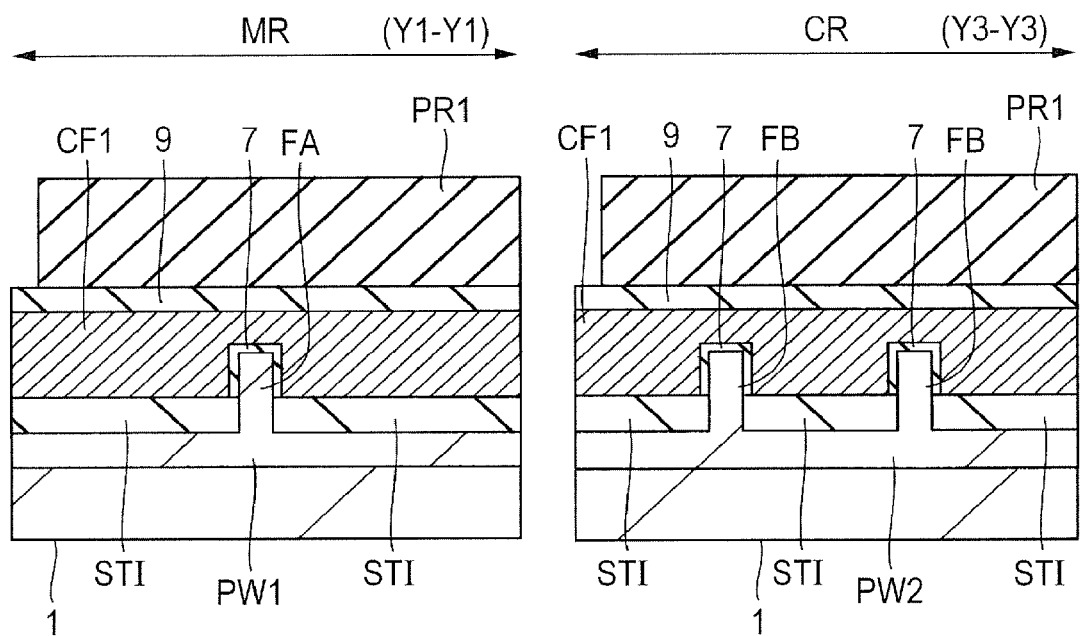
FIG. 37 is a cross-sectional view of a main part of the semiconductor substrate in the same manufacturing step as that shown in FIG. 35.
Figure 38:
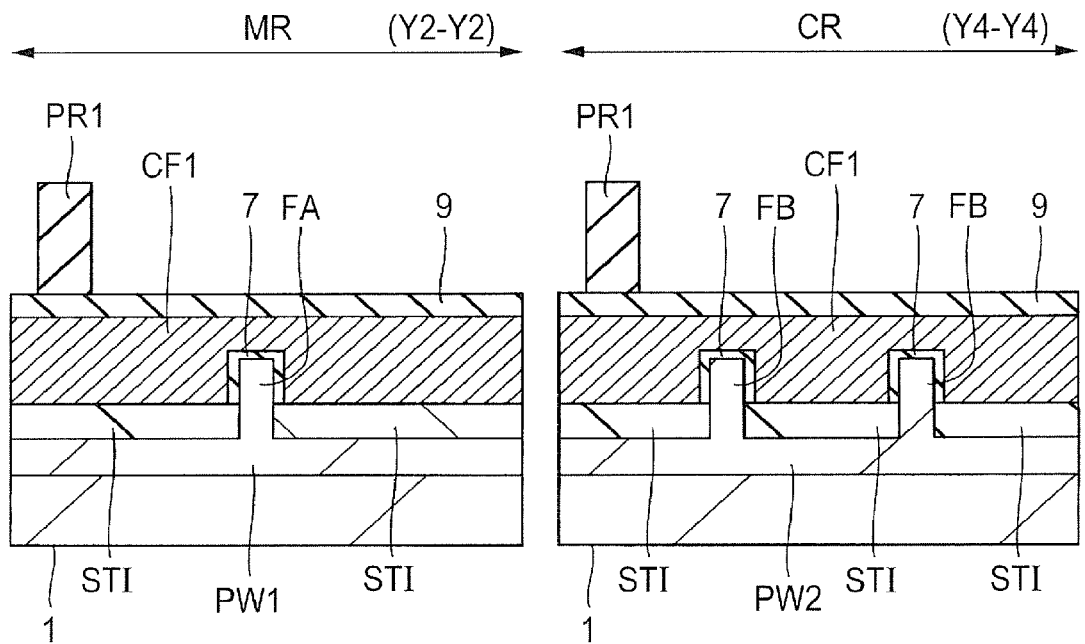
FIG. 38 is a cross-sectional view of a main part of the semiconductor substrate in the same manufacturing step as that shown in FIG. 35.
Figure 39:
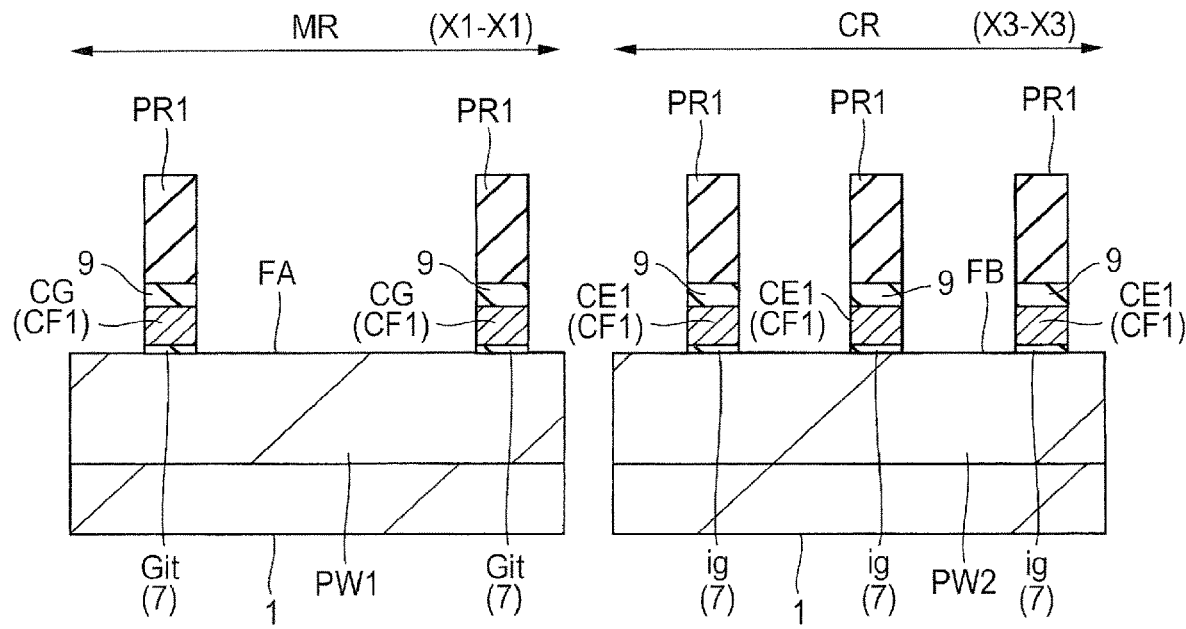
FIG. 39 is a cross-sectional view of a main part of a semiconductor substrate in a manufacturing step following the step of FIG. 35.
Figure 40:
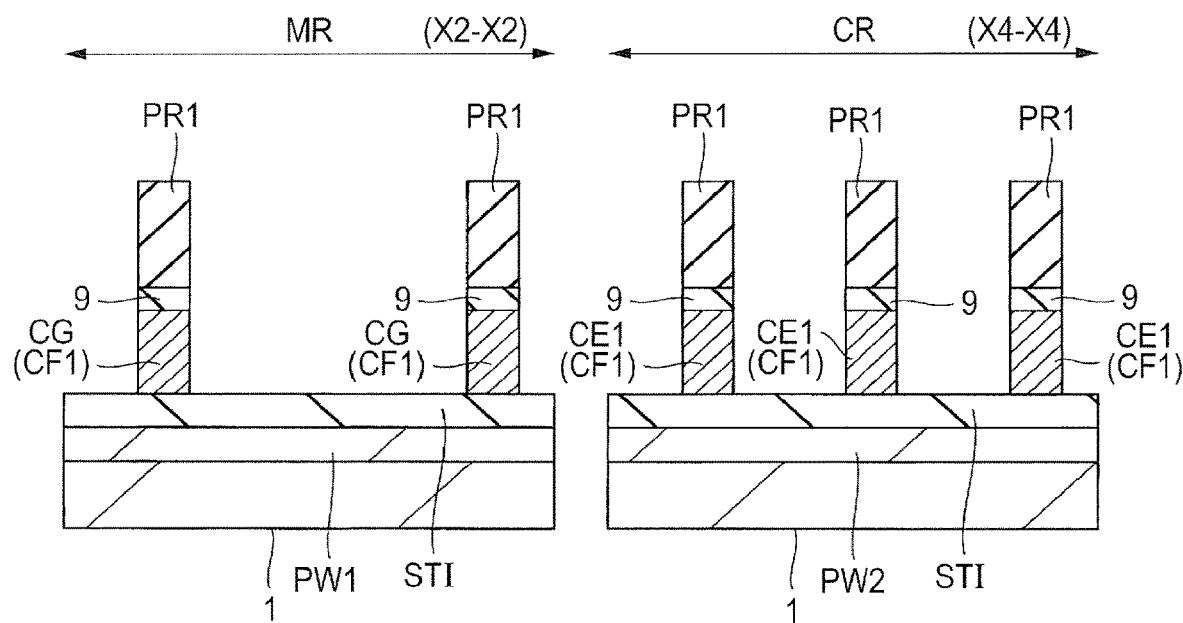
FIG. 40 is a cross-sectional view of a main part of the semiconductor substrate in the same manufacturing step as that shown in FIG. 39.
Figure 41:
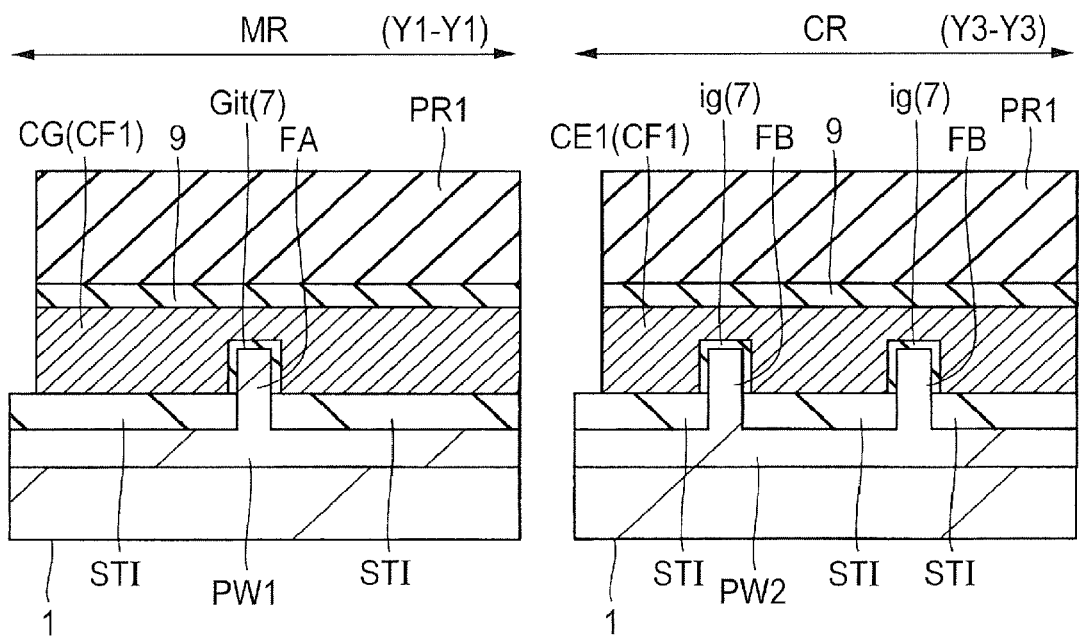
FIG. 41 is a cross-sectional view of a main part of the semiconductor substrate in the same manufacturing step as that shown in FIG. 39.
Figure 42:
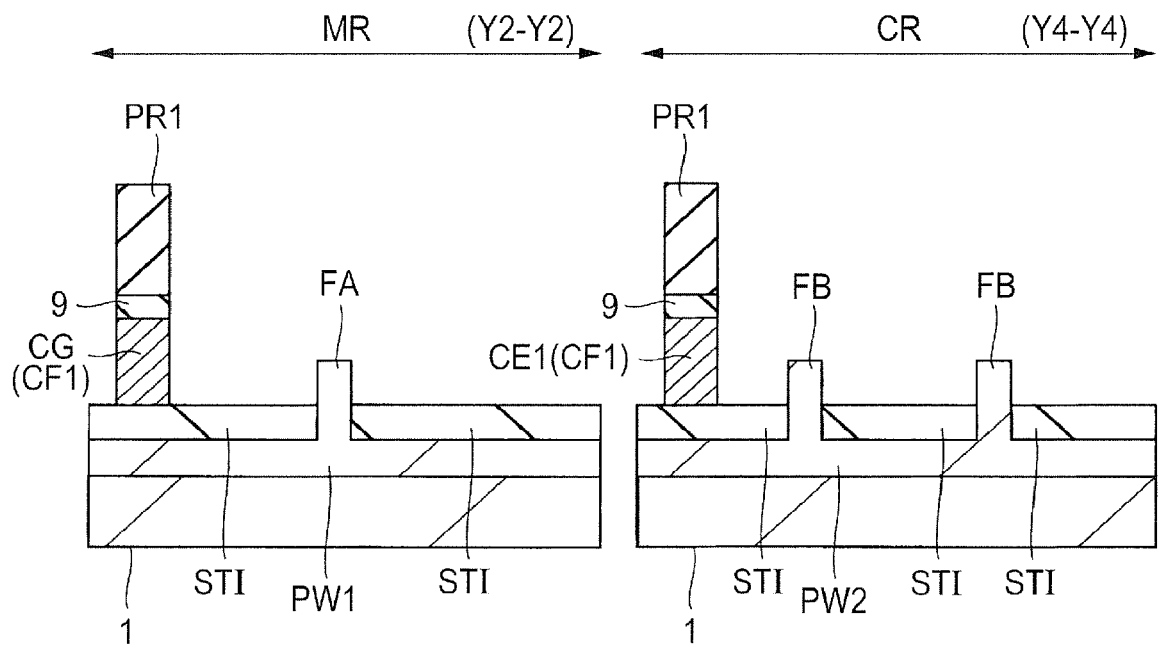
FIG. 42 is a cross-sectional view of a main part of the semiconductor substrate in the same manufacturing step as that shown in FIG. 39.

After an insulating film made of a silicon oxide film or the like is deposited on the substrate 1, a Chemical Mechanical Polishing (CMP) treatment is performed on the insulating film until the upper surface of the insulating film 3 is exposed. In this way, as shown in FIG. 30, after an insulating film 6 is formed to fill spaces between the adjacent fins FA and spaces between the adjacent fins FB on the substrate 1, the insulating films 3 and 2 are removed in this order.

Then, the insulating film 6 is subjected to an etching process, so that as shown in FIGS. 31 to 34, the main surface of the insulating film 6 is retracted (lowered) in the height direction. Consequently, parts of the surfaces (main surfaces and side surfaces intersecting them) of the fins FA and FB are exposed from the insulating film 6, and an isolation film STI (see FIGS. 32 to 34) configured of the insulating film 6 is formed in the memory cell array MR and the capacitive element region CR. Here, since the retreat amount of the insulating film 6 in the memory cell array MR is equal to that in the capacitive element region CR, the exposed heights of the fins FA and FB are also equal. To change the heights of the fins FA and FB, the etching process is preferably performed on the exposed insulating film 6 while covering either the memory cell array MR or capacitive element region CR with a mask.

Subsequently, as shown in FIGS. 35 to 38, the thermal oxidation treatment is applied to the substrate 1 to form an insulating film 7 on the surfaces (main surfaces and side surfaces) of the fins FA and FB exposed. The insulating film 7 is made of a silicon oxide film having a thickness of approximately 2 nm.

Then, a conductive film (first conductive film) CF1 having a thickness of a height of the fin FA, FB or more is deposited by the CVD method or the like over the main surface of the substrate 1 to cover the isolation portion STI and the insulating film 7. Thereafter, the conductor film CF1 is subjected to a CMP treatment to form a conductor film CF1 with a flat main surface. The obtained conductor film CF1 is formed of, for example, a low-resistance polycrystalline silicon film. Note that the CMP process is performed on the conductor film CF1 so as to leave the conductor film CF1 on the main surfaces of the fins FA and FB.

Subsequently, an insulating film 9 is deposited on the main surface of the conductor film CF1 by the CVD method or the like. The insulating film 9 is formed of, for example, a silicon nitride film. Then, a resist film PR1 is selectively formed on the insulating film 9. In the memory cell array MR, the resist film PR1 has a pattern that covers formation regions of the control gate electrodes CG while exposing other regions therefrom. In the capacitive element region CR, the resist film PR1 has a pattern that covers one CE1 of the capacitor electrodes CE1 and CE2.

Thereafter, as shown in FIGS. 39 to 42, the insulating film 9 and the conductor film CF1 are subjected to a dry etching process by using the resist film PR1 as an etching mask to remove the insulating film 9 and the conductor film CF1 which are exposed from the resist film PR1. In this way, the control gate electrodes CG (CF1) and the gate insulating films Git (7) are formed in the memory cell array MR, while the capacitor electrodes CE1(CF1) and the insulating films ig(7) are formed in the capacitive element region CR. The resist film PR1 is removed after patterning the insulating film 9 or after patterning the insulating film 9 and the conductor film CF1.

Then, as shown in FIGS. 43 to 46, the insulating film 10 is formed on the substrate 1. First, a silicon oxide film with a thickness of approximately 4 to 5 nm is formed on the surfaces (main surfaces and side surfaces) of the fins FA and FB and the like by applying the thermal oxidation treatment to the substrate 1. Then, a silicon nitride film with a thickness of approximately 7 to 10 nm is deposited on the silicon oxide film by the CVD method or the like. Subsequently, for example, a silicon oxide film with a thickness of approximately 5 nm is deposited again thereon by the CVD method or the like. In this way, an insulating film 10 including three insulating films is formed. The thickness of the insulating film as the first layer in the insulating film 10 is larger than that of each of the gate insulating film Git and the insulating film ig. The insulating film as the third layer in the insulating film 10 can also be formed, for example, by a silicon oxynitride film with a thickness of approximately 9 nm, instead of the silicon oxide film. In the insulating film 10, the insulating film as the second layer may be formed of HfSiO, and the insulating film as the third layer may be formed of AlO.

Then, as shown in FIGS. 47 to 50, for example, a conductive film (second conductive film) CF2 made of a low-resistance polycrystalline silicon film is deposited over the substrate 1 (on the insulating film 10) by the CVD method or the like. The height of the conductive film CF2 is equal to or higher than each of the height of a laminated structure of the control gate electrode CG and the insulating film 9, the height of a laminated structure of the capacitor electrode CE1 and the insulating film 9, and the height of the fin FA or FB. The thickness of the conductive film CF2 is, for example, approximately 200 nm.

Subsequently, as shown in FIGS. 51 to 54, the conductor film CF2 is subjected to the CMP treatment to expose parts of the insulating film 10 on the control gate electrodes CG and the capacitor electrodes CE1, whereby the conductive film CF2 is formed between the adjacent control gate electrodes CG and between the adjacent capacitor electrodes CE1. After the CMP treatment, the conductive film CF2 is left over each of the fins FA and FB.

Then, the conductive film CF2 is subjected to the etching process, thereby lowering the height of the upper surface of the conductive film CF2. At this time, the insulting film 9 located on each of the control gate electrodes CG and the capacitor electrode CE1 serves as an etching stopper, so that the insulating film 9 is left on each of the control gate electrodes CG and the capacitor electrodes CE1 after the etching process. The height of the upper surface of the conductive film CF2 obtained after the etching process is, for example, substantially the same as the height of the upper surface of each of the control gate electrode CG and the capacitor electrode CE1.

Then, for example, an insulting film made of a silicon nitride film is deposited on the substrate 1 by the CVD method or the like. Subsequently, the formed insulating film is subjected to the anisotropic dry etching process, so that the mask films 13 are formed on the side surfaces of the insulating film 9 located on each of the control gate electrodes CG and the capacitor electrodes CE1.

Figure 55:
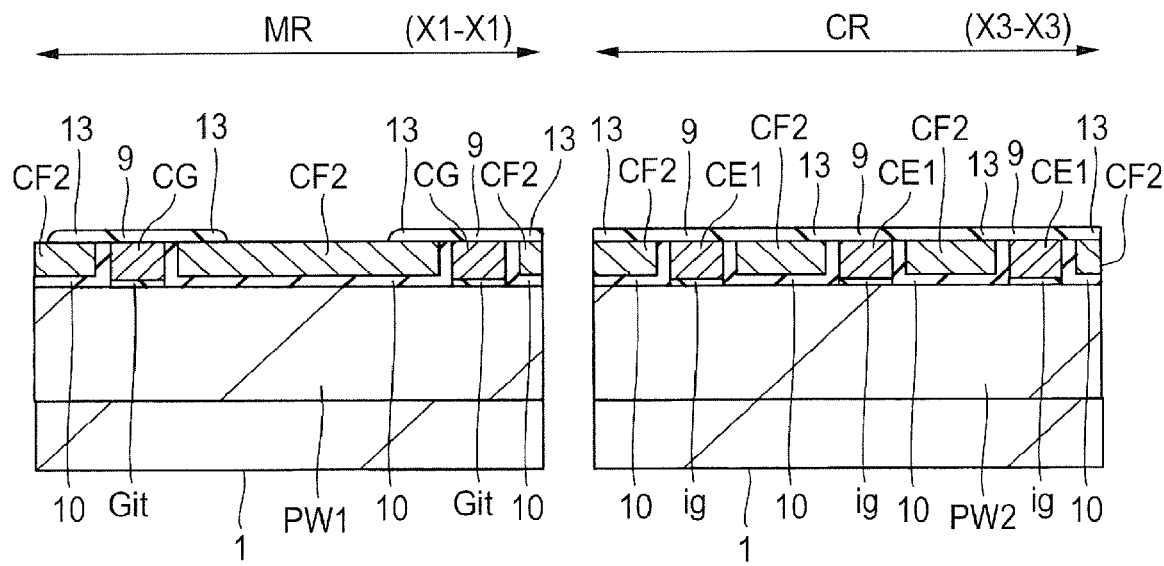
FIG. 55 is a cross-sectional view of a main part of a semiconductor substrate in a manufacturing step following the step of FIG. 51.
Figure 56:
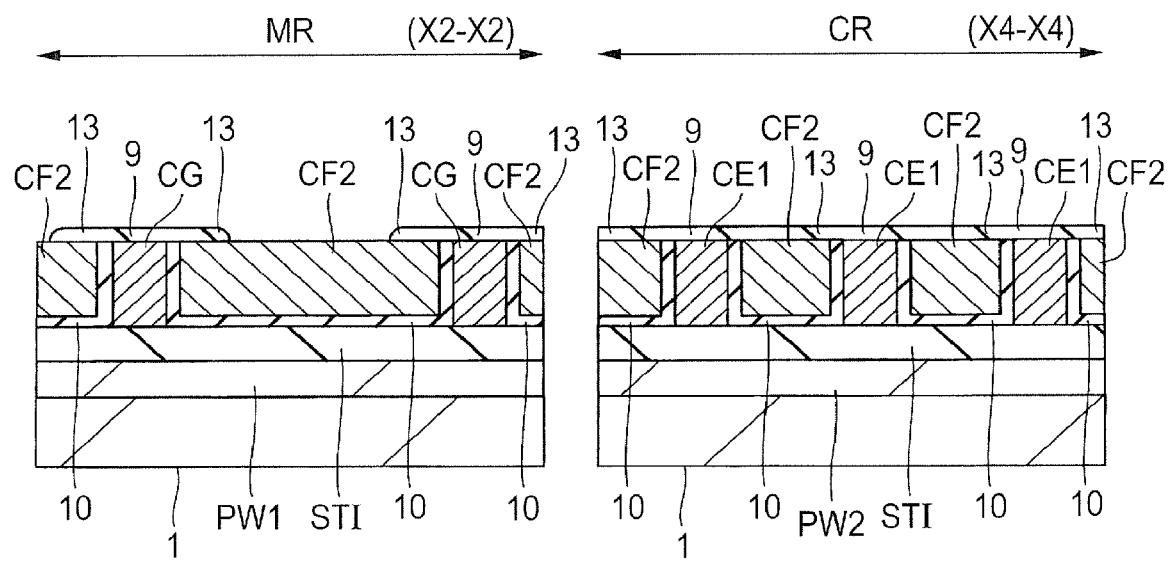
FIG. 56 is a cross-sectional view of a main part of the semiconductor substrate in the same manufacturing step as that shown in FIG. 55.
Figure 57:
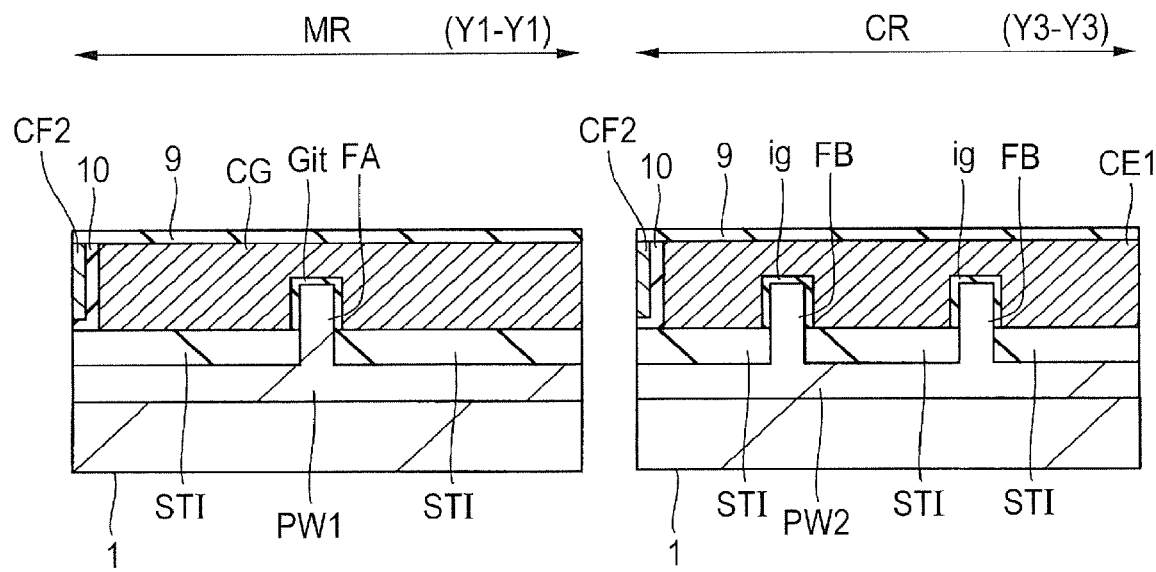
FIG. 57 is a cross-sectional view of a main part of the semiconductor substrate in the same manufacturing step as that shown in FIG. 55.
Figure 58:
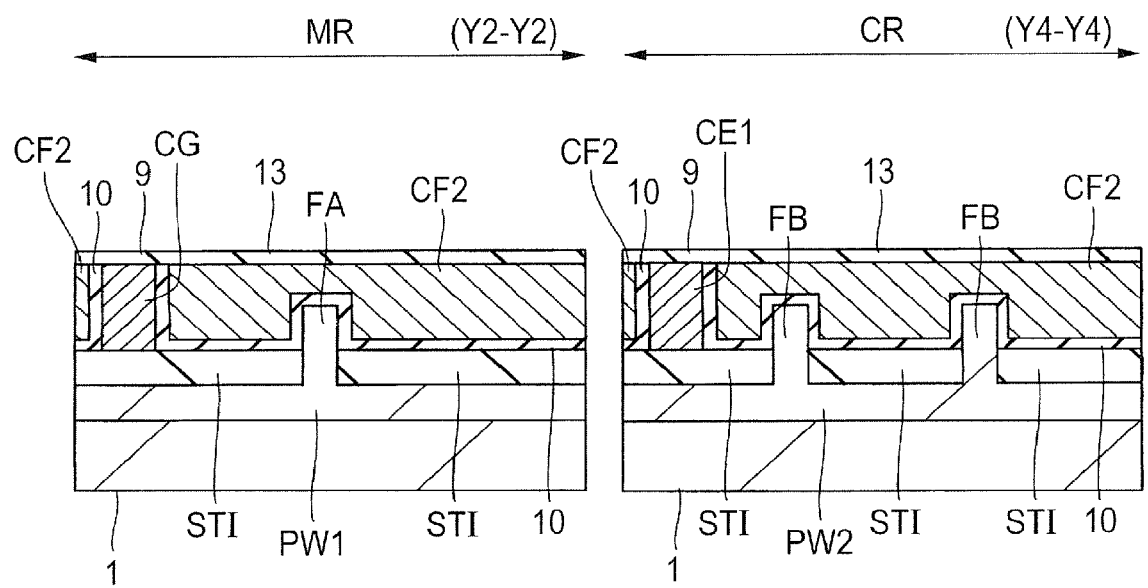
FIG. 58 is a cross-sectional view of a main part of the semiconductor substrate in the same manufacturing step as that shown in FIG. 55.
Figure 59:
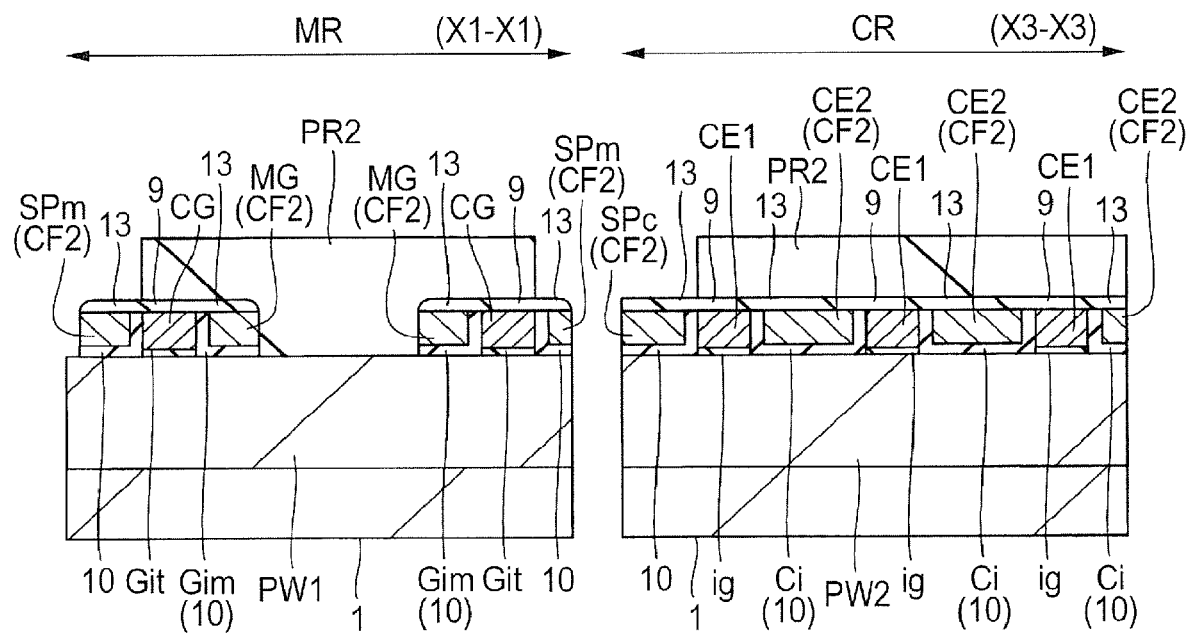
FIG. 59 is a cross-sectional view of a main part of a semiconductor substrate in a manufacturing step following the step of FIG. 55.
Figure 60:
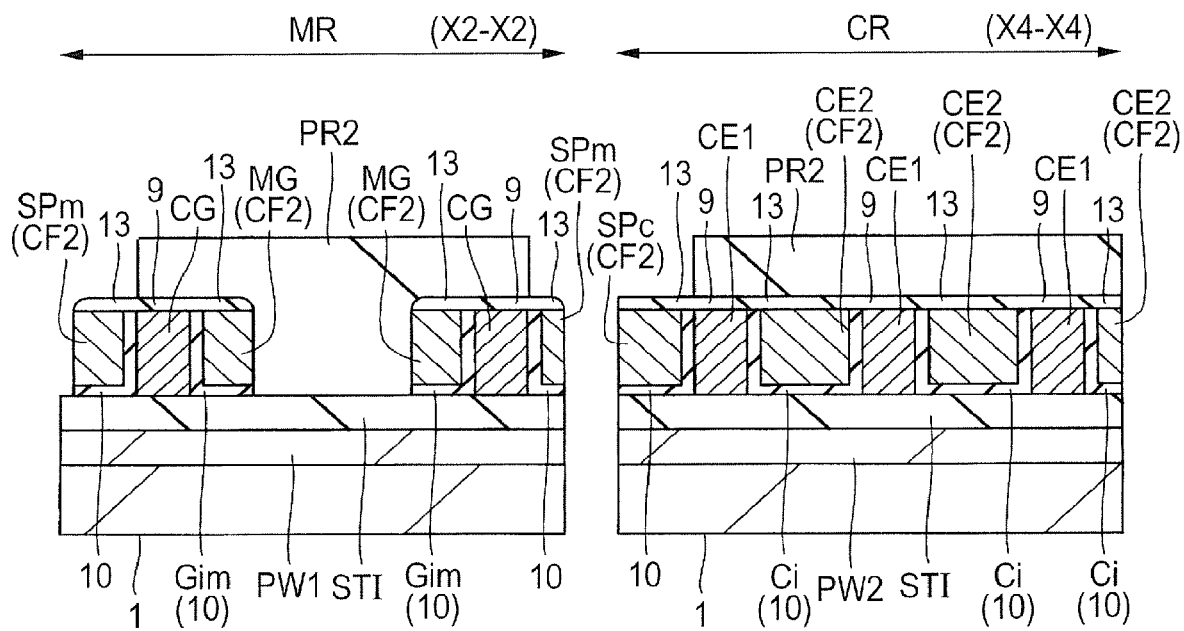
FIG. 60 is a cross-sectional view of a main part of the semiconductor substrate in the same manufacturing step as that shown in FIG. 59.
Figure 61:
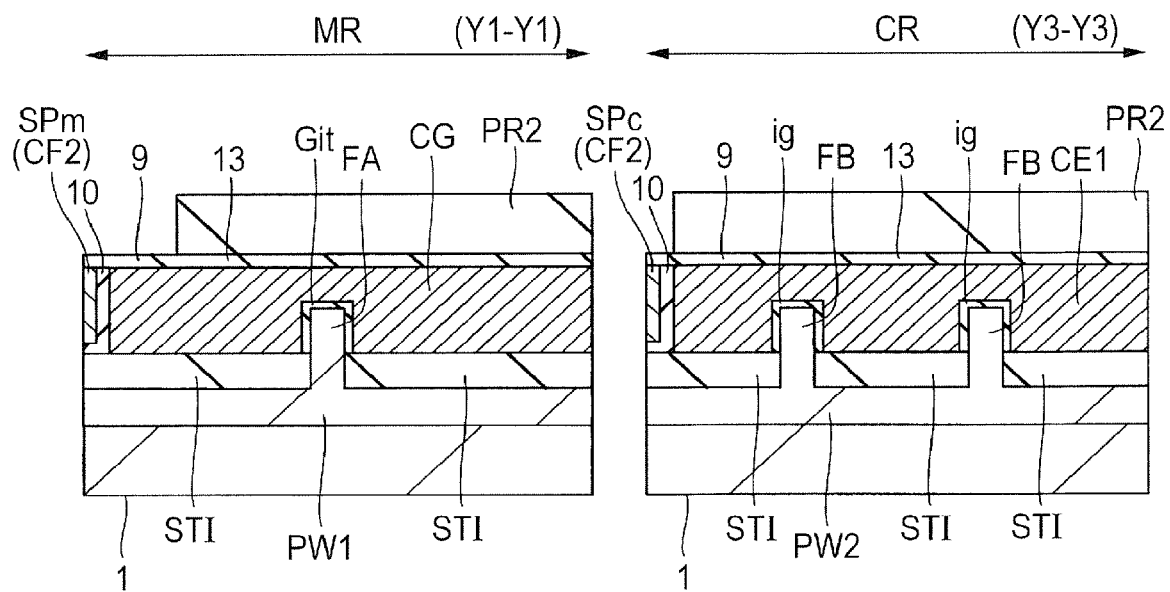
FIG. 61 is a cross-sectional view of a main part of the semiconductor substrate in the same manufacturing step as that shown in FIG. 59.
Figure 62:
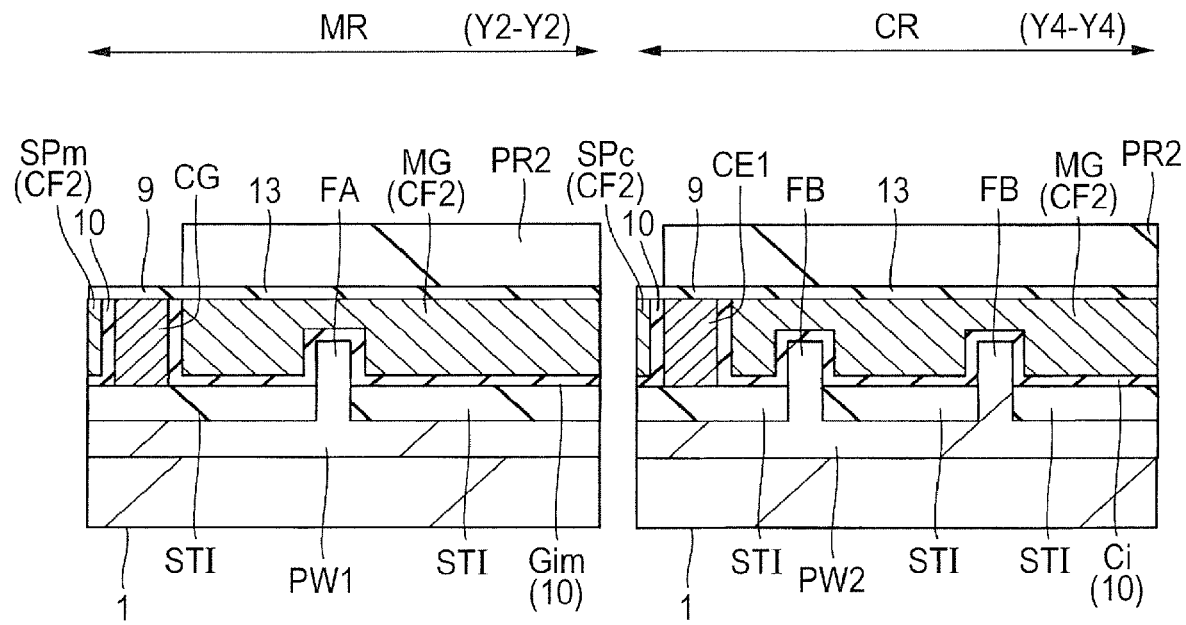
FIG. 62 is a cross-sectional view of a main part of the semiconductor substrate in the same manufacturing step as that shown in FIG. 59.

Here, on the left side (memory cell array MR) of FIGS. 55 and 56, the distance between the adjacent control gate electrodes CG is so wide that a region not covered with a mask film 13 is formed between the adjacent control gate electrodes CG. In contrast, on the right side (capacitive element region CR) of FIGS. 55 and 56, the distance between the adjacent capacitor electrodes CE1 is so narrow that a space between the adjacent capacitor electrodes CE1 is filled with the mask film 13.

Subsequently, the conductor film CF2 exposed from the insulating film 9 and the mask film 13 is removed by the etching process. Consequently, as shown in FIGS. 59 to 62, in the memory cell array MR, the memory gate electrodes MG and spacers SPm are formed of the conductive film CF2 on the sidewalls of the control gate electrodes CG via the insulating film 10. Meanwhile, in the capacitive element region CR, the capacitor electrodes CE2 and spacers SPc are formed of the conductive film CF2 on the sidewalls of the capacitor electrodes CE1 via the insulating film 10. These spacers SPm and SPc have the same structure as that of the memory gate electrode MG and the capacitor electrode CE2, but are given names different from those of the memory gate electrode MG and the capacitor electrode CE2 because they are removed in a step to be mentioned later. The insulating film 9 is left on the upper surface of each of the control gate electrodes CG and the capacitor electrodes CE1.

Then, a resist film PR2 is formed over the substrate 1 by lithography. The resist film PR2 is formed to expose unnecessary parts, such as the spacers SPm and SPc, and to cover the other parts. Subsequently, using the resist film PR2 as an etching mask, for example, wet etching is performed to etch and remove the unnecessary parts, such as the spacers SPm and SPc, exposed from the resist film PR2.

Thereafter, the insulating film 10 in the region exposed from the memory gate electrodes MG and the capacitor electrodes CE2 is removed by, for example, a wet etching process. Thus, in the memory cell array MR, the gate insulating film Gim made of the insulating film 10 is formed between the memory gate electrode MG and the fin FA and between the memory gate electrode MG and the control gate electrode CG. In the capacitive element region CR, the capacitive insulating film Ci made of the insulating film 10 is formed between the capacitive electrode CE2 and the substrate 1 (fin FB) and between the capacitive electrode CE2 and the capacitive electrode CE1.

Then, after a resist film (not shown) covering the capacitive element region CR is formed, for example, n-type impurities, such as arsenic (As) or phosphorus (P), are introduced into the fins FA by an ion implantation method or the like. After removing the resist film in the capacitive element region CR, the substrate 1 is subjected to a heat treatment to form n$^-$-type semiconductor regions MD1 and MS1 in the fin FA as shown in FIG. 4. The n$^-$-type semiconductor regions MD1 and MS1 are formed in self-alignment with the control gate electrode CG and the memory gate electrode MG.

Next, an insulating film configured of, for example, a silicon oxide film, a silicon nitride film, or a laminated film thereof, is deposited on the substrate 1, and then the insulating film is subjected to anisotropic dry etching. Consequently, as shown in FIGS. 4 to 7, in the memory cell array MR, the sidewall spacers SW are formed on the sidewalls of the control gate electrode CG and the memory gate electrode MG. At the same time, as shown in FIGS. 10 to 13, in the capacitive element region CR, the sidewall spacers SW are formed on the sidewalls of the capacitor electrodes CE1.

Next, n-type impurities, such as arsenic (As) or phosphorus (P), are introduced into the fins FA by ion implantation or the like using the control gate electrode CG, the memory gate electrode MG, and the sidewall spacers SW as a mask, thereby forming n⁺-type semiconductor regions MD2 and MS2 as shown in FIG. 4. In this way, the source region MS and the drain region MD in each memory cell MC are formed. Through a subsequent wiring formation step, the semiconductor device is manufactured.

Second Embodiment

Figure 63:
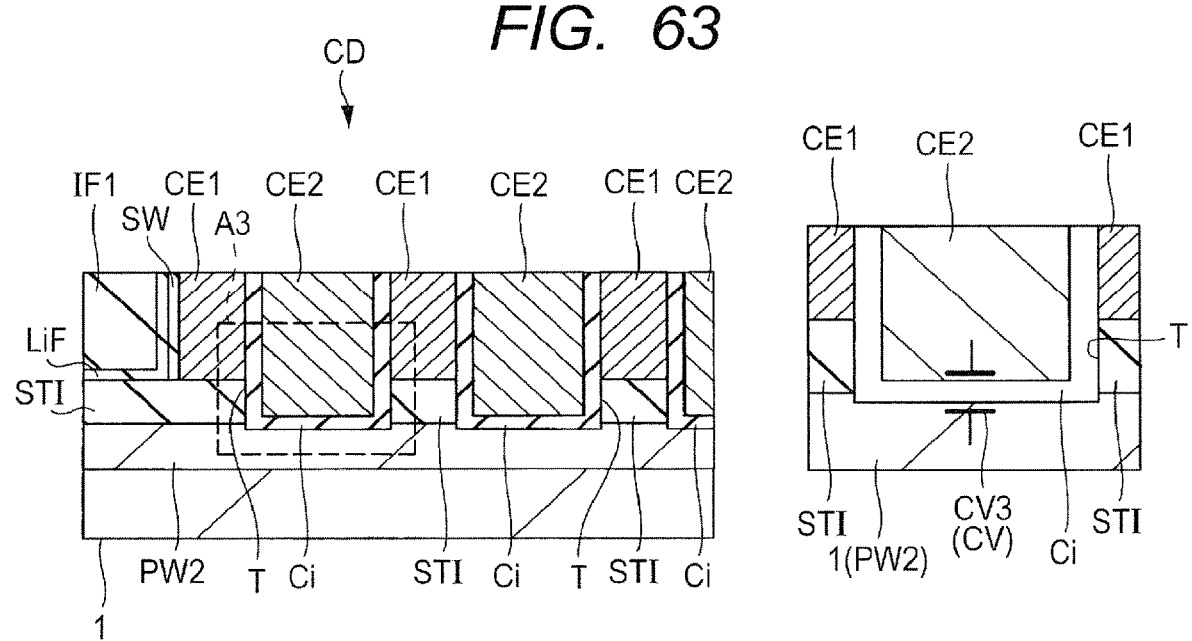
FIG. 63 illustrates, on the left, a cross-sectional view of the semiconductor device according to a second embodiment, taken along the line X4-X4 of FIG. 8, and on the right, an enlarged cross-sectional view of a region A3 shown on the left of FIG. 63.
Figure 64:
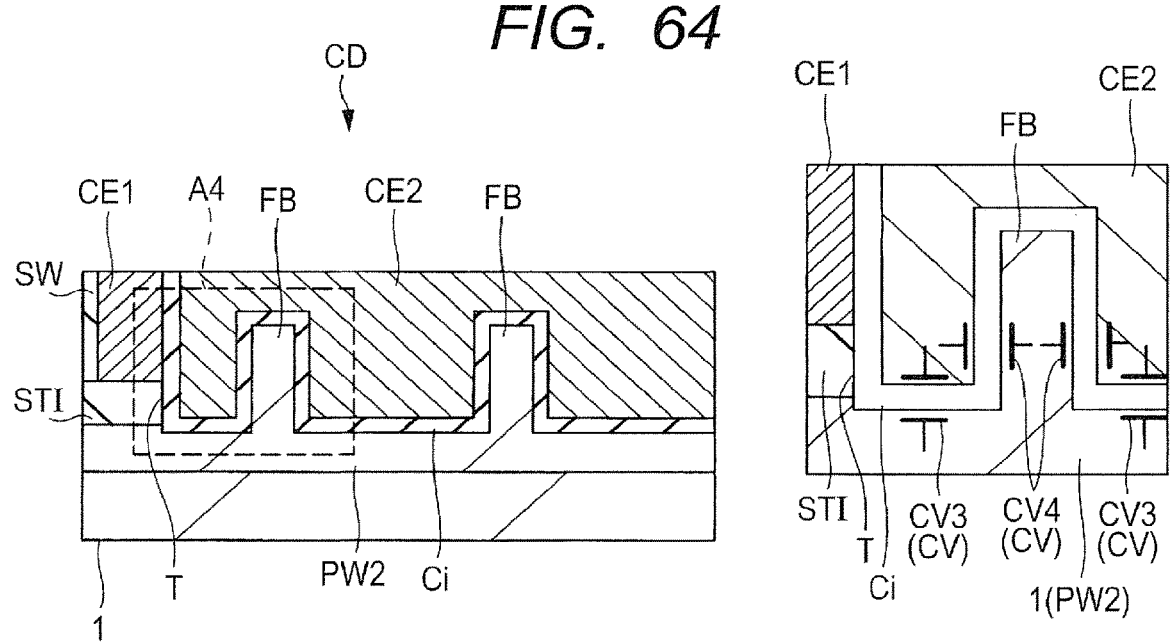
FIG. 64 illustrates, on the left, a cross-sectional view of a semiconductor device according to a second embodiment taken along the line Y4-Y4 of FIG. 8, and on the right, an enlarged cross-sectional view of a region A4 shown on the left of FIG. 64.
Figure 65:
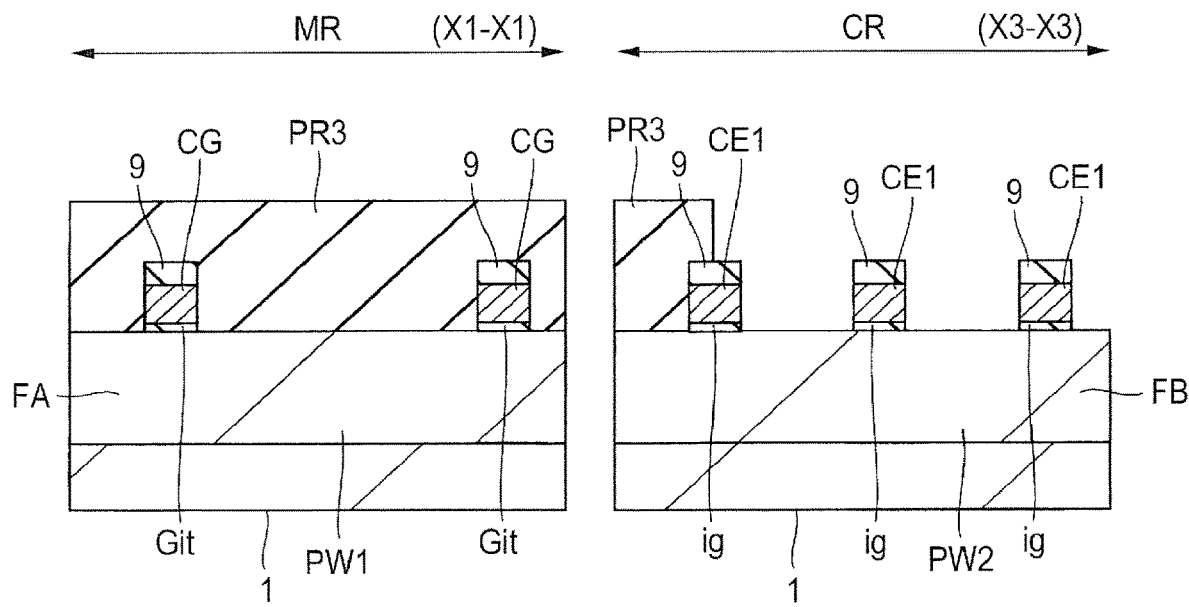
FIG. 65 is a cross-sectional view of a main part of a semiconductor substrate in a manufacturing step of the semiconductor device shown in FIGS. 63 and 64.
Figure 66:
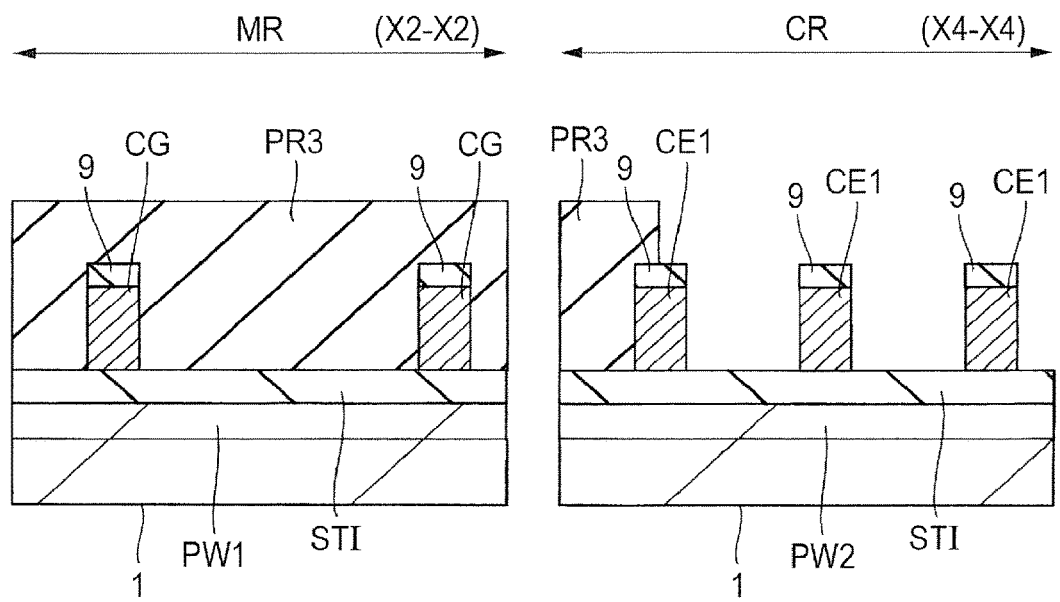
FIG. 66 is a cross-sectional view of a main part of the semiconductor substrate in the same manufacturing step as that in FIG. 65.
Figure 67:
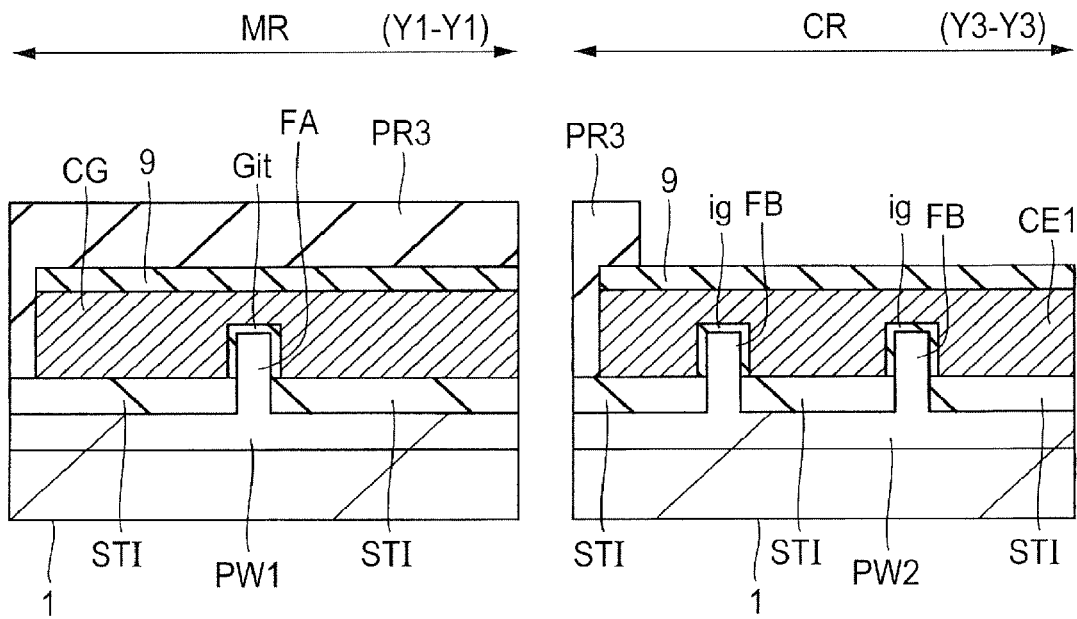
FIG. 67 is a cross-sectional view of a main part of the semiconductor substrate in the same manufacturing step as that in FIG. 65.
Figure 68:
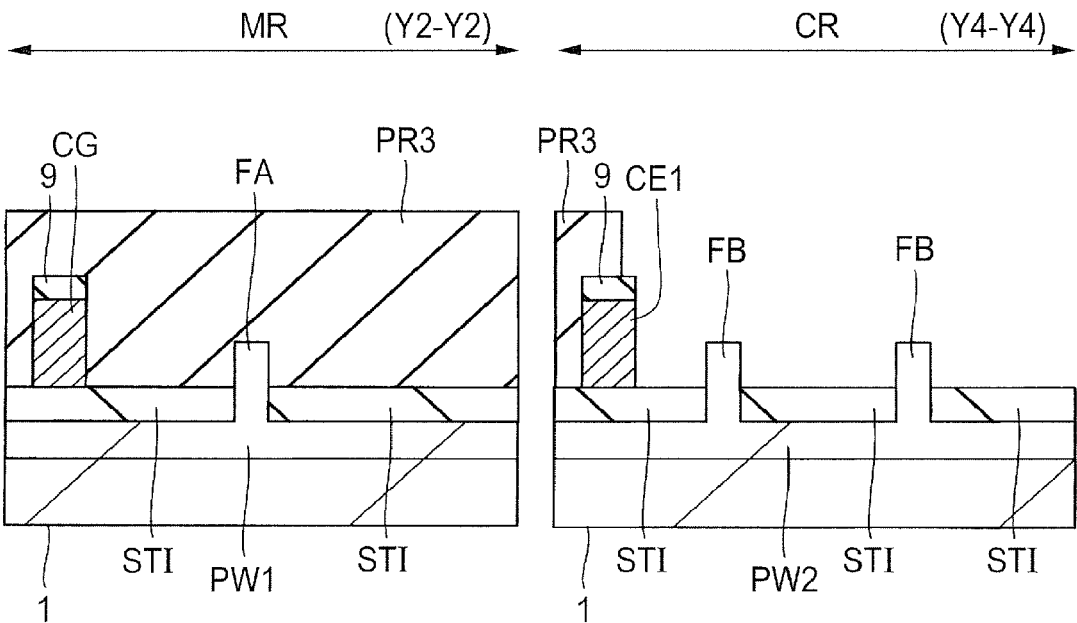
FIG. 68 is a cross-sectional view of a main part of the semiconductor substrate in the same manufacturing step as that in FIG. 65.

An example of a semiconductor device structure according to a second embodiment will be described with reference to FIGS. 63 and 64. FIG. 63 illustrates, on the left, a cross-sectional view of the semiconductor device of the second embodiment, taken along the line X4-X4 of FIG. 8, and on the right, an enlarged cross-sectional view of a region A3 shown on the left of FIG. 63; and FIG. 64 illustrates, on the left, a cross-sectional view of the semiconductor device of the second embodiment taken along the line Y4-Y4 of FIG. 8, and on the right, an enlarged cross-sectional view of a region A4 shown on the left of FIG. 64. Regarding the semiconductor device of the second embodiment, the cross-sectional view taken along the line X3-X3 of FIG. 8 is the same as FIG. 10, and the cross-sectional view taken along the line Y3-Y3 of FIG. 8 is the same as FIG. 12. The structure of the memory cell array MR in the second embodiment is the same as that in the first embodiment mentioned above. The cross-sectional views on the right of FIGS. 63 and 64 omit hatching for the capacitive insulating film Ci for better understanding of the figures.

In the second embodiment, as shown on the left in FIGS. 63 and 64, parts of the isolation portion STI located directly under the capacitor electrodes CE2 (between the capacitor electrode CE2 and the substrate 1) are removed between the adjacent fins FB and between the long side of the outermost fin FB and the outer peripheral position of the capacitive element CD (hereinafter referred to as a distance between the adjacent fins FB and the like). That is, the isolation portion STI directly under the capacitor electrodes CE2, such as that located between the adjacent fins FB and the like, is partially removed to form trenches T. The main surface of the substrate 1 is exposed from the bottom surface of each trench T. Between the adjacent fins FB and the like, a lower part of each capacitor electrode CE2 (on the side of the substrate 1) is embedded in the trench T. That is, the lower part of the capacitor electrode CE2 passes through the isolation portion STI between the adjacent fins FB and the like to reach the vicinity of the main surface of the substrate 1. The capacitor electrode CE2 between the adjacent fins FB and the like and the substrate 1 (bottom surface and side surfaces of the trench T) are insulated from each other by the capacitive insulating film Ci provided therebetween.

From another perspective, in the semiconductor device of the second embodiment, when comparing the capacitive element region CR (FIGS. 63 and 64) with the memory cell array MR (FIGS. 5 and 7), the height position of the bottom surface of the capacitor electrode CE2 between the adjacent fins FB and the like is lower than the height position of the bottom surface of the memory gate electrode MG between the adjacent fins FA and the like. Furthermore, when comparing the capacitive element region CR with the memory cell array MR, the length (length in the protruding direction of the fin FB: height) of the capacitor electrode CE2 between the adjacent fins FB and the like is longer (higher) than the length (length in the protruding direction of the fin FA: height) of the memory gate electrode MG between the adjacent fins FA and the like. Thus, a facing area between the fin FB and the capacitor electrode CE2 located between the adjacent fins FB and the like can be made larger than a facing area between the fin FA and the memory gate electrode MG located between the adjacent fins FA and the like.

The bottom surface of the capacitor electrode CE2 between the adjacent fins FB and the like refers to a surface of the capacitor electrode CE2 facing the substrate 1 around the fin FB. The bottom surface of the memory gate electrode MG between the adjacent fins FA and the like refers to a surface of the memory gate electrode MG facing the substrate 1 around the fin FB.

In other words, in the second embodiment, as shown on the right of FIGS. 63 and 64, a capacitance CV3 (CV), in addition to the capacitances CV and CL shown in FIG. 14, is formed between the bottom surface of the capacitor electrode CE2 and the main surface of the substrate 1 (main surface of the substrate 1 around the fin FB and the button surface of the trench T). In addition, as shown on the right of FIG. 64, a capacitance CV4 (CV) is formed between the side surface of a lower portion (on the side of the substrate 1) of the capacitor electrode CE2 and a side surface of the leg portion of the fin FB (portion where the isolation portion STI is removed, i.e., a part inside the trench T). Therefore, the capacitance of the capacitive element CD per unit area can be increased, compared to in the first embodiment.

Next, an example of a method for manufacturing a semiconductor device in the second embodiment will be described below with reference to FIGS. 65 to 72. FIGS. 65 to 72 are cross-sectional views of main parts of the substrate 1 in manufacturing steps of the semiconductor device in the second embodiment.

First, the gate electrodes CG and the capacitor electrodes CE1 are formed through the steps described with reference to FIGS. 27 to 42 in the first embodiment, followed by removal of the resist film PR1 for formation of the gate electrode CG1 and the capacitor electrode CE1.

Subsequently, as shown in FIGS. 65 to 68, a resist film PR3 is formed by lithography to cover the whole region of the memory cell array MR and a part of the capacitive element region CR while exposing other parts.

Figure 69:
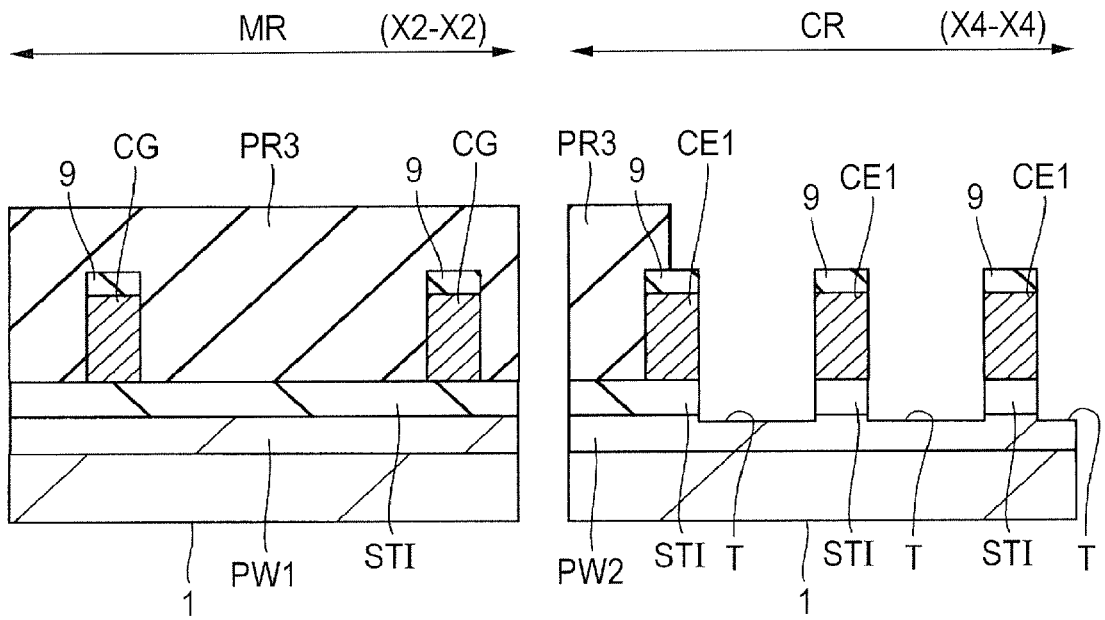
FIG. 69 is a cross-sectional view of a main part of a semiconductor substrate in a manufacturing step, following the step shown in FIG. 65.
Figure 70:
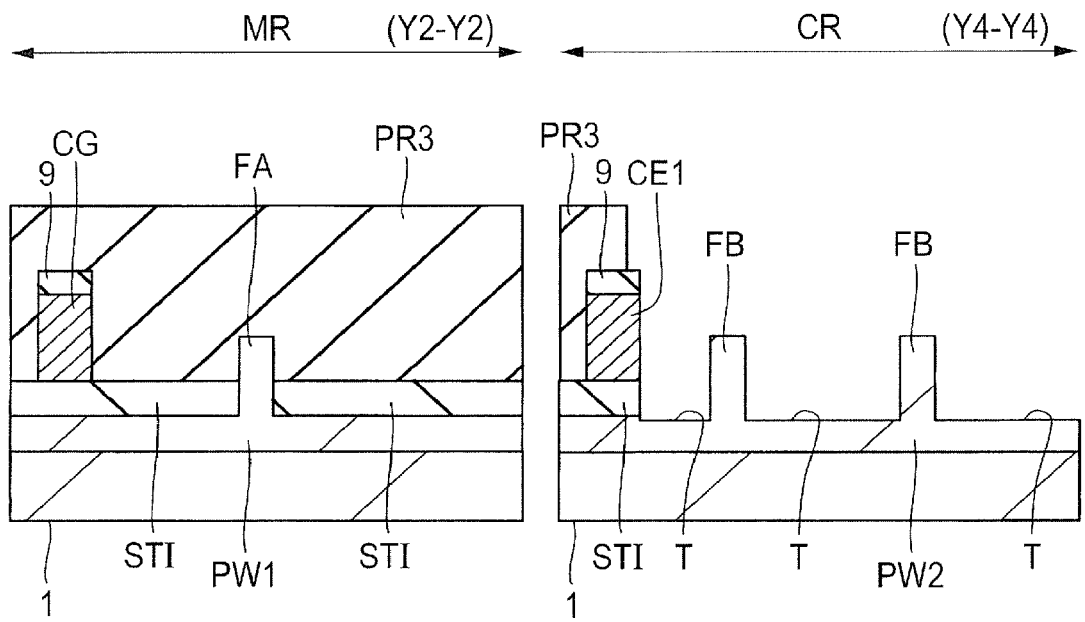
FIG. 70 is a cross-sectional view of a main part of the semiconductor substrate in the same manufacturing step as that in FIG. 69.

Then, as shown in FIGS. 69 and 70, the isolation portion STI exposed from the resist film PR3 is selectively removed by etching using the resist film PR3 as an etching mask. Thus, the trenches T are formed between the adjacent fins FB and the like in the capacitive element region CR. A part of the main surface of the substrate 1 located around each fin FB is exposed at the bottom surface of the trench T. At the stage of FIGS. 69 and 70, the cross-sectional view taken along the line X1-X1 of FIG. 2 and the cross-sectional view taken along the line X3-X3 of FIG. 8 are the same as FIG. 65, and the cross-sectional view taken along the line Y1-Y1 of FIG. 2 and the cross-sectional view taken along the line Y3-Y3 of FIG. 8 are the same as FIG. 67. Because of this, these cross-sectional views are omitted.

Figure 43:
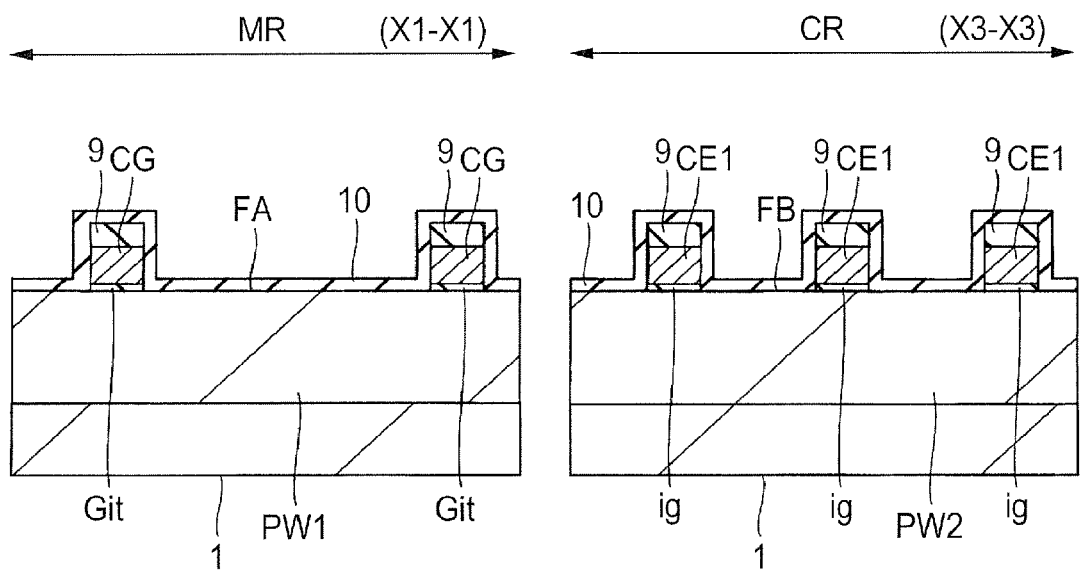
FIG. 43 is a cross-sectional view of a main part of a semiconductor substrate in a manufacturing step following the step of FIG. 39.
Figure 44:
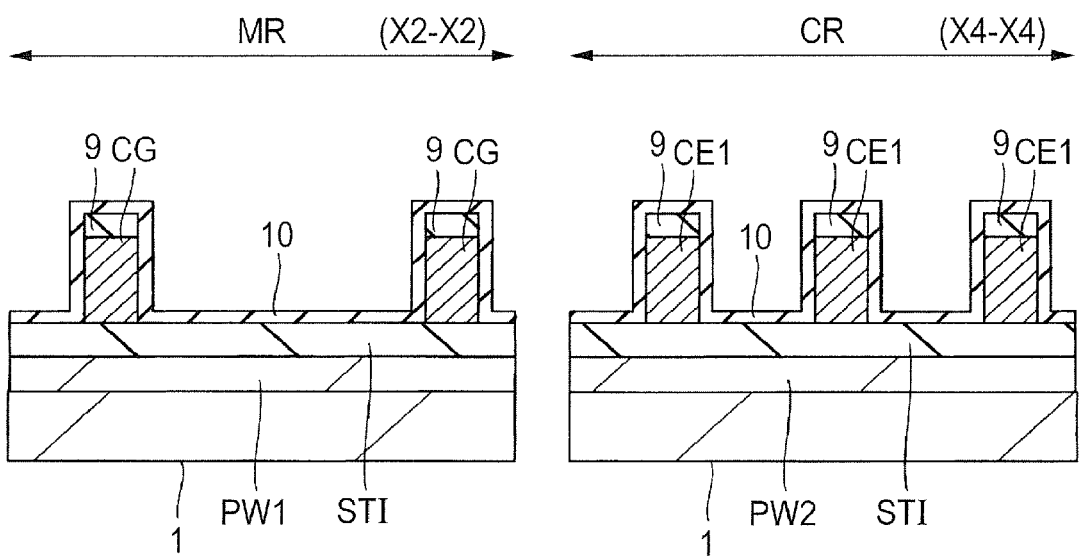
FIG. 44 is a cross-sectional view of a main part of the semiconductor substrate in the same manufacturing step as that shown in FIG. 43.
Figure 45:
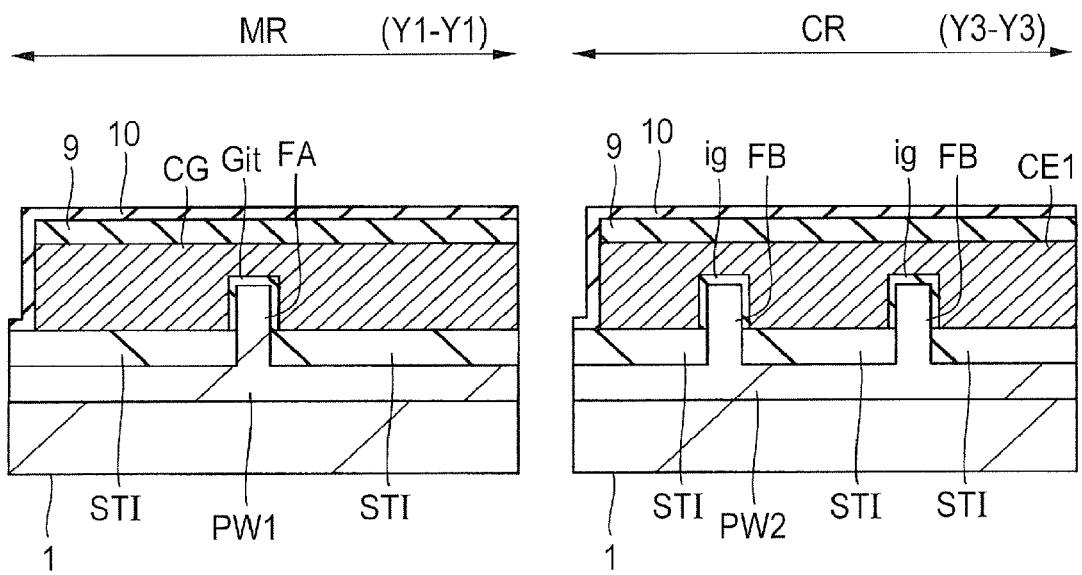
FIG. 45 is a cross-sectional view of a main part of the semiconductor substrate in the same manufacturing step as that shown in FIG. 43.
Figure 46:
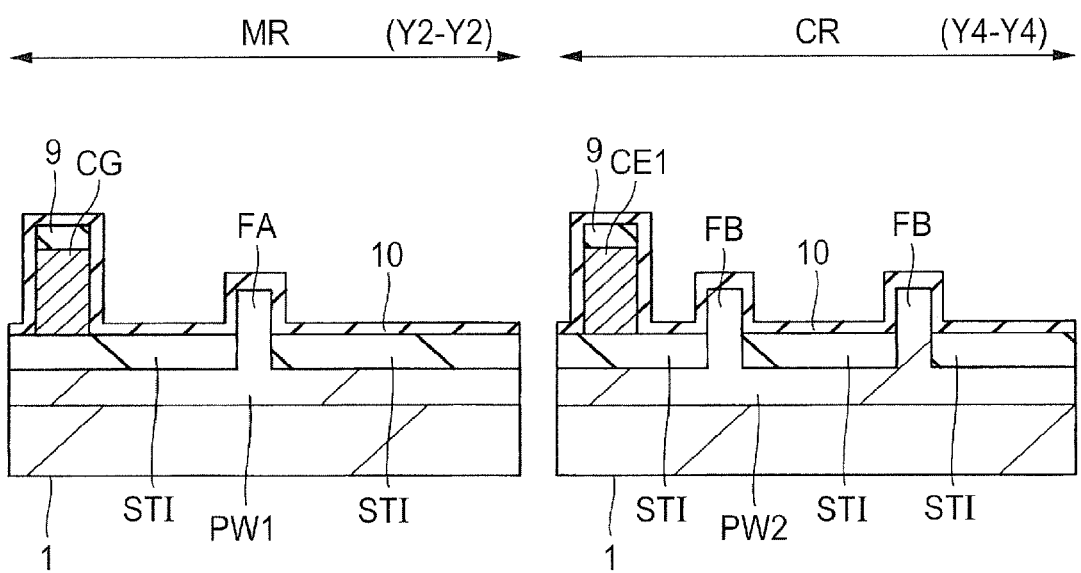
FIG. 46 is a cross-sectional view of a main part of the semiconductor substrate in the same manufacturing step as that shown in FIG. 43.
Figure 47:
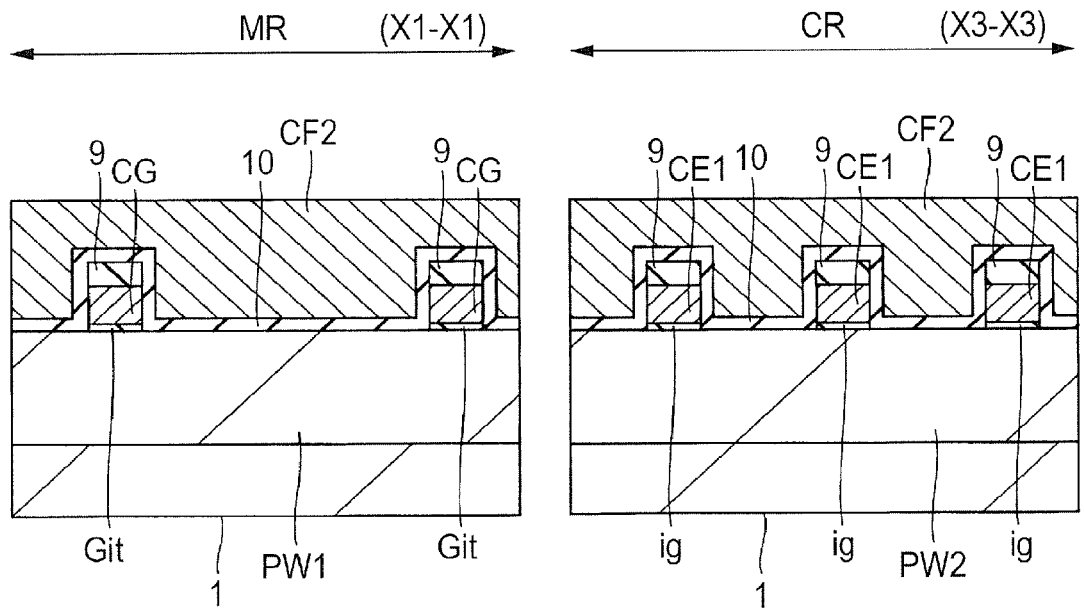
FIG. 47 is a cross-sectional view of a main part of a semiconductor substrate in a manufacturing step following the step of FIG. 43.
Figure 48:
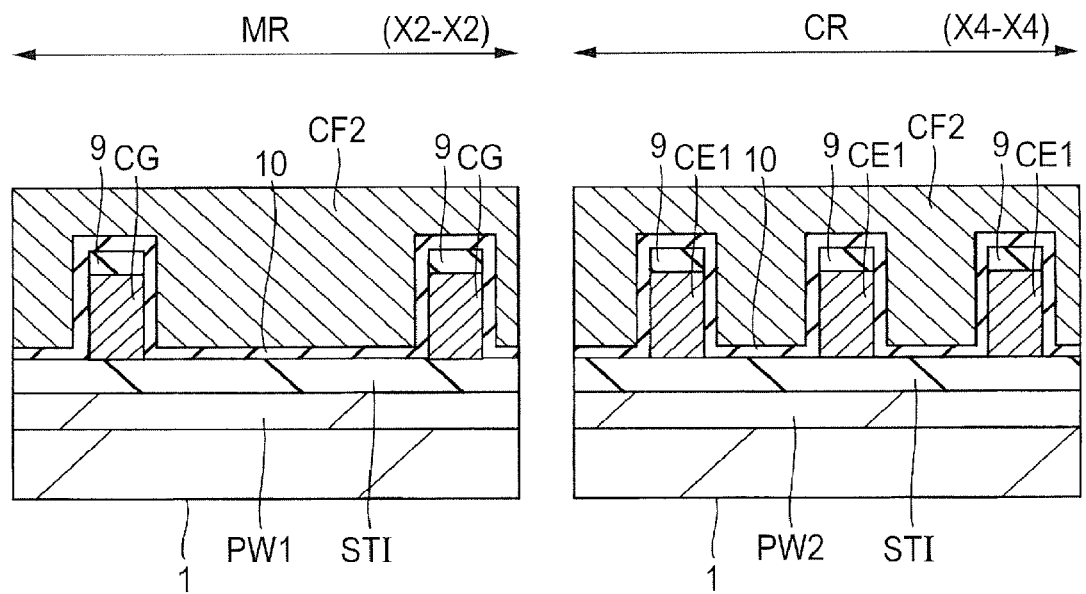
FIG. 48 is a cross-sectional view of a main part of the semiconductor substrate in the same manufacturing step as that shown in FIG. 47.
Figure 49:
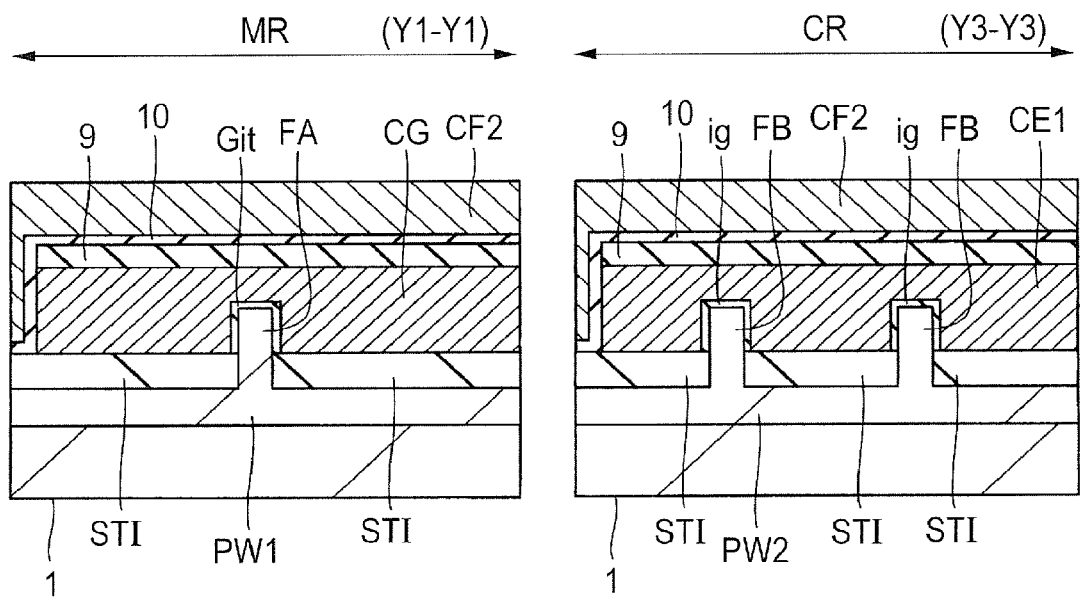
FIG. 49 is a cross-sectional view of a main part of the semiconductor substrate in the same manufacturing step as that shown in FIG. 47.
Figure 50:
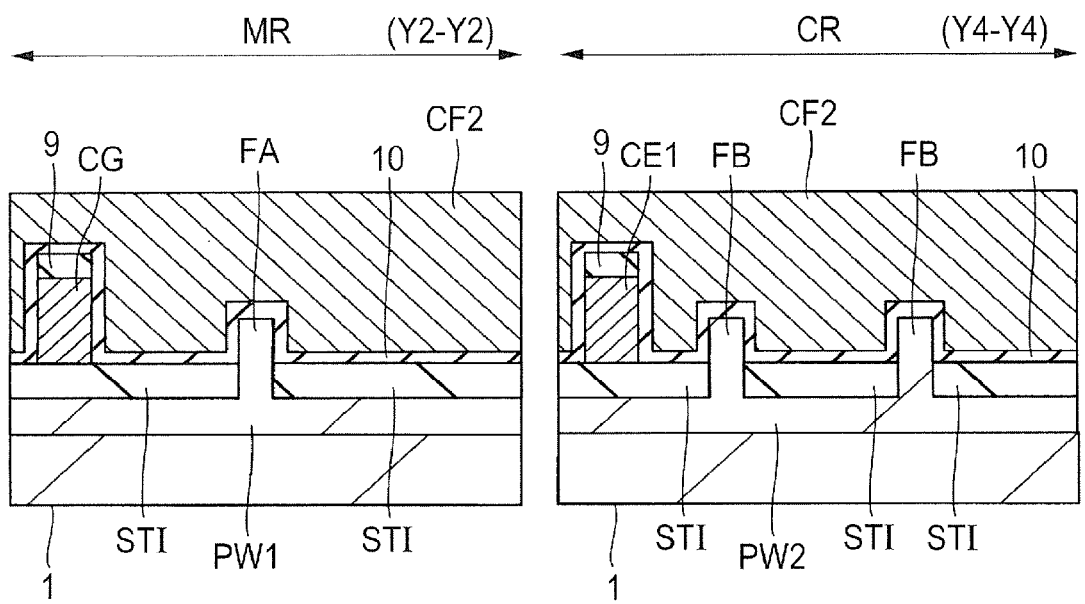
FIG. 50 is a cross-sectional view of a main part of the semiconductor substrate in the same manufacturing step as that shown in FIG. 47.
Figure 51:
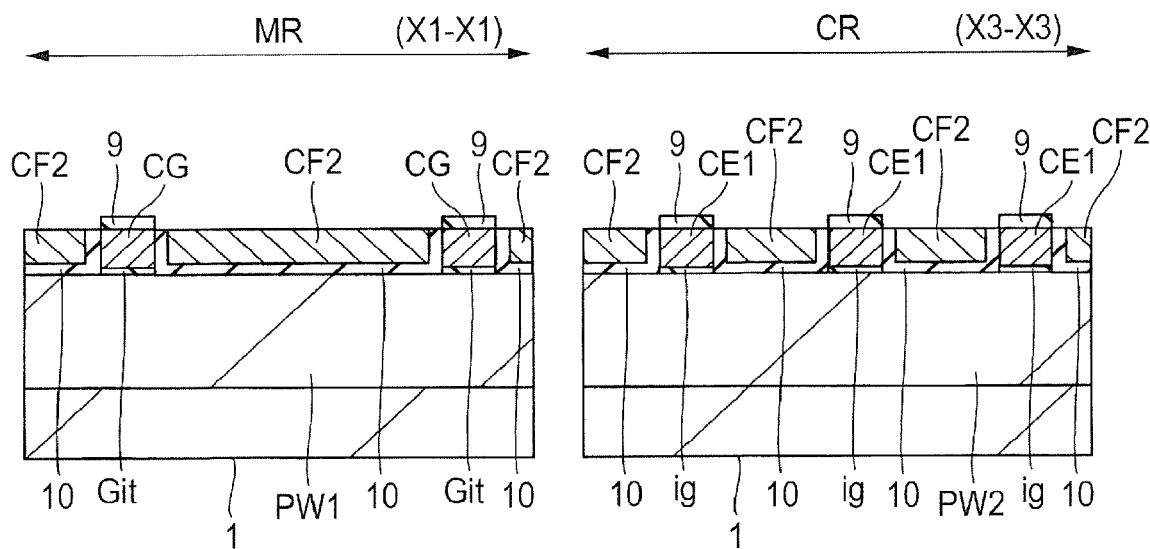
FIG. 51 is a cross-sectional view of a main part of a semiconductor substrate in a manufacturing step following the step of FIG. 47.
Figure 52:
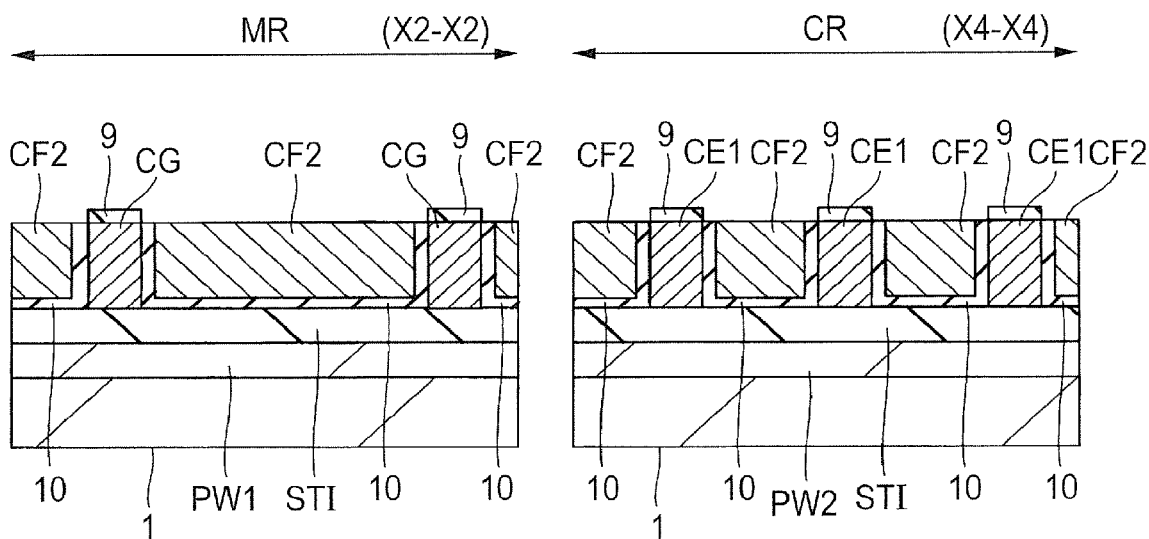
FIG. 52 is a cross-sectional view of a main part of the semiconductor substrate in the same manufacturing step as that shown in FIG. 51.
Figure 53:
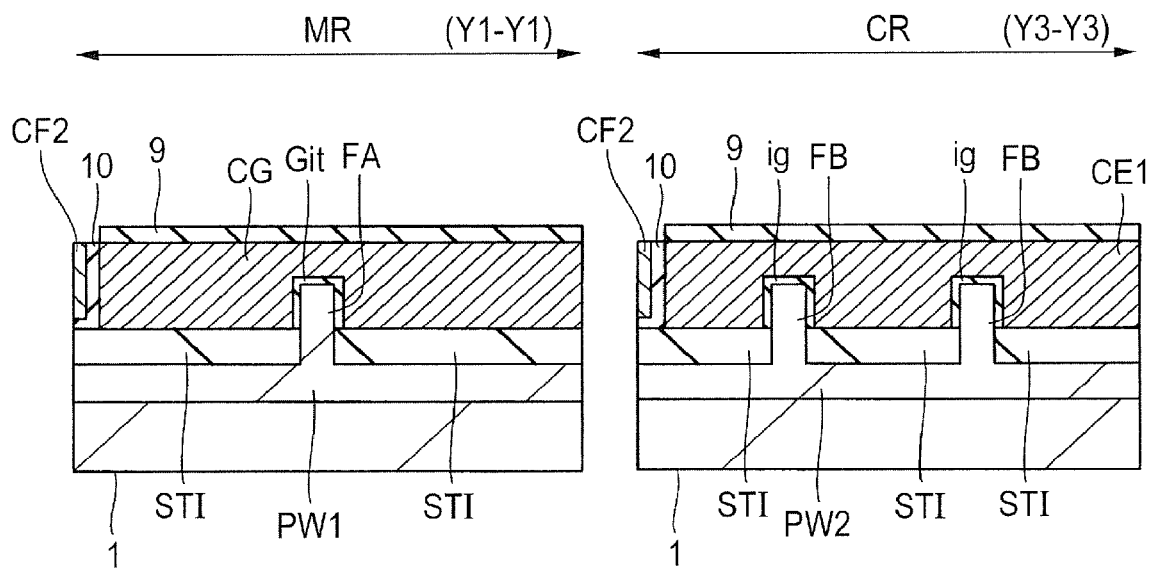
FIG. 53 is a cross-sectional view of a main part of the semiconductor substrate in the same manufacturing step as that shown in FIG. 51.
Figure 54:
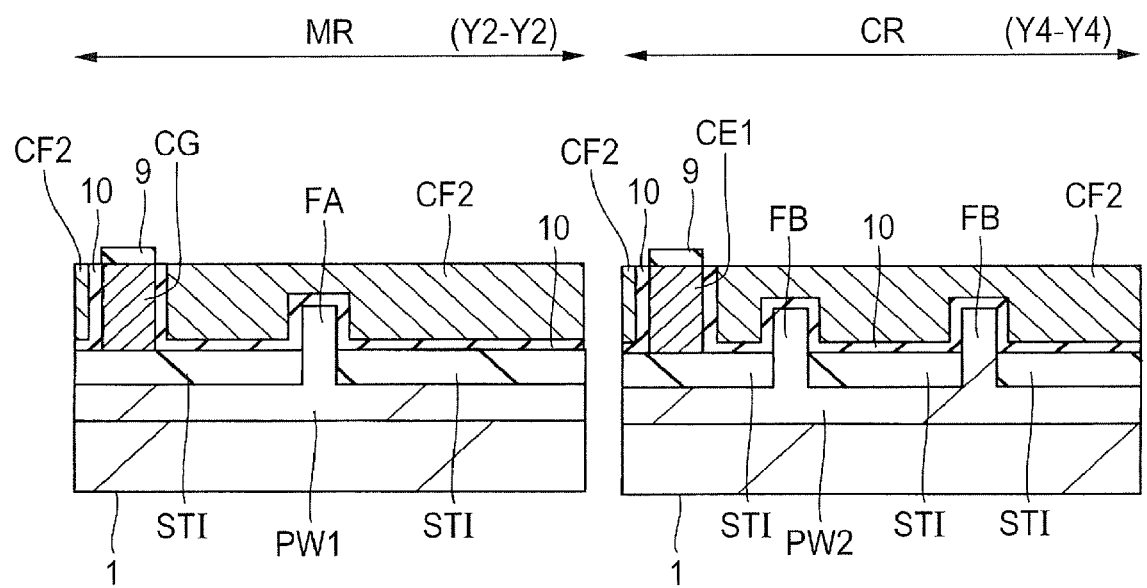
FIG. 54 is a cross-sectional view of a main part of the semiconductor substrate in the same manufacturing step as that shown in FIG. 51.

Consequently, the semiconductor device shown in FIGS. 63 and 64 is manufactured through the same steps as those described with reference to FIG. 43 and other figures following FIG. 43 in the first embodiment.

<Modified Example of Second Embodiment>

Figure 71:
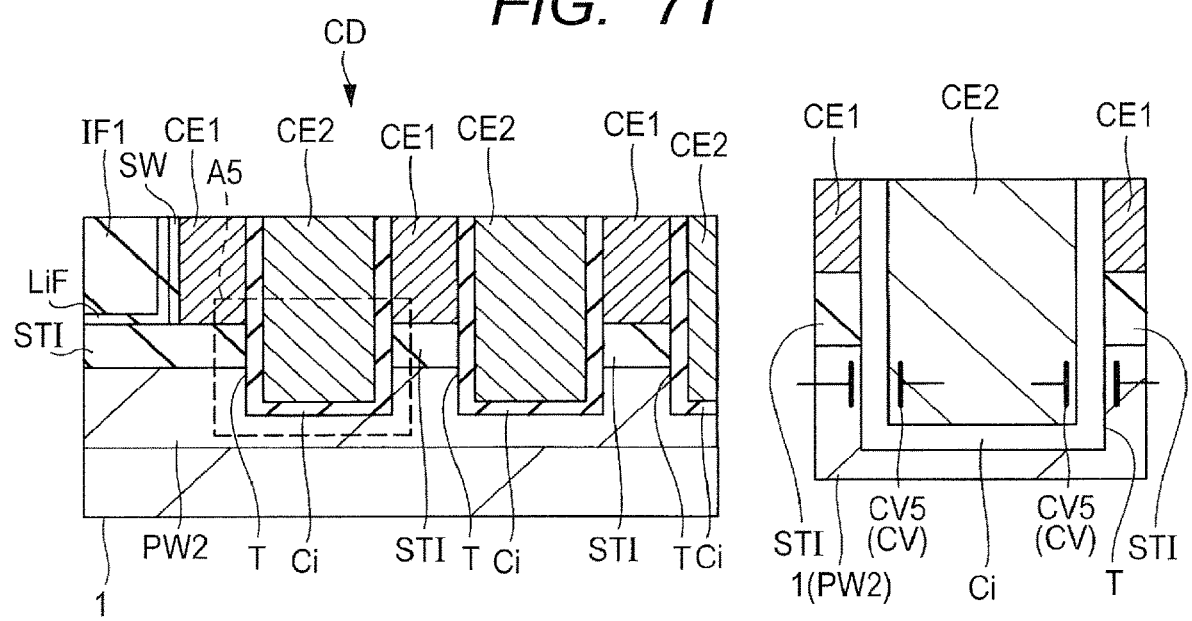
FIG. 71 illustrates, on the left, a cross-sectional view taken along the line X4-X4 of FIG. 8 in a modified example of the semiconductor device of the second embodiment, and on the right, an enlarged cross-sectional view of a left region A5 shown on the left of FIG. 71.
Figure 72:
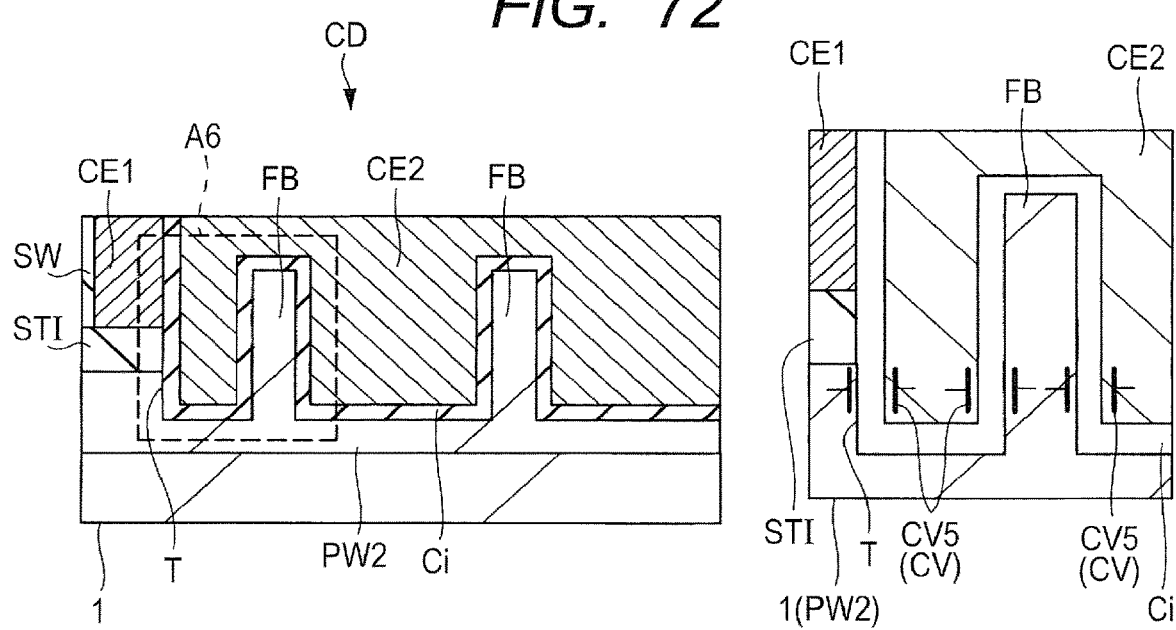
FIG. 72 illustrates, on the left, a cross-sectional view taken along the line Y4-Y4 in FIG. 8 in the modified example of the semiconductor device of the second embodiment, and on the right, an enlarged cross-sectional view of a region A6 shown on the left of FIG. 72.

FIG. 71 illustrates, on the left, a cross-sectional view taken along the line X4-X4 of FIG. 8 in a modified example of the semiconductor device of the second embodiment, and on the right, an enlarged cross-sectional view of a left region A5 shown on the left of FIG. 71; and FIG. 72 illustrates, on the left, a cross-sectional view taken along the line Y4-Y4 in FIG. 8 in the modified example of the semiconductor device of the second embodiment, and on the right, an enlarged cross-sectional view of a region A6 shown on the left of FIG. 72. In this modified example, the cross-sectional view taken along the line X3-X3 of FIG. 8 is the same as FIG. 10, and the cross-sectional view taken along the line Y3-Y3 of FIG.

8 is the same as FIG. 12. The structure of the memory cell array MR in the modified example is the same as that in the first embodiment. In the right cross-sectional views of FIGS. 71 and 72, hatching of the capacitive insulating film Ci is omitted for better understanding of the figures.

In the modified example, as shown in FIGS. 71 and 72, the trench T between the adjacent fins FB and the like is formed to pass through the isolation portion STI under the capacitor electrode CE2 (between the capacitor electrode CE2 and the substrate 1) to reach a position deeper than the main surface of the substrate 1 (main surface of the substrate 1 in the formation region surface of the isolation portion STI). That is, the depth of the trench T is deeper than that in the second embodiment (see FIGS. 63 and 64). Between the adjacent fins FB and the like, the lower part of the capacitor electrode CE2 (on the side of the substrate 1) passes through the isolation portion STI to reach the position deeper than the main surface of the substrate 1 (main surface of the substrate 1 in the surface of the formation region for the isolation portion STI). The bottom portion of the trench T is ended within a region of the p-type well PW2 (at a position shallower than the boundary between the p-type well PW2 and the substrate 1), whereas the lower portion of the capacitor electrode CE2 is also ended within a region of the p-type well PW2 of the substrate 1 (at a position shallower than the boundary between the p-type well PW2 and the substrate 1). Within the trench T between the adjacent fins FB, the capacitor electrode CE2 and the substrate 1 are insulated by the capacitive insulating film Ci provided therebetween. Also in this case, the comparison between the memory cell array MR and the capacitive element region CR is the same as that described in the above second embodiment.

In this modified example, in addition to the capacitances CV and CL shown in FIGS. 14, 63, and 64, as shown on the right of FIGS. 71 and 72, a capacitance CV5 is formed between the side surfaces of the lower part of the capacitor electrode CE2 (the side of the substrate 1) and the side surface of the substrate 1 (the side surface of the trench T formed in the substrate 1) in spaces between the adjacent fins FB. Therefore, the capacitance of the capacitive element CD per unit area can be increased, compared to that in the second embodiment. Other configurations are the same as those described in the first embodiment. In the manufacturing method of the semiconductor device of the modified example, the trench T, mentioned above with reference to FIGS. 69 and 70, is preferably formed by etching to a deeper position.

Third Embodiment

Figure 73:
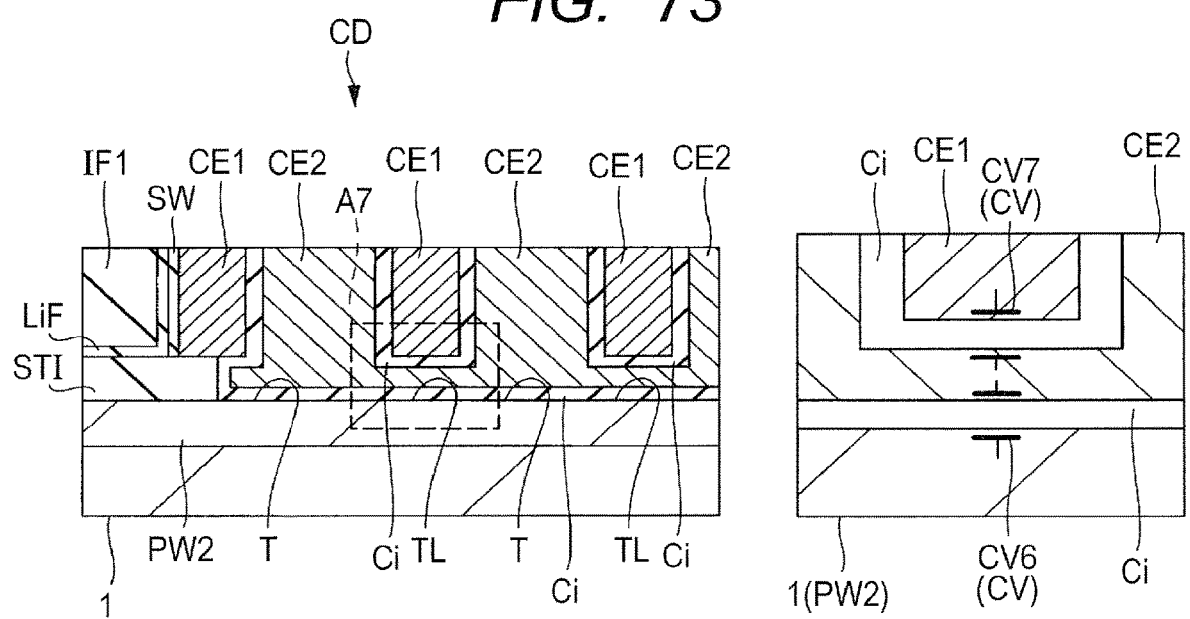
FIG. 73 illustrates, on the left, a cross-sectional view of the semiconductor device according to a third embodiment, taken along line X4-X4 in FIG. 8, and on the right, an enlarged cross-sectional view of a region A7 shown on the left of FIG. 73.
Figure 74:
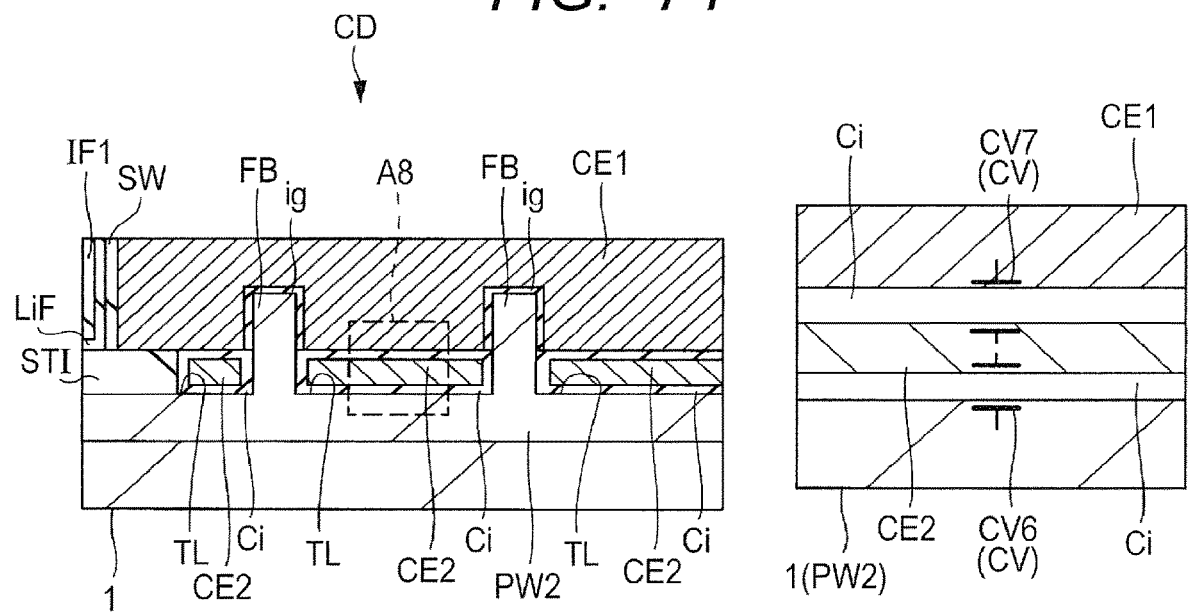
FIG. 74 illustrates, on the left, a cross-sectional view of the semiconductor device taken along line Y3-Y3 in FIG. 8 according to the third embodiment, and on the right, an enlarged cross-sectional view of a region A8 shown on the left of FIG. 74.
Figure 75:
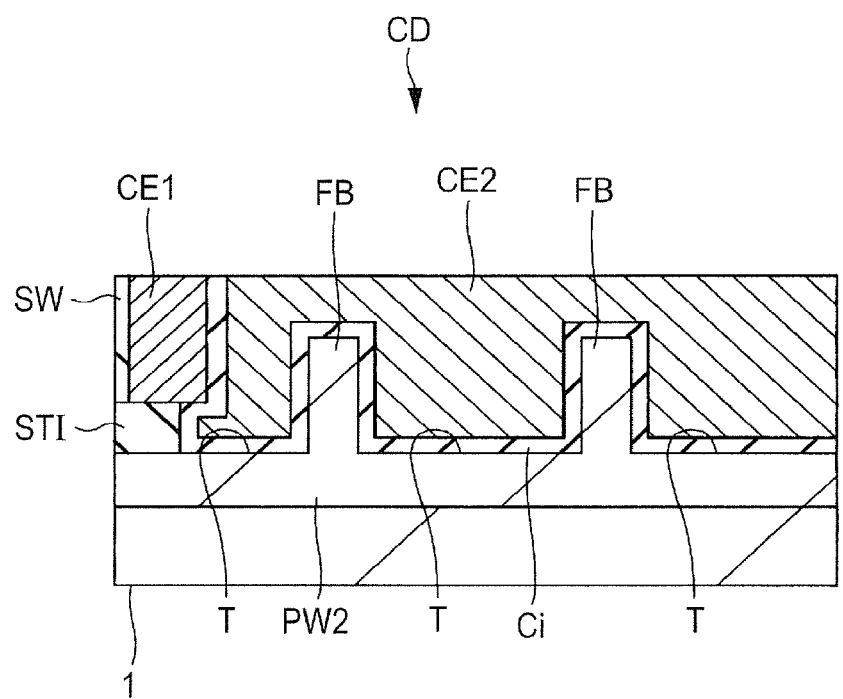
FIG. 75 is a cross-sectional view of the semiconductor device according to the third embodiment taken along the line Y4-Y4 of FIG. 8.
Figure 76:
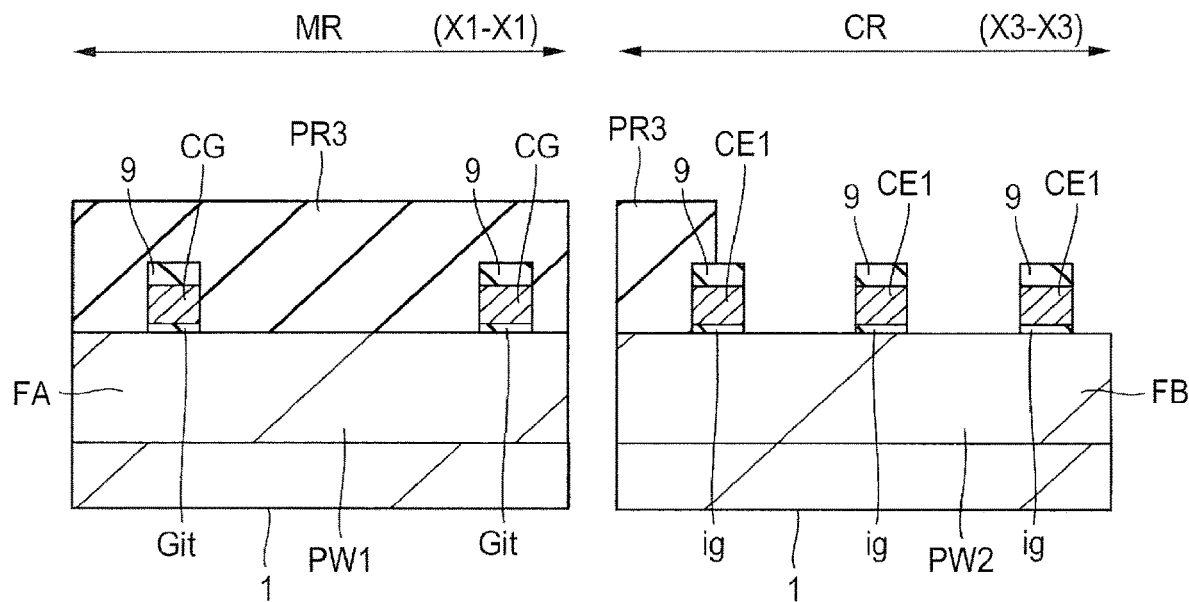
FIG. 76 is a cross-sectional view of a main part of the semiconductor substrate in a manufacturing step for the semiconductor device shown in FIGS. 73 to 75.
Figure 77:
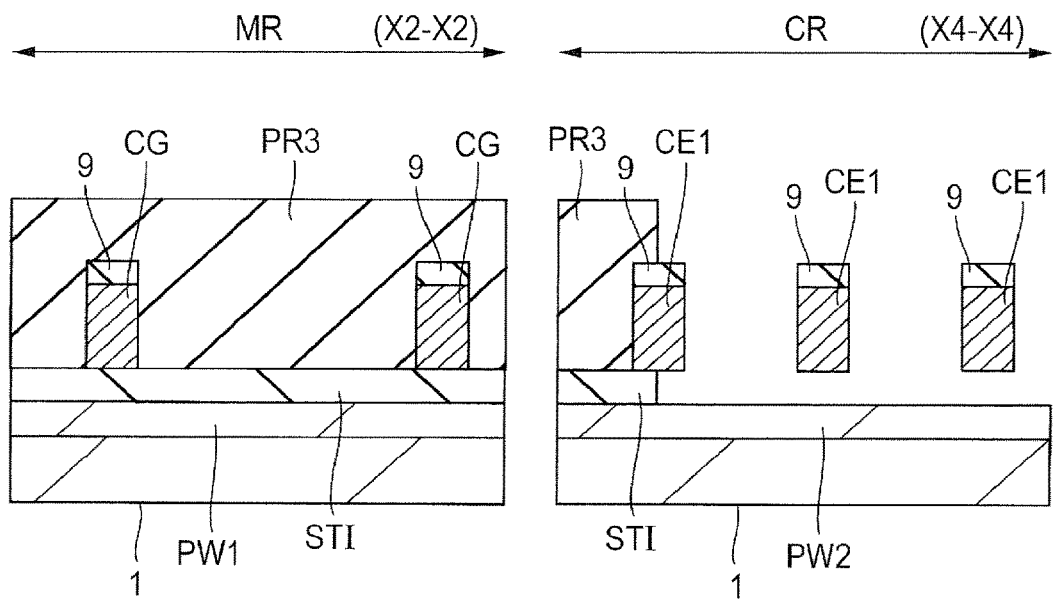
FIG. 77 is a cross-sectional view of a main part of the semiconductor substrate in the same manufacturing step as that in FIG. 76.
Figure 78:
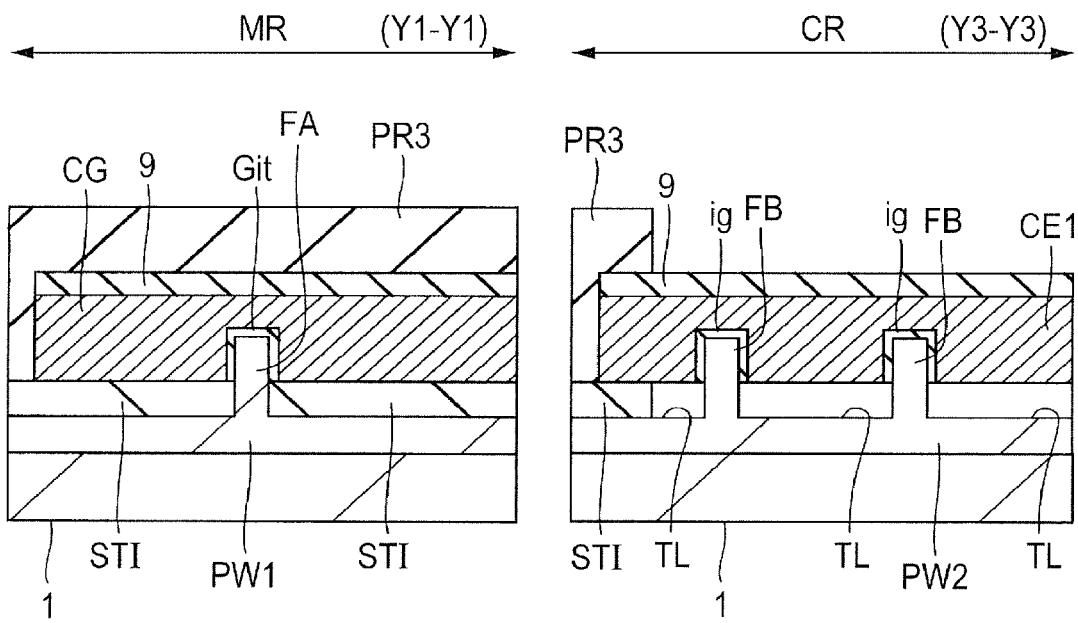
FIG. 78 is a cross-sectional view of a main part of the semiconductor substrate in the same manufacturing step as that in FIG. 76.
Figure 79:
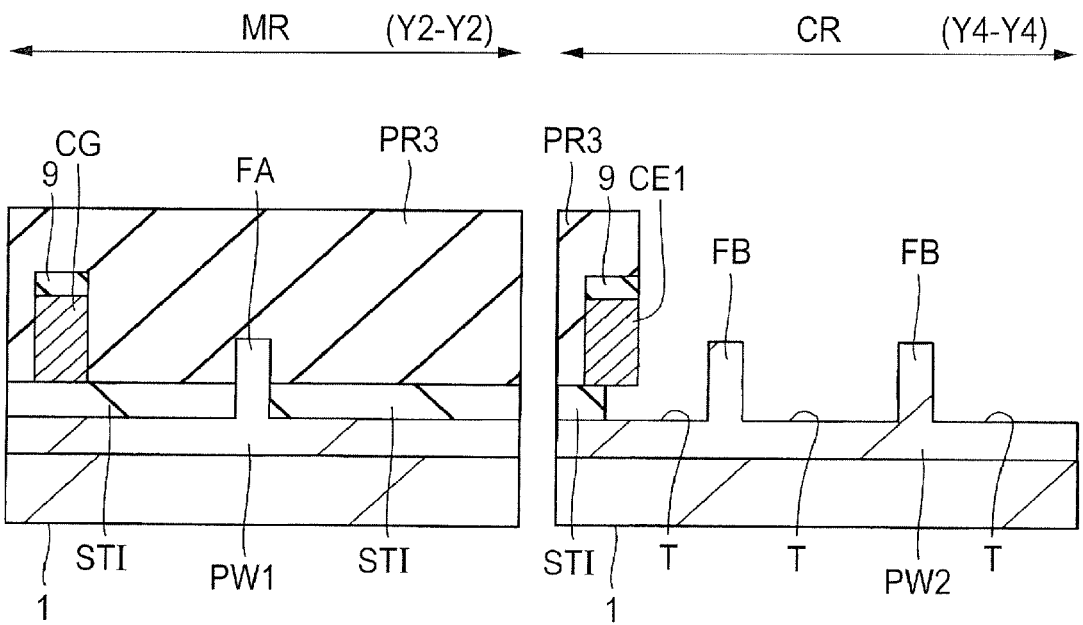
FIG. 79 is a cross-sectional view of a main part of the semiconductor substrate in the same manufacturing step as that in FIG. 76.

An example of a semiconductor device structure according to a third embodiment will be described with reference to FIGS. 73 to 75. FIG. 73 illustrates, on the left, a cross-sectional view of the semiconductor device according to the third embodiment, taken along line X4-X4 in FIG. 8, and on the right, an enlarged cross-sectional view of a region A7 shown on the left of FIG. 73; and FIG. 74 illustrates, on the left, a cross-sectional view of the semiconductor device taken along line Y3-Y3 in FIG. 8 according to the third embodiment, and on the right, an enlarged cross-sectional view of a region A8 shown on the left of FIG. 74. FIG. 75 is a cross-sectional view of the semiconductor device according to the third embodiment taken along the line Y4-Y4 of FIG. 8. In the semiconductor device of the third embodiment, the cross-sectional view taken along the line X3-X3 of FIG. 8 is the same as FIG. 10. The structure of the memory cell array MR in the third embodiment is the same as that in the first embodiment. The cross-sectional views on the right of FIGS. 73 and 74 omit hatching of the capacitive insulating film Ci for better understanding of the figures.

In the third embodiment, as shown in FIGS. 73 to 75, parts of the isolation portion STI located directly under the capacitor electrodes CE1 and CE2 between the adjacent fins FB (between each of the capacitor electrodes CE1 and CE2 and the substrate 1) are removed. That is, trenches TL are also formed directly under the capacitor electrodes CE1 each located between the adjacent fins FB. Through this trench TL, the trenches T adjacent in the extending direction (X direction) of the fins FB are coupled together. The lower parts of the capacitor electrodes CE2 that are adjacent in the extending direction (X direction) of the fin FB are coupled together through a part (first part) of the capacitor electrode CE2 within the trench TL. That is, the capacitor electrodes CE2 adjacent in the X direction are electrically coupled together under the capacitor electrode CE1 located between the capacitor electrodes CE2 and CE2 (between facing surfaces of the capacitor electrode CE1 and the substrate 1 that faces the bottom surface of the capacitor electrode CE1). In other words, the part (first part) of the capacitor electrode CE2 is also provided between the facing surfaces of the capacitor electrode CE1 and the substrate 1. Note that the capacitor electrode CE2 and the substrate 1 (bottom surfaces and side surfaces of the trenches T and T1), as well as the capacitor electrode CE2 and the capacitor electrode CE1 are insulated from each other by the capacitive insulating film Ci provided therebetween. The comparison between the memory cell array MR and the capacitive element region CR is the same as that in the second embodiment.

In the third embodiment, in addition to the capacitances CV and CL shown in FIGS. 14, 63, 64, 71, and 72, as shown on the right of FIGS. 73 and 74, a capacitance CV6 (CV) is formed between the bottom surface of the capacitor electrode CE2 within the trench TL and the substrate 1 facing this bottom surface, between the adjacent fins FB and the like. In addition, a capacitance CV7 (CV) is formed between the upper surface of the capacitor electrode CE2 within the trench TL and the bottom surface of the capacitor electrode CE1 facing this upper surface. Furthermore, although not shown, a capacitance is also formed between facing surfaces of the capacitor electrode CE2 within the trench TL and the fin FB. Therefore, the capacitance of the capacitive element CD per unit area can be increased, compared to the first and second embodiments and the modified examples thereof. Other configurations are the same as those described in the first embodiment.

Next, an example of a method for manufacturing a semiconductor device according to the third embodiment will be described with reference to FIGS. 76 to 79. FIGS. 76 to 79 are cross-sectional views of main parts of the substrate 1 in manufacturing steps of the semiconductor device in the third embodiment.

As with the first and second embodiments mentioned above, the gate electrodes CG and the capacitor electrodes CE1 are formed, and after removing the resist film PR1, as shown in FIGS. 76 to 79, the resist film PR3 is formed by lithography to cover the entire region of the memory cell array MR and a part of the capacitive element region CR while exposing the other parts thereof.

Subsequently, the isolation portion STI exposed from the resist film PR3 is selectively etched and removed by using the resist film PR3 as the etching mask. At this time, a part of the isolation portion STI located directly under the capacitor electrode CE1 (between the facing surfaces of the capacitor electrode CE1 and the substrate 1) is also removed by anisotropic etching. Thus, the trench T from which the main surface of the substrate 1 is exposed is formed between the adjacent fins FB in the capacitive element region CR, while the trench TL is formed under the capacitor electrode CE1.

Consequently, the semiconductor device shown in FIGS. 73 to 75 is manufactured through the same steps as those described with reference to FIG. 43 and other figures following FIG. 43 in the first embodiment. Note that in the formation step of the insulating film 10, the insulating film 10 is also formed on the inner surfaces (bottom surface and side surfaces) of the trench T and the inner surfaces (in addition to the bottom surface and side surfaces thereof, including the back surface of the capacitor electrode CE1 facing the substrate 1 within the trench TL) of the trench TL.

Although the invention made by the inventors has been specifically described above based on the embodiments, the present invention is not limited to the above embodiments. It is apparent that various modifications and changes can be made to those embodiments without departing from the scope of the invention.

What is claimed is:

1. A method of manufacturing a semiconductor device, comprising the steps of:
   (a) forming a plurality of first insulating films on a semiconductor substrate in a memory region and forming a plurality of second insulating films on the semiconductor substrate in a capacitive element region,
   (b) performing an etching to the semiconductor substrate in a state that the first insulating films and the second insulating films are formed, thereby forming a plurality of first protrusions in the memory region and a plurality of second protrusions in the capacitive element region,
   (c) forming a first conductive film via a third insulating film on the first protrusions and on the second protrusions,
   (d) forming a plurality of control gate electrodes on the first protrusions and a plurality of first capacitor electrodes on the second protrusions by etching the first conductive film,
   (e) forming a second conductive film via a fourth insulating film on the first protrusions and on the second protrusions so as to cover the control gate electrodes and the first capacitor electrodes,
   (f) polishing the second conductive film and lowering an upper surface of the second conductive film, and
   (g) removing a part of the second conductive film in the memory region, thereby forming a plurality of memory gate electrodes in the memory region such that each of the memory gate electrodes is adjacent to each of the control gate electrodes, and a plurality of second capacitor electrodes in the capacitive element region,
   wherein a distance between the adjacent first protrusions is larger than a distance between the adjacent second protrusions.

2. The method according to claim 1,
   wherein a distance between the adjacent first insulating films is larger than a distance between the adjacent second insulating films.
3. The method according to claim 1,
   wherein the distance between the second protrusions is three times or more a thickness of the fourth insulating film.
4. The method according to claim 1,
   wherein each of the first protrusions has a width in a first direction along the semiconductor substrate and extends in a second direction along the semiconductor substrate and the first protrusions are arranged in the first direction, and
   wherein each of the second protrusions has a width in the first direction and extends in the second direction and the second protrusions are arranged in the first direction.
5. The method according to claim 1,
   wherein a distance between the adjacent first capacitor electrodes is smaller than a distance between the adjacent control gate electrodes.
6. The method according to claim 5,
   wherein a distance between the adjacent first capacitor electrodes is three times or more a thickness of the fourth insulating film.
7. The method according to claim 4,
   wherein a width of the first capacitor electrode in the second direction is smaller than a width of the control gate electrode in the second direction.
8. The method according to claim 1,
   wherein the first protrusion, the control gate electrode and the memory gate electrode configure a memory cell, and
   wherein the second protrusion, the first capacitor electrode and the second capacitor electrode configure a capacitor element.
9. The method according to claim 1, further comprising the steps of:
   (h) after the step (b), before the step (c), forming an isolation portion between the adjacent first protrusions and between the adjacent second protrusions,
   (i) after the step (d), before the step (e), forming a resist film covering the memory cell region and exposing the isolation film between the adjacent first capacitor electrodes, and
   (j) after the step (i), before the step (e), removing a part of the isolation film exposed from the resist film, and exposing a part of the semiconductor substrate between the adjacent first capacitor electrodes,
   wherein, in a third direction orthogonal to a main surface of the semiconductor substrate, a length of the second capacitor electrode arranged between the adjacent second protrusions is larger than a length of the memory gate electrode arranged between the adjacent first protrusions.

* * * * *